US012765390B2

(12) United States Patent
Acikalin et al.

(10) Patent No.: US 12,765,390 B2
(45) Date of Patent: Oct. 13, 2026

(54) DEVICE-TO-DEVICE COMMUNICATION SYSTEM, PACKAGES, AND PACKAGE SYSTEM

(71) Applicant: Intel Corporation, Santa Clara, CA (US)

(72) Inventors: Tolga Acikalin, San Jose, CA (US); Arnaud Amadjikpe, Beaverton, OR (US); Brent R. Carlton, Portland, OR (US); Chia-Pin Chiu, Tempe, AZ (US); Timothy F. Cox, Palo Alto, CA (US); Kenneth P. Foust, Beaverton, OR (US); Bryce D. Horine, Portland, OR (US); Telesphor Kamgaing, Chandler, AZ (US); Renzhi Liu, Portland, OR (US); Jason A. Mix, Portland, OR (US); Sai Vadlamani, Chandler, AZ (US); Tae Young Yang, Portland, OR (US); Zhen Zhou, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 434 days.

(21) Appl. No.: 18/253,954

(22) PCT Filed: Dec. 23, 2020

(86) PCT No.: PCT/US2020/066748
§ 371 (c)(1),
(2) Date: May 23, 2023

(87) PCT Pub. No.: WO2022/139828
PCT Pub. Date: Jun. 30, 2022

(65) Prior Publication Data

US 2023/0420396 A1 Dec. 28, 2023

(51) Int. Cl.
*H10W 44/20* (2026.01)
*H01Q 1/22* (2006.01)
(Continued)

(52) U.S. Cl.
CPC .......... *H10W 44/20* (2026.01); *H01Q 1/2283* (2013.01); *H01Q 9/36* (2013.01);
(Continued)

(58) Field of Classification Search
CPC . H10W 90/722; H10W 90/724; H10W 44/20; H10W 70/65; H10W 90/00;
(Continued)

(56) References Cited

U.S. PATENT DOCUMENTS

2007/0229368 A1 10/2007 Hata et al.
2009/0231225 A1* 9/2009 Choudhury ............ H01Q 25/00 343/893
(Continued)

FOREIGN PATENT DOCUMENTS

CN 109712947 A 5/2019
DE 102019124237 A1 7/2020
(Continued)

OTHER PUBLICATIONS

Taiwanese Office Action issued for the corresponding TW patent application No. TW 110133413 dated Jan. 8, 2025, 13 pages (For informational purposes only).
(Continued)

*Primary Examiner* — Tucker J Wright
(74) *Attorney, Agent, or Firm* — VIERING, JENTSCHURA & PARTNER mbB

(57) ABSTRACT

In various aspects, a device-to-device communication system is provided including a first device and a second device. Each of the first device and the second device includes an antenna, a radio frequency frond-end circuit, and a baseband
(Continued)

circuit. Each of the first device and the second device are at least one of a chiplet or a package. The device-to-device communication system further includes a cover structure housing the first device and the second device. Each of the first device and the second device are at least one of a chiplet or a package. The device-to-device communication system further includes a radio frequency signal interface wirelessly communicatively coupling the first device and the second device. The radio frequency signal interface includes the first antenna and the second antenna.

8 Claims, 81 Drawing Sheets

(51) Int. Cl.
*H01Q 9/36* (2006.01)
*H01Q 9/42* (2006.01)
*H01Q 21/24* (2006.01)
*H10W 70/65* (2026.01)
*H10W 90/00* (2026.01)

(52) U.S. Cl.
CPC ............... *H01Q 9/42* (2013.01); *H01Q 21/24* (2013.01); *H10W 70/65* (2026.01); *H10W 90/00* (2026.01); *H10W 90/722* (2026.01); *H10W 44/248* (2026.01); *H10W 90/724* (2026.01)

(58) Field of Classification Search
CPC ..... H10W 44/248; H01Q 1/2283; H01Q 9/42; H01Q 21/24
See application file for complete search history.

(56) References Cited

U.S. PATENT DOCUMENTS

| | | | |
|---|---|---|---|
| 2011/0298101 A1 | 12/2011 | Pagaila et al. | |
| 2012/0295539 A1 | 11/2012 | Mccormack et al. | |
| 2016/0240492 A1* | 8/2016 | Wolter .................... | H01L 23/66 |
| 2016/0276727 A1 | 9/2016 | Dang et al. | |
| 2018/0068989 A1 | 3/2018 | Chew | |
| 2018/0212322 A1 | 7/2018 | Elsherbini et al. | |
| 2020/0014122 A1 | 1/2020 | Zhang et al. | |
| 2022/0077576 A1 | 3/2022 | Hong | |
| 2023/0104551 A1 | 4/2023 | Chuang et al. | |

FOREIGN PATENT DOCUMENTS

| | | |
|---|---|---|
| TW | 201201345 A | 1/2012 |
| WO | 2020153823 A1 | 7/2020 |

OTHER PUBLICATIONS

Search Report issued for the corresponding Dutch patent application No. 2029704, dated Feb. 6, 2023, 10 pages (for informational purposes only).

International Search Report issued for the corresponding International patent application No. PCT/US2020/066748, dated Sep. 17, 2021, 9 pages (for informational purposes only).

J. Branch, et al., “Wireless communication in a flip-chip package using integrated antennas on silicon substrates,” in IEEE Electron Device Letters, vol. 26, No. 2, pp. 115-117, Feb. 2005.

X. Timoneda et al., “Millimeter-Wave Propagation within a Computer Chip Package,” in Proceedings of the IEEE International Symposium on Circuits and Systems (ISCAS) , pp. 1-5, 2018.

V. Pano, et al., “In-Package Wireless Communication with TSVbased Antenna,” in Proceedings of the IEEE International Symposium on Circuits and Systems (ISCAS), pp. 19-21, 2019.

W. Loke, et al., “Wireless chip-to-chip communication in three-dimensional integrated circuits using microbump antennas,” 2013 IEEE MTT-S International Microwave Symposium Digest (MTT), Seattle, WA, 2013, pp. 1-4.

Gu, C. et al., “A D-Band 3D-Printed Antenna”, IEEE Transactions on Terahertz Science and Technology, 2020, 10 pages.

“Patch antenna”, Wikipedia, retrieved from https://en.wikipedia.org/wiki/Patch_antenna, on Jul. 7, 2025, 2 Pages.

“Yagi-Uda antenna”, Wikipedia, retrieved from https://en.wikipedia.org/wiki/Yagi%E2%80%93Uda_antenna, on Jul. 7, 2025, 13 Pages.

“Inverted-F antenna”, Wikipedia, retrieved from https://en.wikipedia.org/wiki/Inverted-F_antenna, on Jul. 7, 2025, 6 Pages.

Aqeel H. N., et al., “Via-Monopole Based Quasi Yagi-Uda Antenna for W-Band Applications using Through Glass Silicon via (TGSV) Technology”, IEEE Access, 2017, 7 pages.

“Control plane”, Wikipedia, retrieved from https://en.wikipedia.org/wiki/Control_plane, on Jul. 7, 2025, 5 pages.

“Foveros—Intel ”, WikiChip, retrieved from https://en.wikichip.org/wiki/intel/foveros, on Jul. 7, 2025, 4 pages.

“Ultra-wideband”, Wikipedia, retrieved from https://en.wikipedia.org/wiki/Ultra-wideband, on Jul. 7, 2025, 12 pages.

Iulian Rosu, “PIFA—Planar Inverted F Antenna”, retrieved from https://www.qsl.net/va3iul/Antenna/PIFA/PIFA_Planar_Inverted_F_Antenna.pdf, on Jul. 7, 2025, 4 pages.

“BLE Antenna Design Guide”, NXP Semiconductors, retrieved from https://www.nxp.com/docs/en/user-guide/UM10992.pdf, on Jul. 7, 2025, 2018, 43 pages.

European search report issued for the corresponding European patent application No. 20967195.7, dated Jul. 23, 2024, 10 pages (for informational purposes only).

* cited by examiner

300

350

| | eXtra Short Range (WXSR) | Short Range (WSR) | Long Range (WLR) |
|---|---|---|---|
| Link type | point-to-point | multipoint-to-multipoint | multipoint-to-multipoint |
| Power Efficiency | 1pJ/b | 3pJ/b | 5pJ/b |
| Channel Length | 1-4mm | 5-10mm | 100mm |
| Latency | 2ns | 3-4ns | 5ns |
| BER | 1e-12 | 1e-12 | 1e-6 (raw) |
| Data rate | >500Gbps aggregate | >200Gbps per link | >200Gbps per link |
| Si Area efficiency | > 500 Gbps/mm^2 | 200 Gbps/mm^2 | 200 Gbps/mm^2 |

FIG. 35

3500

8GHz Package Edge Radiated Dual Loop Antenna Link Budget Values for 500Msymbol/sec QPSK

| File | Ports | Center Frequency | Channel Loss | $(C/N_0)_{min}$ | Margin |
|---|---|---|---|---|---|
| 8GHzIFA | 1 to 3 | 8000 MHz | 40.2 dB | 105 dB-Hz | 14.8 dB |

$C/N_0$ = 174 - 6 - 40.2 - 8 = 119.8 dB-Hz
$(C/N_0)_{min}$ = 18 dB + 10 · $log_{10}$(500 Msym/sec) = 18 + 87 = 105 dB-Hz
Margin = 119.8 dB-Hz - 105 dB-Hz = 14.8 dB Simulation parameters:

- Transmit pulse shape: partial response
- Anti-aliasing filter: 6-pole Butterworth, cutoff at 315.86 MHz +/- 7 MHz
- DFE configuration: 18 T/2-spaced FF taps, 12 T-spaced FB taps

4200

FIG. 51A
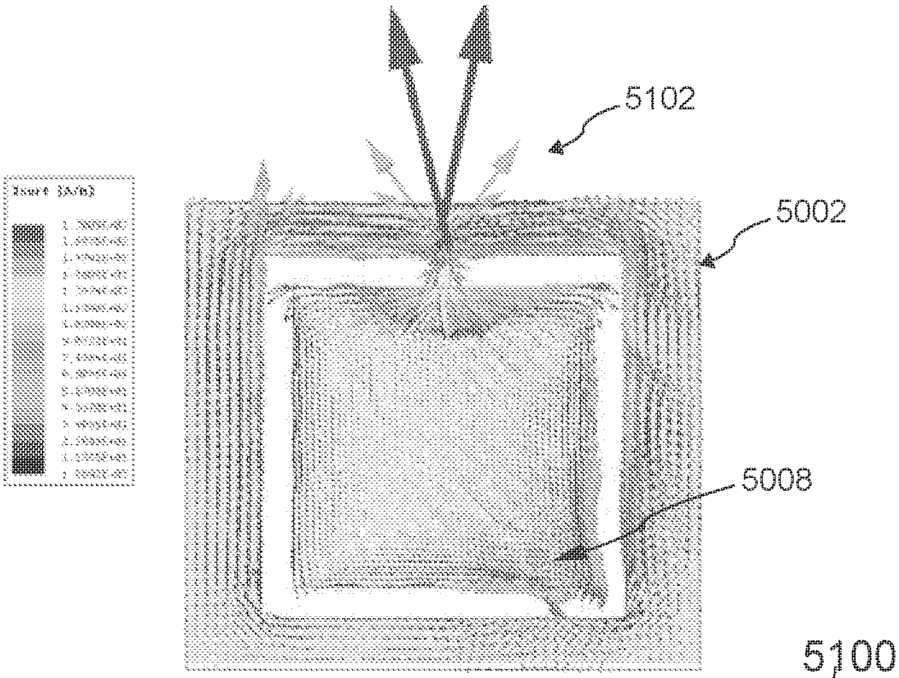
FIG. 51B
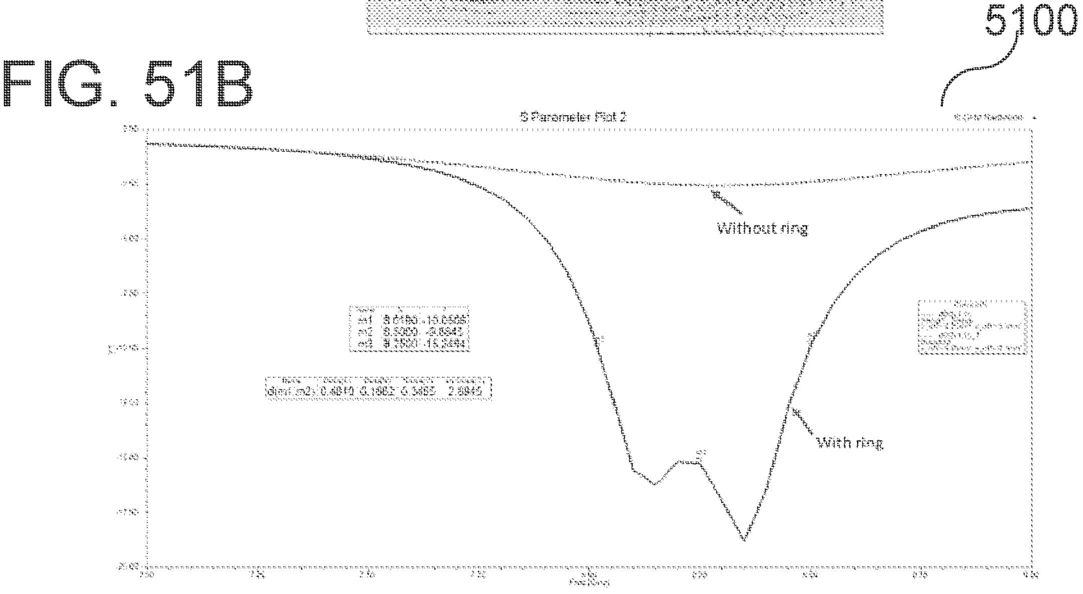
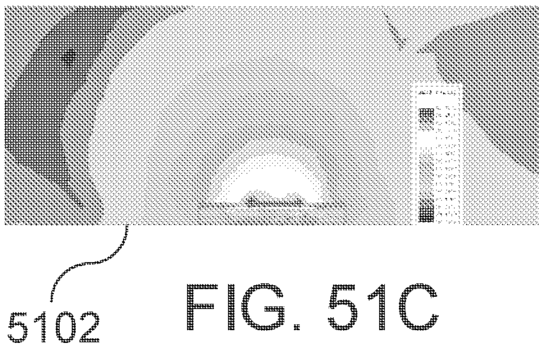
FIG. 51C
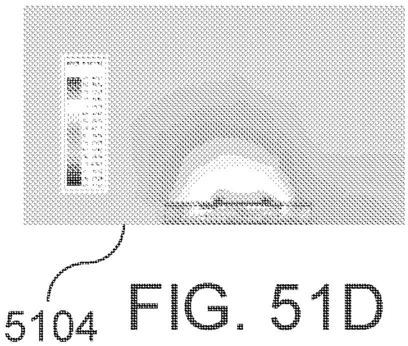
FIG. 51D

6100

$$a \leq \frac{\lambda}{2\pi} = 0.16\lambda, \ but\ typically\ \frac{\lambda}{10}$$

$$P_{rad} \sim |I|^2 R_{rad}$$

Radian Sphere (Antenna size) ⇓, *i.e* below fundamental mode

→ $R_{rad}$ ⇓ (radiation efficiency ⇓ and gain ⇓ )

→ $jX_{ant}$ ⇑ (storing inductive / capacitive energy)

→ Bandwidth ⇓ (can be adjusted with matching)

DEVICE-TO-DEVICE COMMUNICATION SYSTEM, PACKAGES, AND PACKAGE SYSTEM

This is a national phase of PCT Application PCT/US2020/066748 filed on Dec. 23, 2020, the entire contents of which are incorporated by reference.

TECHNICAL FIELD

The present disclosure relates to device-to-device communication system, packages, package system, and chiplet-to-chiplet communication system for wireless chip-to-chip communications.

BACKGROUND

Various aspects of this disclosure generally may relate to the field of wireless communications.

BRIEF DESCRIPTION OF THE DRAWINGS

In the drawings, like reference characters generally refer to the same parts throughout the different views. The drawings are not necessarily to scale, emphasis instead generally being placed upon illustrating the exemplary principles of the disclosure. In the following description, various aspects of the disclosure are described with reference to the following drawings, in which:

FIG. 35 exemplarily shows a link budget summary of an 8 GHz package edge radiated dual loop antenna according to various aspects;

FIG. 51A to FIG. 51D exemplarily show the effect of the ring structure of a dual planar coupling structure according to various aspects;

DESCRIPTION

Figure 1:
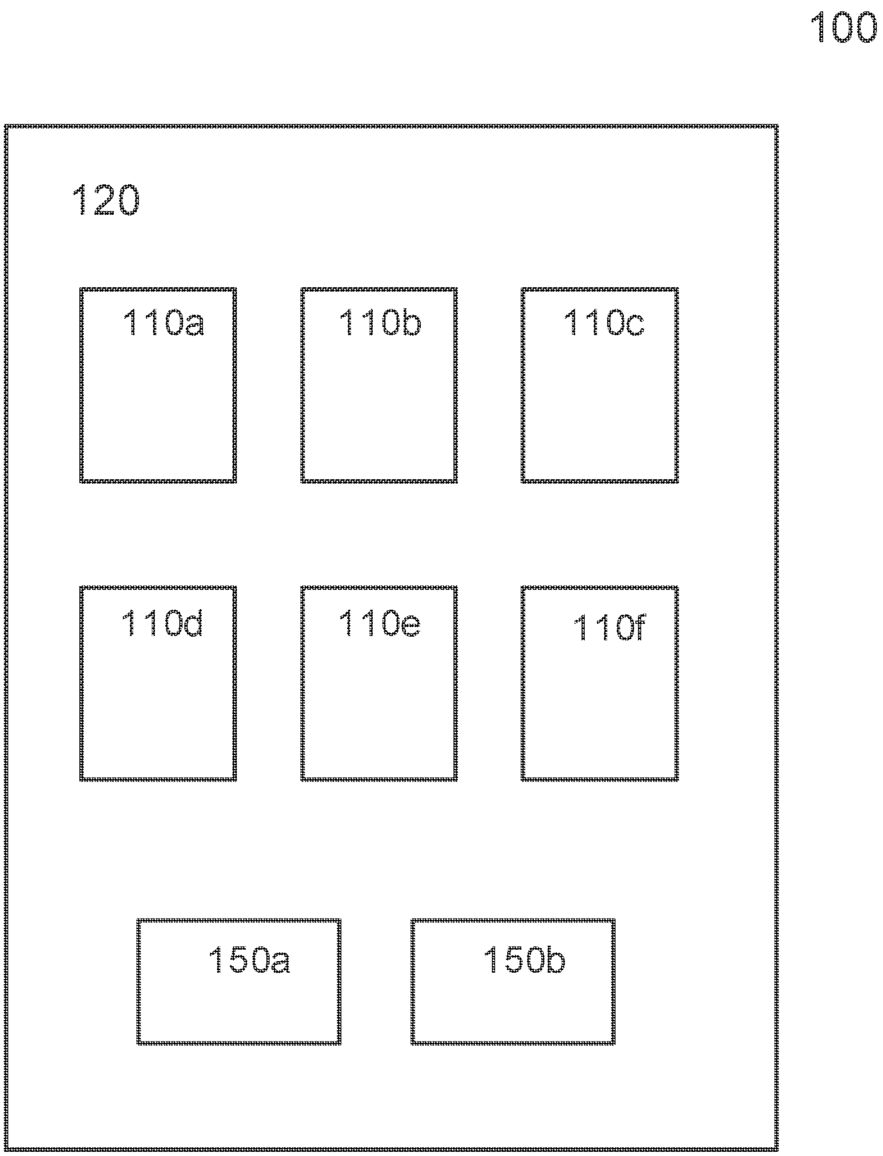
FIG. 1 exemplarily shows a simplified representation of a multi-chip electronic device.

The following detailed description refers to the accompanying drawings that show, by way of illustration, exemplary details and aspects in which aspects of the present disclosure may be practiced.

BACKGROUND

Today's emerging technologies and application continue to increasingly demand or require greater computational power.

However, due to physical limits and constraints, the frequency of transistor doubling has slowed down. At the same time as the technologies involving artificial intelligence, machine learning, neuromorphic computing, data servers, cloud computing demands are greater with respect to computational performance. One approach to meet today's ever-increasing computational demand has been the integration of disaggregated resources in a single package or module. In some cases, the disaggregated resources may be a hardware component in the form of a chip (in various aspects a chip may be denoted as a chiplet). A chiplet can be a functional block in the form of an integrated circuit that can be specifically designed to work with other chiplets to form larger more complex chips. That is, chiplets can refer to the independent constituents which make up a large chip built out of multiple smaller chiplets or dice. Chiplet(s) may be provided with or without encapsulating material packaging the chiplet(s).

Devices described herein can be in the form of a multi-chip module. Multi-chip modules described herein be an electronic assembly where multiple chiplets and/or other discrete components are integrated so that in operation, the multiple chiplets can be treated as if they were a larger integrated circuit.

The integration of disaggregated resources by way of integrating chiplets in a module may provide the computational power needed for today's applications.

However, the integration of disaggregated resource poses many challenges in terms of realizing performance improvement, cost efficiency, and design flexibility. For example, the connections between the chiplets or other functional blocks in a module can provide difficulties and challenges.

To meet the computational demands for today's application, chips or modules that include any integrated multiple disaggregated resources are used. One way to increase the performance or power of a processor is to increase the number of computational elements or transistors on a processor. However, as the size of transistors has shrunk, the transistor doubling frequency has decelerated. One alternative to boost performance has been the use of chips.

As used herein, the term "chiplet" includes an integrated circuit block of a multi-chip module (MCM) or MCM devices. A chiplet can be considered as typically a sub processing unit or circuitry or a disaggregated functional resource with a specialized function that is designed to integrate with other chiplets of a same multi-chip device or module or circuitry. A chiplet may be fabricated on its own individual semiconductor die with physical dimensions that are often smaller than other chips or processors. The MCM provides interconnections of the chiplets so as to form complete electronic function(s).

In aspects of the disclosure, where appropriate, the term "die" may refer to a block of semiconductor material on which a component, e.g., a chip or chiplet is fabricated. In appropriate cases the term "die" may be used to refer to the integrated circuit fabricated from the semiconductor material (e.g., a chip, chiplet, etc.) and vice versa.

A multi-chip module or MCM can be an electronic assembly that may be a single package including multiple components or circuitries. In examples herein, an MCM can be a plurality of chiplets arranged in a single package including die-to-die interconnect schemes for connecting the chiplets. In such cases, the chiplets of an MCM can be integrated and mounted onto a unifying carrier, so that in use the MCM can be treated as if the MCM were a larger IC. The unifying carrier may be the package carrier or package carrier. The chiplets (and possibly other components) of the MCM may also share a common enclosure or encapsulation and a common integrated head spreader (IHS).

An MCM may in some cases include components other than chiplets. That is, an MCM may include integrated devices that have with their own packaging, such as, for example, Central Processing Units (CPUs), Graphical Processing Units (GPUs), Field Programmable Gate Arrays (FPGA), Digital Signal Processors (DSPs), Application-Specific Integrated Circuits (ASICs) etc. Such components with their own packaging can be arranged on a common carrier or base layer (also denoted as package carrier or board) within in relatively close proximity to each other in the MCM.

As used herein, "racks" or "rack enclosures" may be any type of equipment for housing electronic equipment. Racks house multiple types or sets of electronic equipment with an individual set of electronic equipment being housed within a single rack unit of the rack. Rack units of a rack may be stacked close together, e.g., vertically in some cases. In aspects of the present disclosure, a rack unit may contain or hold one or more circuit boards or simply "boards". Each board can include a plurality of electronic devices, e.g., one or more multi-chip devices mounted the board. A rack may include multiple rack units in enclosed or contained in a common frame structure or chassis.

FIG. 1 shows an exemplary simplified representation of a multi-chip electronic device 100. The device 100 includes a plurality of chiplets 110*a-f*. Each of the chiplets 110*a-f* may include one or a plurality of processor cores or cores. In addition to the chiplets 110*a-f*, the electronic device 100 may include other hardware and/or software resources as represented by the blocks 150*a* and 150*b*. For example, the electronic device 100 may include elements or components such as, for example, processors (e.g., CPU, GPU, FPGA, DSC, ASIC e.g. for AI engine, etc.), random access memory (RAM), read-only memory (ROM), erasable programmable ROM (EPROM), electrically erasable programmable ROM (EEPROM), application specific integrated circuit (ASIC), etc.), software, hardware, firmware.

The device 100 may include a base layer or a carrier 120 (also denoted as package carrier) for mounting on which the chiplets and other components can be mounted. In some cases, the carrier 120 may be a printed circuit board (PCB) including wired connections between the components, e.g., wired connections between the chiplets and wired connections for the resources 150*a-b*. One or more package carriers can be arranged on another common carrier (also denoted as board).

The device 100 of FIG. 1 can be considered as 2D (two-dimensional) device because the components are mounted on a single plane. However, the above approach may be of less value because area of the mounting plane (e.g., real estate) may not be sufficient to allow enough components for a particular application. Further, the connections of a base layer like a PCB (e.g., conductive traces) may be unsuitable for applications requiring a structure with fast interconnections.

Figure 2:
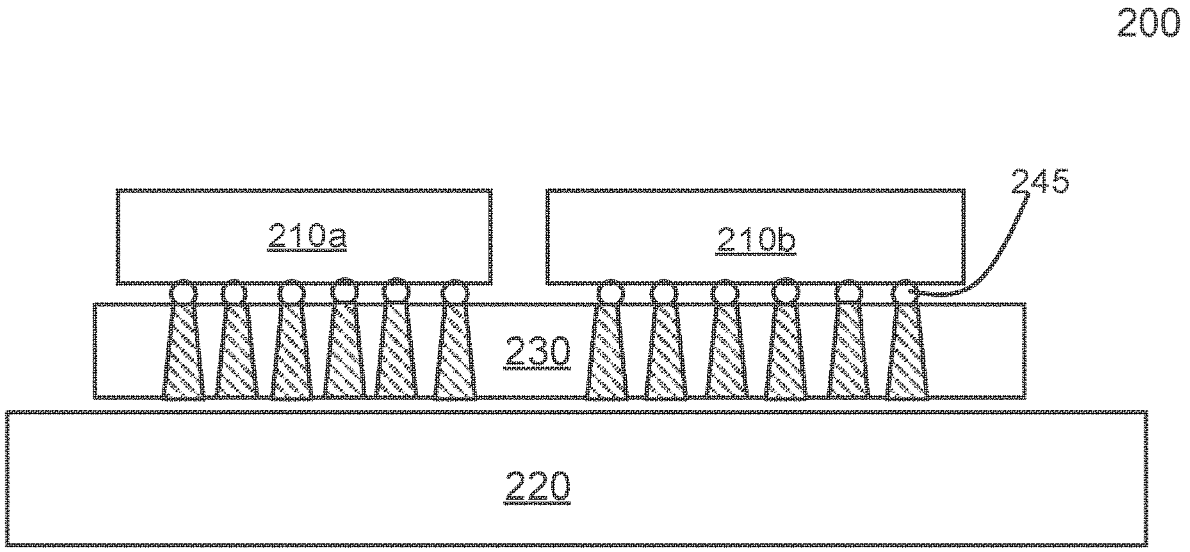
FIG. 2 exemplarily shows another architectural approach for increasing computational power using 2.5-dimensional package.

Another architectural approach for increasing computational power is the use of 2.5 dimensional (2.5 D) packages. One example of a 2.5D package is shown in the device 200 of FIG. 2. 2.5D packages as known in the art, can include multiple components, e.g., chips or chiplets mounted on an interposer. Conventionally, 2.5D semiconductor package place several chips side-by-side on a silicon interposer. This can be seen in FIG. 2, where in the device 200, the chips or chiplets 210*a* and 210*b* are mounted using bumps 245 on the interposer 230. The interposer 230 itself can be mounted on the base layer or package carrier or carrier 220.

An interposer is an interface between connectors. The interposer may be electrically conductive, e.g. including a metal or semiconductor material. The interposer may couple connectors electromagnetically, electrically, etc. For example, an interposer can provide interconnections between and/or to the components or modules or circuitries on the same package carrier or two or more package carriers in proximity of each other (e.g., chips, chiplets, etc.), as well as the external input/outputs (I/O) through the use of through carrier vias or Through-Silicon-Vias (TSV). Interposers can be silicon interposers that have lateral dimensions larger than the chips or components they are interconnecting.

Further, 2.5D package devices may also include bridges. For example, silicon bridges are a small piece of silicon that can be embedded under the edges of two components and provide interconnections therebetween. This can allow for most chips or components to be attached in multiple dimensions and thus eliminating additional physical constraints on heterogeneous chip attachment within the theoretical limits. In other words, embedded multi-die interconnect bridge (EMIB) or bridges are essentially embedded into a standard package carrier and are used to provide high interconnect density exactly where needed, while the rest of a standard package carrier can be used for the rest of the interconnects.

Another architectural approach for improving such a device is the use of three-dimensional (3D) stacking of semiconductor devices or components. The components (e.g., chips or chiplets) can be arranged in 3 dimensions instead of 2 dimensions. This allows the components of a device or module to be placed in closer proximity to one another.

Figure 3A:
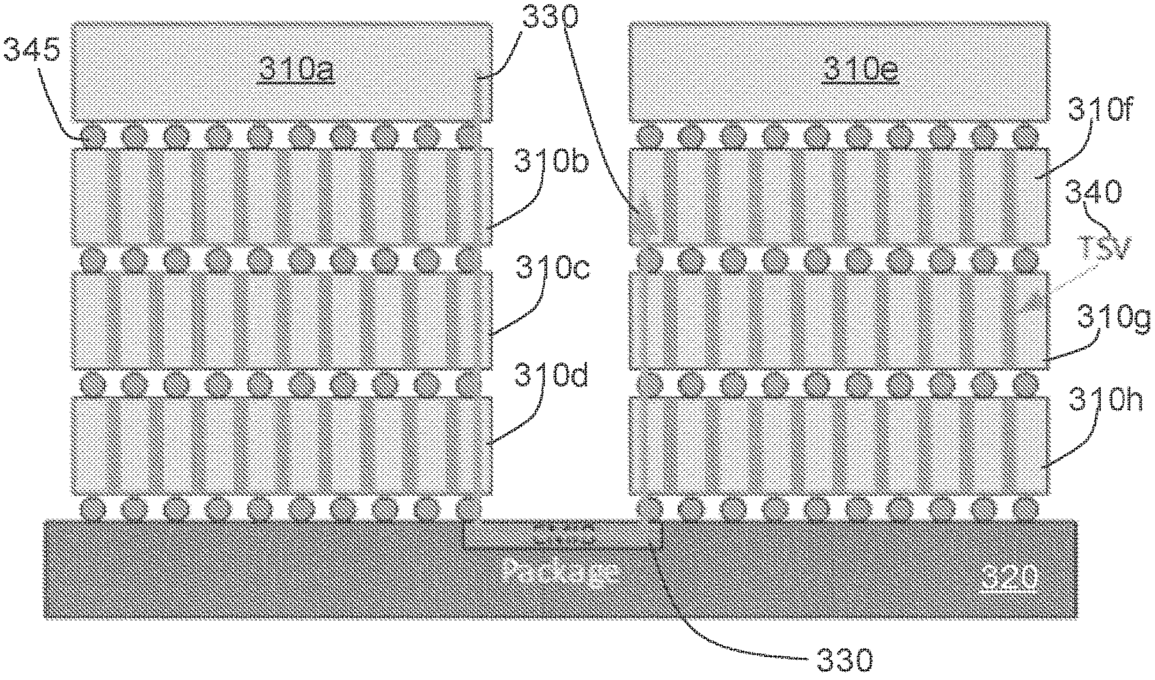
FIG. 3A and FIG. 3B exemplarily show example of a module device of an 3D heterogeneous integration of integrated circuits or components.
Figure 3B:
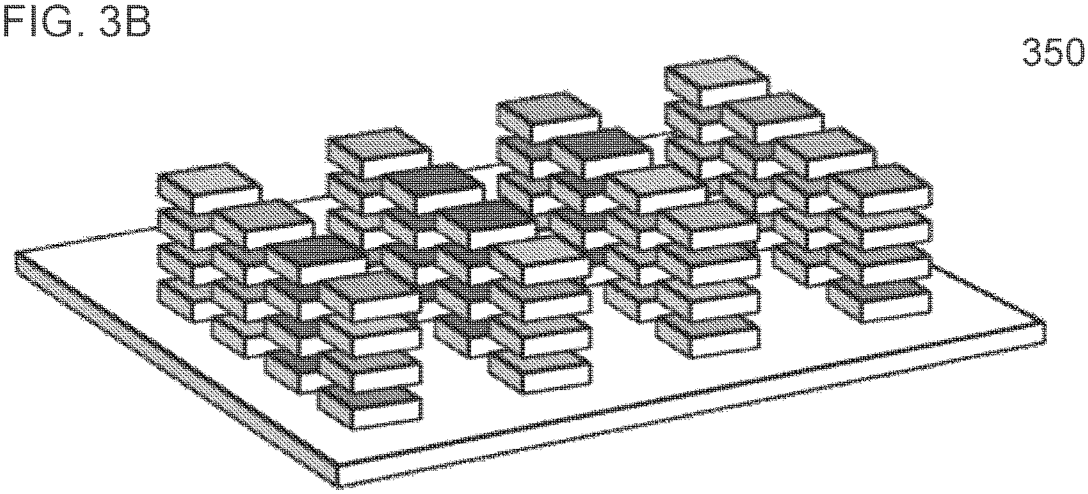

The module device 300 of FIG. 3A and FIG. 3B is one example of a 3D heterogeneous integration of integrated circuits or components (e.g., chiplets). The device 300 integrates disaggregated components in vertical stacks. The device includes at least a first vertical stack of chiplets 310*a-d* and a second vertical stack of chiplets 310*e-f*. In some examples, the chiplets may be any type of hardware component, e.g., include any type of processor (e.g., CPU, GPU, FPGA, DSP, ASIC etc.), AI engine, accelerator, memory, or other suitable or desired component. As shown, the vertically adjacent chiplets are connected to one another using TSVs 340 and bumps 345. Further, the package carrier 320 providing a mount for each stack can further include a bridge 330 for connecting the vertical stacks of chiplets. Specifically, the bridge 330 can directly connect the lower chiplet/component 310*d* of one stack with the lower chiplet/component 310*h* of the second stack. One example of a bridge is an embedded multi-die interconnect bridge (EMIB).

3D integration may provide improved speed between components (e.g. chiplets, chips) as average wire length becomes shorter, and thus leading to shorter propagation delay and improved overall performance. 3D heterogonous integrated devices may be built with a Manhattan-like architecture (e.g. having a plurality of skyscrapers) which includes large X-Y arrays of heterogeneous chiplets (e.g., CPU, GPU, AI, memory, etc.) and each chiplet can be positioned like in the chess board having several stacked dice. FIG. 3B depicts a device 350 which is an MCM implemented with a Manhattan architecture. The vertical dimension allows for greater connectivity and more design possibilities. Further, the 3D heterogeneous integration of resources may provide devices that provide improved performance while consuming lower power due to shorter wires which lead lower power consumption and less parasitic capacitance. Reducing the power budget leads to less heat generation, extended battery life, and lower cost of operation.

Nevertheless, the above-mentioned technologies do not scale well for massive 3D integration because the data rate per line may only be 2 to 10 Gbps. For example, referring structure to the wired interconnection approach for the device 300, no chiplets or components other than the lower two chiplets 310*d* and 310*h* have a direct connection. Therefore, if the chiplet 310*a* needs to connect and communicate with the chiplet 310*f*, the data path 330 would have to be one that runs through the TSVs 340 of the chiplets 310*b*-310 on the first stack, through the EMIB 330, and then through the TSVs 340 of the chiplets 310*g* and 310*h* before arriving at the chiplet 310*f*. Therefore, communication between chiplets would often require the use of many connections. As more and more components are added which need to communicate with each other, the more the traffic in the TSVs, EMIBs, interposers, etc. increases. This increase in traffic presents problems in cases where high-transport data connections are needed.

For example, to create an aggregate data transport of 1 Tbps, 100 to 500 interconnect lines would be needed. While such data transports may be accomplished for communication between neighboring structure chips, it would be physically and economically unfeasible to provide such data transports for larger integrations that involve hundreds of interconnect lines between horizontally and vertically stacked chips.

Further, the cost of a silicon interposer is proportional to the area of that interposer. So, in cases needing several or many localized high-density interconnects, the costs can quickly accumulate.

In short, TSV silicon interposers are relatively expensive and do not scale well for applications that require a massive number of components e.g., chiplets. Further, wires (interconnects) that connect together chips or chiplets degrade in performance with scaling. That is, wires can dominate the performance, functionality and power consumption of ICs.

Wireless Chip-to-Chip interconnect is an approach for realizing high-speed data transport that would meet the requirements for high-performance computing products and applications. The wireless chip-to-chip (WC2C) technology can complement wired communications. WC2C can provide flexibility for high-performance computing products by enabling broadcast and multipoint-to-multipoint links with significant advantages to dynamically reconfigurable data-center networks.

Figure 4:
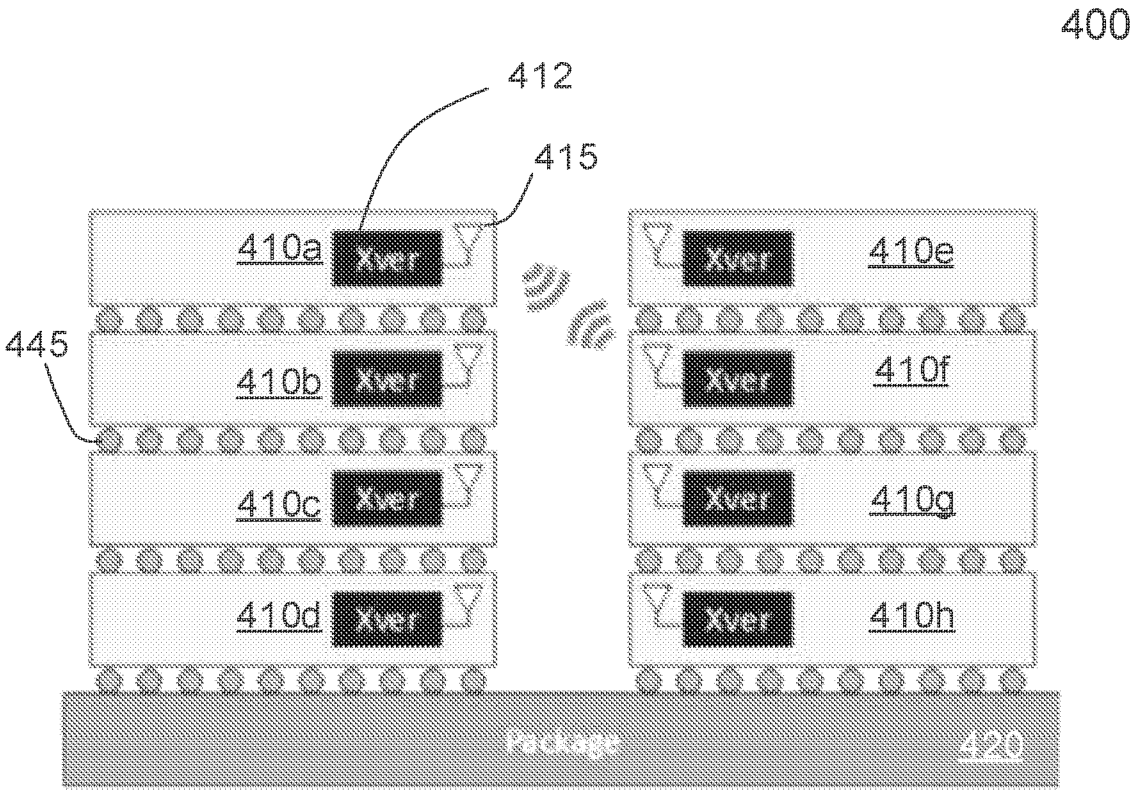
FIG. 4 exemplarily shows an example of a multi-chip module incorporating wireless interconnections.

FIG. 4 shows an example of a multi-chip module (MCM) 400 incorporating wireless interconnections. The multi-chip module 400 includes a 3D integration of disaggregated resources (e.g., chiplets 410*a-h*).

The chiplets 410 can be stacked and mounted on a package carrier 420. To enable wireless connection, each chiplet 410 or component can include an antenna or antenna structure 415 and radio circuitry, e.g., transceiver circuitry 412. In addition, module 400 can include or provide wired communication between components. Similar to the module 300 of FIG. 3, the chiplets 410 may include TSVs (not shown) and bumps 445 that can allow for vertical interconnection. Further, the package carrier 420 can include bridges (e.g., EMIBs) and other types of interconnects or routing lines for providing connections between components.

WC2C communication may be used for dense chiplet-based products and supplement existing chip to chip communications, e.g., wired interconnections. As shown in the example of FIG. 4, the chiplet 410*a* can directly communicate wirelessly with the chiplet 410*f*. Therefore, in aspects of the present disclosure, the use of WC2C communication can be used to greatly relieve or reduce the data traffic through TSVs, interposers, or bridges and improve device performance, efficiency and allow for greater and more massive 3D heterogeneous integration.

According to aspects of the present disclosure, to implement WC2C communication, a multi-chip module such as the module 400 may implement protocols that can be divided into control plane and data plane.

The data plane carries the network data (e.g., in-module data) in accordance with the directives of the control plane. That is, the data plane performs the actual forwarding of the data according to the configuration or routing paths managed and set forth by the control plane.

In at least some cases, the data plane of WC2C communications may operate with frequencies in the 110-170 GHz D-band using CMOS circuits with economic power efficiency. For example, in some aspects, the antennas may have approximately 1 mm of spacing. As CMOS technology continues to evolve and improve, higher frequencies, the reduction of the size and spacing of antenna elements, and higher bandwidths can be realized.

Different implementations or cases can be used for providing in-package such as WC2C communication. For example, three types of communications may be used for in-package or in-module communications include, wireless extra-short reach (WXSR), wireless short reach (WSR) and wireless long reach (WLR), as summarized in FIG. 5D.

FIGS. 5A-5D show examples of these 3 types of wireless links that can be used for intra-device configurations. In each case, the dice may be formed on a common carrier, also denoted as a base layer, an active base die, a base die, a package carrier or a board.

Figure 5A:
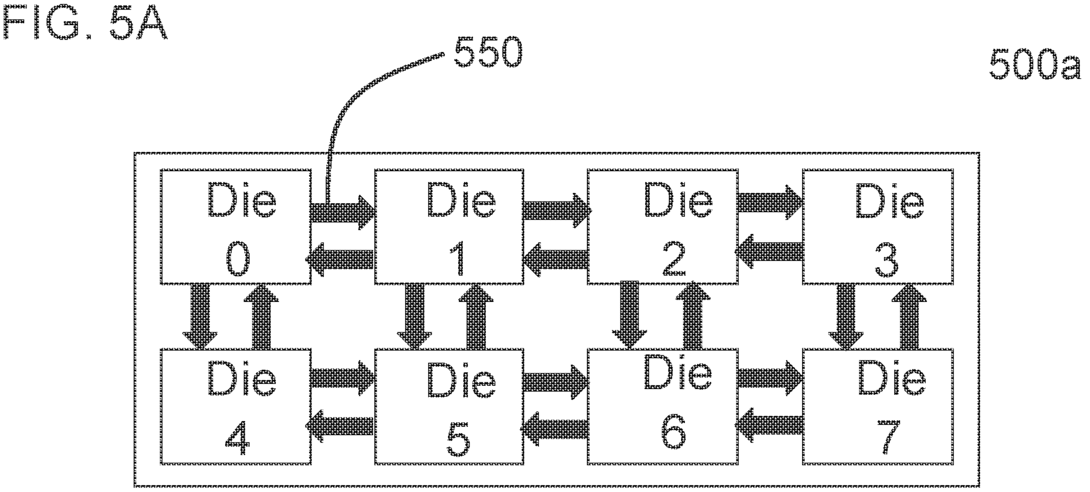
FIG. 5A to FIG. 5D exemplarily show examples of 3 types of wireless links that can be used for intra-module configurations.

The multi-chip module 500*a* or simply module 500*a*, illustrated in FIG. 5A, includes WXSR communication which allows for point-to-point links 550*a* between adjacent or immediately neighboring structure chips. In one example, adjacent or neighboring structure dice may be separated by 1-4 mm spacing. This type of wireless communication is akin to a bridge connection, e.g., an EMIB.

Figure 5B:
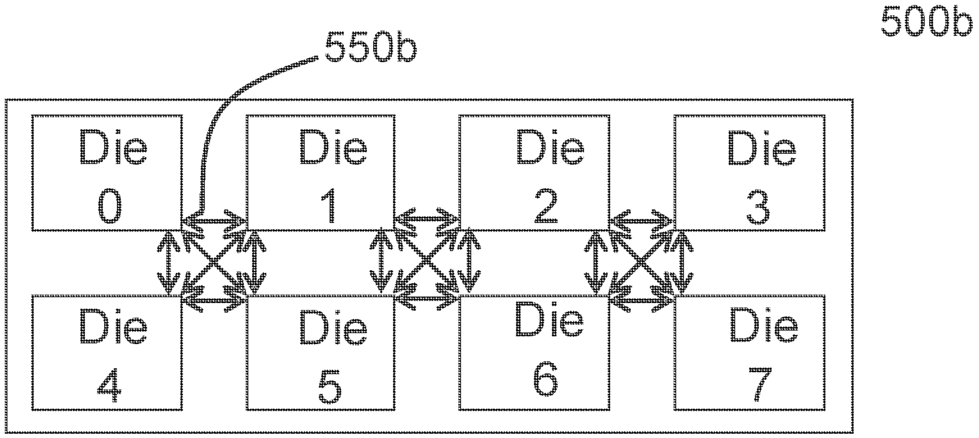

The multi-chip module 500*b*, illustrated in FIG. 5B, includes WSR communication. As shown, the WSR communication links 550*b* include point-to-point links like WXSR communication, but also include diagonal links amongst the kitty-corner dice, and thus provide or enable multipoint-to-multipoint links. For example, die 0 can now directly have wireless links with die 5 in addition to links die 1 and 4. By contrast, in the module 500*a* implementing WXSR communication, die 0 only has direct wireless links with die 1 and die 4. The configurable diagonal link adds a degree of design flexibility over current wired interconnects because it enables a direct link amongst kitty-corner dice without having to hop-switch-hop across dice.

Figures 5C, 5D:
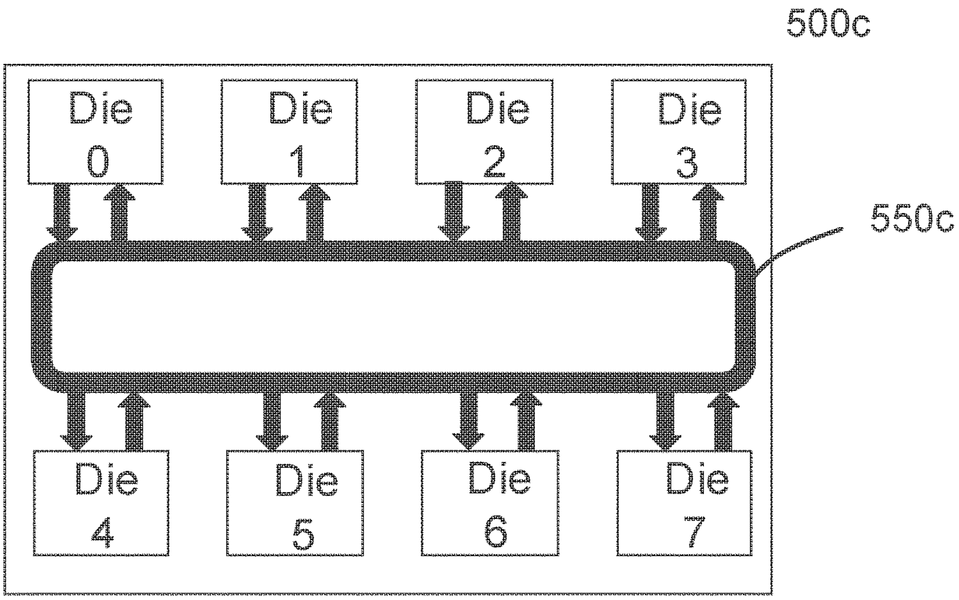

The multi-chip module 500*c*, illustrated in FIG. 5C, portrays WC2C communication using WLR. As shown, the WLR communication 550*c* can enable mesh-type wireless communication amongst several dice. As in WSR, the communication amongst dice is a direct link. That is, data communication can be accomplished without having to hop-switch-hop over many dice. WLR can also enable broadcasting to many or all the dice (e.g., dice 0-7 in 500*c*) on a mesh. In each of the cases, e.g., modules 500*a*, 500*b*, and 500*c* the WC2C may be capable of full duplex communication.

WC2C communication can be done for in-package links and may similarly be used for or applied to package-to-package wireless communications.

While the examples of WXSR, WSR, and the WLR communication in FIG. 5A to FIG. 5D are shown implemented in a planar or 2D environment, such types or similar types of communication may also be extended vertically. The wireless links, e.g., point-to-point, broadcast, etc. may also be implemented to allow one component (e.g. chiplet) to communicate with another chiplet disposed on another different elevation. Said differently, wireless communication links may allow for communication along the z-direction (vertical).

The modules implementing WC2C communication can include control plane capabilities. That is, to augment the above-mentioned high-speed wireless data links or the data plane, control plane capabilities or functionalities can be included in the modules. Control plane functions implemented using wireless control signaling can establish the wireless data connections described herein. The control plane protocols can be used to establish wireless connections within a module or package and further to define routing paths for the data. For example, industry protocols, including Wi-Fi, $I^2C$, USB, and/or other known protocols may be used.

Figure 6:
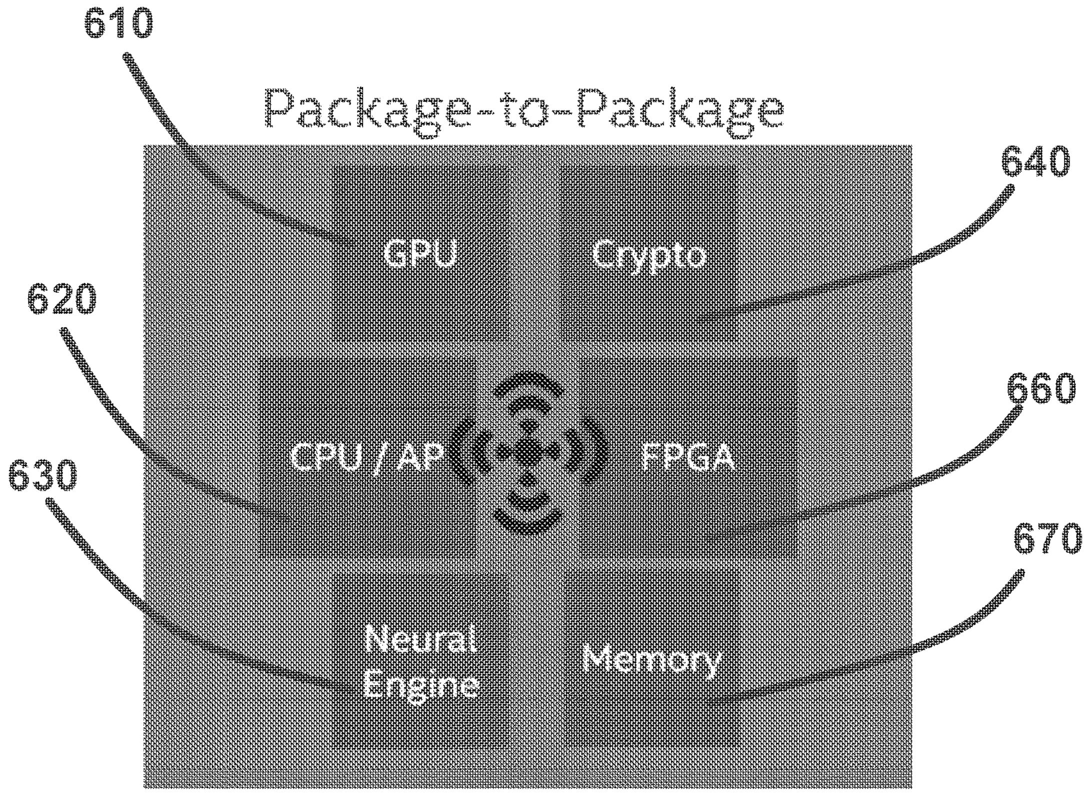
FIG. 6 exemplarily shows a schematic example of a package-to-package communication according to various aspects.

Control plane messages or control signaling may be in the form of packets to inform other components on where to forward data or data messages. In some aspects, the control plane messages of a multi-chip module may be implemented by using frequencies that differ from the data or data plane messages to manage and configure network data or data being transmitted to and from the components of a multi-chip device. In some cases, the messages may be implemented in a package-to-package type of communication scheme. For example, as described herein, a multi-chip device may include components that have their own individual packaging. This is in contrast to a multi-chip module of chiplets which may be packaged together, e.g., the dice of the chiplets share a common package. In such cases, the multi-chip device may include wireless package-to-package communications. This is the scenario illustrated in FIG. 6, where in the device 600, the several components (GPU 610, CPU 620, Neural Engine 630, Cryptoprocessor 640, Field-programmable gate array (FPGA) 660, Memory device 670) have their own packaging which includes wireless circuitry to implement wireless package-to-package communications.

The control plane may manage communication not only for traffic within a multi-chip package (also denoted as in-package communication), but also may manage the communication between modules or packages (also denoted as package-to-package communication) e.g., multi-chip modules or packages. As an example, employing miniaturized antenna technologies, e.g. material loading, distributed-component loading, topology-based approach, that leverage existing integrated circuit (IC) elements, e.g. dummy silicon chiplets, integrated heat spreaders, through silicon or molding vias, and IC package substrates tuned to sub-10 GHz carrier frequencies and mated with silicon process portable radio frequency (RF) transceivers, wireless broadcastable, full-duplex control/manageability/sideband messages can be transmitted and received to/from chiplet-to-chiplet(s) within a 3D heterogeneously integrated package or from package-to-package within a product chassis.

Figure 7:
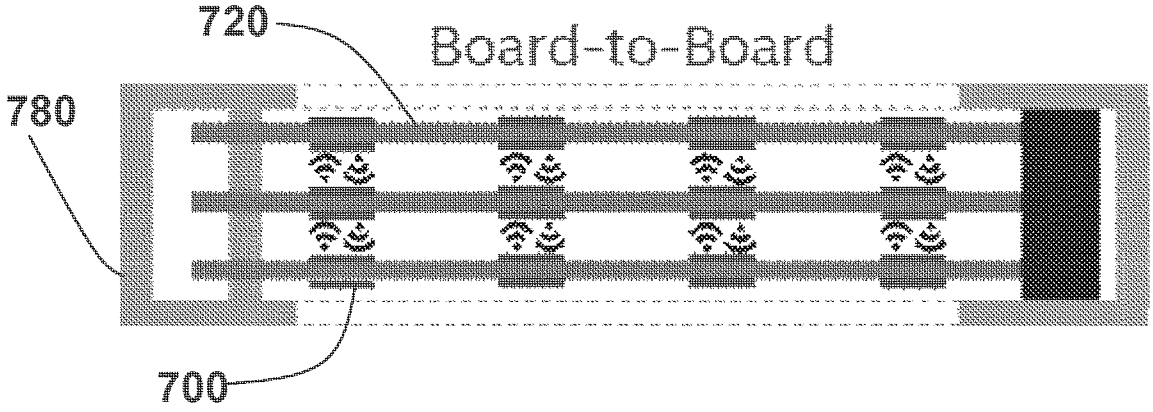
FIG. 7 exemplarily shows board-to-board communications according to various aspects.

Furthermore, the control plane may be used for facilitating board-to-board communications illustrated in FIG. 7. That is, the devices or MCMs 700 described herein can be mounted on boards, such as the boards 720, which in turn may be housed in a rack unit, such as the rack unit 780. In board-to-board communication, wireless communication may occur between the mounted devices 700 (e.g., MCMs) of different boards 720.

Figure 8:
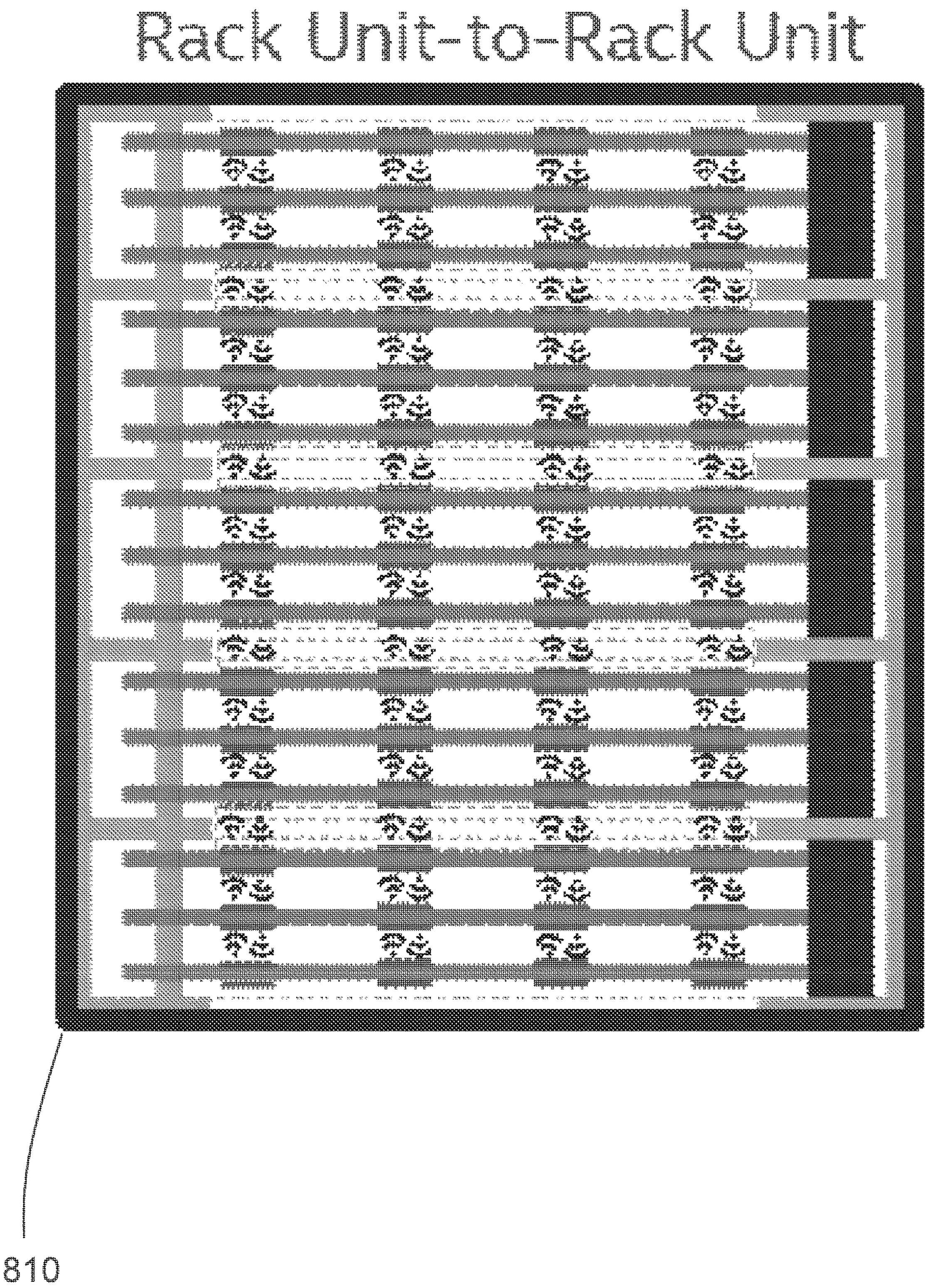
FIG. 8 exemplarily shows wireless communication extended to rack unit-to-rack unit communication.

In addition, FIG. 8 shows that wireless communication may be extended to rack-unit-to-rack-unit communication, e.g., within a chassis 810 of the rack 800.

In aspects of the present disclosure, control plane circuitry can be provided in dice of a multi-chip module and configured to provide control plane functions for wireless communication network involving devices (e.g., MCMS), dices, and packages described herein. The control plane circuitry may operate or use, as an example sub-RF carrier technology to enable point-multipoint, broadcastable, full-duplex wireless control/manageability links for various scenarios, e.g., board-board, package-package, and chiplet-to-chiplet within a package, type communications. Control signaling may be in the form of packets reflecting any suitable type of control plane protocol. The control plane circuitry may be integrated in an application-specific manner in a module. Components of the control plane circuitry such as the transceiver circuitry or the antenna structure may be integrated or incorporated with any part of a multi-chip module described herein. Further, aspects or components of the control plane circuitry such as the antenna, connections, or waveguides, may also be included or incorporated into other components holding or involving multi-chip modules, such as boards, chassis, racks, etc.

A broadcastable, full-duplex wireless messaging capability can enable a control plane communication from package-to-package and inside 3D heterogeneously integrated packages. This way, more nodes, over longer distances and higher speeds can be supported. Alternatively or in addition, a more flexible product floorplan is enabled.

According to aspects of the present disclosure, sub-10 GHz technology may be used for control signaling. Operation at sub-10 GHz can allow for process portability and easy adoption of the radio frequency (RF) transceiver and may use near-field couplers/antennas. The flexibility of an RF link can allow convenient placement and use within a product chassis, from rack-unit-to-rack-unit, and for 3D heterogeneously integrated semiconductor products. For example, in at least some aspects of the present disclosure, control signaling bit rates may be in the range of 0.5-2 Gbps over distances up to 20 cm, supporting both symmetric and asymmetric topologies. The distance may decrease with increasing frequency, e.g. for a frequency of up to about 100 GHz the distance may be in the range of about 1 cm.

Figure 9:
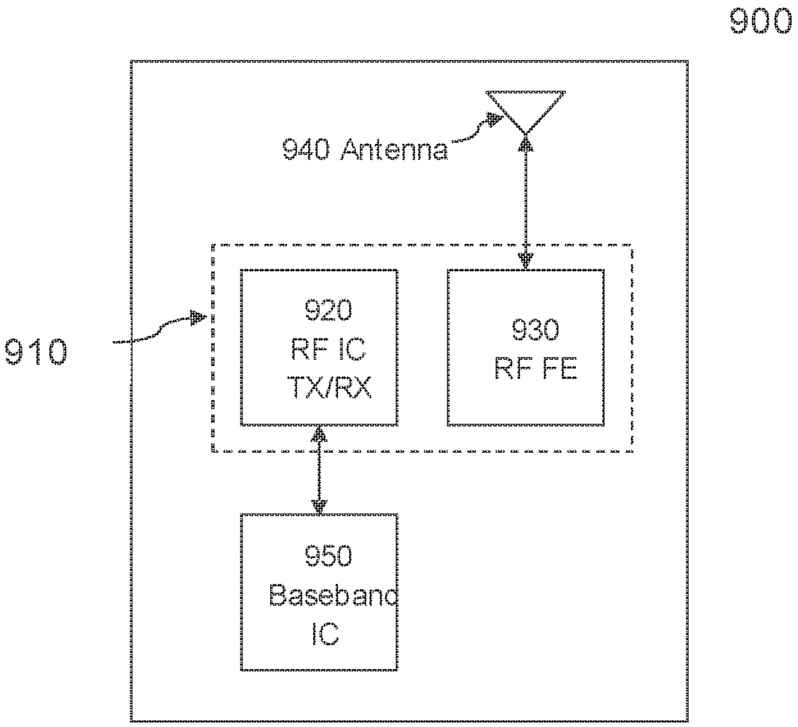
FIG. 9 exemplarily shows a block diagram showing a wireless device according to various aspects.

For the WC2C communications, both the data plane and control plane require the use of an RF circuitry. FIG. 9 shows a block diagram showing a wireless circuitry 900. The wireless circuitry 900 includes a hardware component, e.g., a baseband integrated circuit 950 for baseband signal processing, a radio circuitry 910 for radio frequency signal processing, and an antenna or antenna structure 940.

The radio circuitry 910 may include an RF integrated circuit (IC) 920 including one or more RF transceivers (TRX) and a common RF front end (FE) 930. The RF IC 920 may receive one or more data and control signals (also denoted as signal of the control plane of the OSI model) and operate to receive a communication signal from the baseband IC and generate an RF electrical signal from the communication signal for radio transmission from the circuitry 900 or receive an RF electrical signal and generate a communication signal from the RF electrical signal for providing to the baseband IC. The RF FE 930 may convert an RF electrical signal into a format for transmission via the antenna 940 and/or convert a signal received from the antenna 940 into an RF electrical signal for the RF IC 920.

Figure 10:
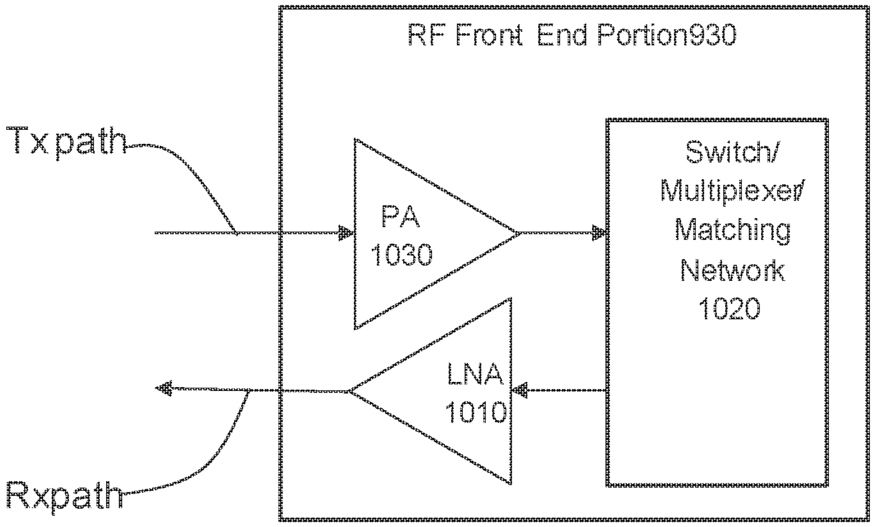
FIG. 10 exemplarily shows an example of a RF front-end portion implemented in the device according to various aspects.

FIG. 10 shows an example of an RF front end portion 930 that may be implemented in the circuitry 900. A receive signal path (Rx path) of the RF front end 930 of FIG. 10 includes an LNA (low noise amplifier) 1010 for amplifying received RF signals and provides the amplified received RF signals as an output. A transmit signal path (Tx path) of the RF front end 930 of FIG. 10 includes a PA (power amplifier) 1030 for amplifying input RF signals. One or more filters may be included for generating suitable RF signals for transmission and reception. In addition, the RF front-end 930 of FIG. 10 may include other components 1020 or circuitry, such as, for example, a tuner or matching network, switches, multiplexers, and/or another circuitry for coupling the RF front end 930 to an antenna 940 as illustrated in FIG. 9. In addition, other components may be included to support both transmit and receive modes.

The RF FE 930 of at least FIG. 9 can provide signals obtained from the antenna 940 to the RFIC 920. The transceiver chain or RFIC 920 can interface between the RF FE 930 and one or more other components.

Figure 11:
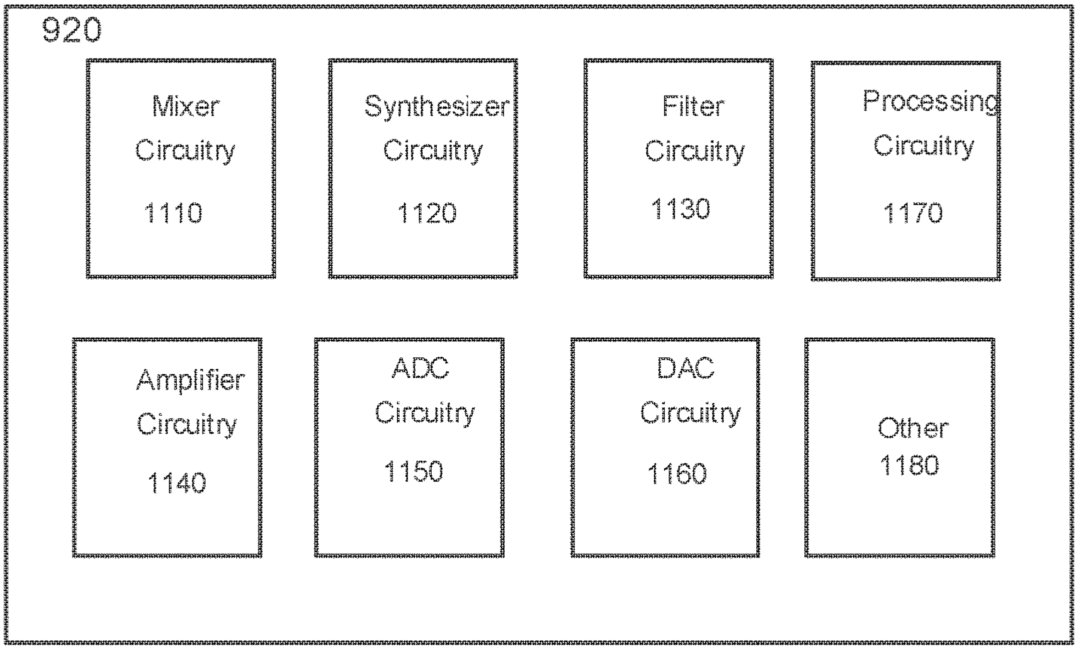
FIG. 11 exemplarily shows one example of the RF IC or transceiver circuitry according to various aspects.

FIG. 11 shows one example of the RFIC or transceiver circuitry 920. As shown, the transceiver chain/RFIC 920 can include components such as a mixer circuitry 1110, synthesizer circuitry 1120 (e.g., local oscillator), filter circuitry 1130 (e.g., baseband filter), amplifier circuitry 1140, analog-to-digital converter (ADC) circuitry 1150, digital-to-analog (DAC) circuitry 1160, processing circuitry 1170, and other suitable digital front end (DFE) components 1180, to name a few. The processing circuitry 1170 may include a processor, such as a time-domain and/or frequency domain processor(s)/components in at least one example.

The other components 1180 may include logic components, modulation/demodulation elements, and an interface circuitry for interfacing with another component.

DFE (digital front end) components 1180 may include any suitable number and/or type of components configured to perform functions known to be associated with digital front ends. This may include digital processing circuitry, portions of processing circuitry, one or more portions of an on-board chiplet having dedicated digital front-end functionality (e.g., a digital signal processor), etc. The DFE components 1180 may selectively perform specific functions based upon the operating mode of the radio circuitry 910 and, for example, may facilitate beamforming. Digital front-end components may also include other components associated with data transmission such as, for instance, transmitter impairment correction such as LO correction, DC offset correction, IQ imbalance correction, and ADC skew, digital pre-distortion (DPD) calculation, correction factor (CF) calculation, and pre-emphasis (pre. emp.) calculation. To provide additional examples, the digital front end components 1180 may facilitate or perform receiver or transmitter digital gain control (DGC), up-sampling, down-sampling, zero crossing detection algorithms, phase modulation, perform beam management, digital blocker cancellation, received signal strength indicator (RSSI) measurements, DPD and calibration accelerators, test signal generation, etc.

In at least one example, the transceiver chain (of the RF IC 920) can include a receive signal path which may include mixer circuitry 1110, amplifier circuitry 1140 and filter circuitry 1130. In some aspects, the transmit signal path of the transceiver chain 920 may include filter circuitry 1130 and mixer circuitry 1110. The transceiver chain 920 may also include synthesizer circuitry 1120 for synthesizing a frequency signal for use by the mixer circuitry 1110 of the receive signal path and the transmit signal path. In some aspects, the mixer circuitry 1110 of the receive signal path may be configured to down-convert RF signals received from the RF FE 930 based on the synthesized frequency provided by synthesizer circuitry 1120.

In some aspects, the output baseband signals and the input baseband signals may be digital baseband signals. In such aspects, the radio circuitry 910 may include analog-to-digital converter (ADC) 1150 and digital-to-analog converter (DAC) circuitry 1160.

In at least one example, the transceiver chain 920 may also include a transmit signal path (Tx path) which may include circuitry to up-convert baseband signals provided by e.g., a modem and provide RF output signals to the RF FE 930 for transmission. In some aspects, the receive signal path may include mixer circuitry 1110, amplifier circuitry 1140 and filter circuitry 1130. In some aspects, the transmit signal path of the RFIC 920 may include filter circuitry 1130 and mixer circuitry 1110. The RFIC 920 may include synthesizer circuitry 1120 for synthesizing a frequency signal for use by the mixer circuitry 1110 of the receive signal path and the transmit signal path. The mixer circuitry 1110 of the receive signal path may be configured to down-convert RF signals received from the RF FE 930 based on the synthesized frequency provided by synthesizer circuitry 1120.

In various aspects, amplifier circuitry 1140 may be configured to amplify the down-converted signals and filter circuitry may be a low-pass filter (LPF) or band-pass filter (BPF) configured to remove unwanted signals from the down-converted signals to generate output baseband signals. Output baseband signals may be provided to another component for further processing. In some aspects, the output baseband signals may be zero-frequency baseband signals, although this is not a requirement.

The mixer circuitry 1110 for a receive signal path may include passive mixers, although the scope of this disclosure is not limited in this respect. In some aspects, the mixer circuitry 1110 for a transmit signal path may be configured to up-convert input baseband signals based on the synthesized frequency provided by the synthesizer circuitry 1120 to generate RF output signals for the RF FE 930.

In some aspects, the mixer circuitry 1110 of the receive signal path and the mixer circuitry 1110 of the transmit signal path may include two or more mixers and may be arranged for quadrature down conversion and up conversion, respectively. In some aspects, the mixer circuitry 1110 of the receive signal path and the mixer circuitry 1110 of the transmit signal path may include two or more mixers and may be arranged for image rejection (e.g., Hartley image rejection). In some aspects, the mixer circuitry 1110 of the receive signal path and the mixer circuitry 1110 may be arranged for direct down conversion and direct up conversion, respectively. In some aspects, the mixer circuitry 1110 of the receive signal path and the mixer circuitry 1110 of the transmit signal path may be configured for super-heterodyne operation.

In some aspects, the synthesizer circuitry 1120 may be a fractional-N synthesizer or a fractional N/N+1 synthesizer, although the scope of the aspects is not limited in this respect as other types of frequency synthesizers may be suitable. For example, synthesizer circuitry 1120 may be a delta-sigma synthesizer, a frequency multiplier, or a synthesizer including a phase-locked loop with a frequency divider.

The synthesizer circuitry 1120 may be configured to synthesize an output frequency for use by the mixer circuitry 1110 of the radio circuitry 1120 based on a frequency input and a divider control input. In some aspects, the synthesizer circuitry 1120 may be a fractional N/N+1 synthesizer.

In some aspects, frequency input may be provided by a voltage-controlled oscillator (VCO), although that is not a requirement. In various cases, divider control input may be provided by a processing component of the RFIC 920, or may be provided by any suitable component. In some aspects, a divider control input (e.g., N) may be determined from a look-up table based on a channel indicated by external component.

In some aspects, synthesizer circuitry 1120 of the RFIC 920 may include a divider, a delay-locked loop (DLL), a multiplexer and a phase accumulator. In some aspects, the divider may be a dual modulus divider (DMD) and the phase accumulator may be a digital phase accumulator (DPA). In some aspects, the DMD may be configured to divide the input signal by either N or N+1 (e.g., based on a carry out) to provide a fractional division ratio. In some aspects, the DLL may include a set of cascaded, tunable, delay elements, a phase detector, a charge pump and a D-type flip-flop. The delay elements may be configured to break a VCO period up into Nd equal packets of phase, where Nd is the number of delay elements in the delay line. In this way, the DLL provides negative feedback to help ensure that the total delay through the delay line is one VCO cycle.

In some aspects, synthesizer circuitry 1120 may be configured to generate a carrier frequency as the output frequency, while in other aspects, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some aspects, the output frequency may be a LO frequency (fLO). In some aspects, the RFIC 920 may include an IQ/polar converter.

Figure 12:
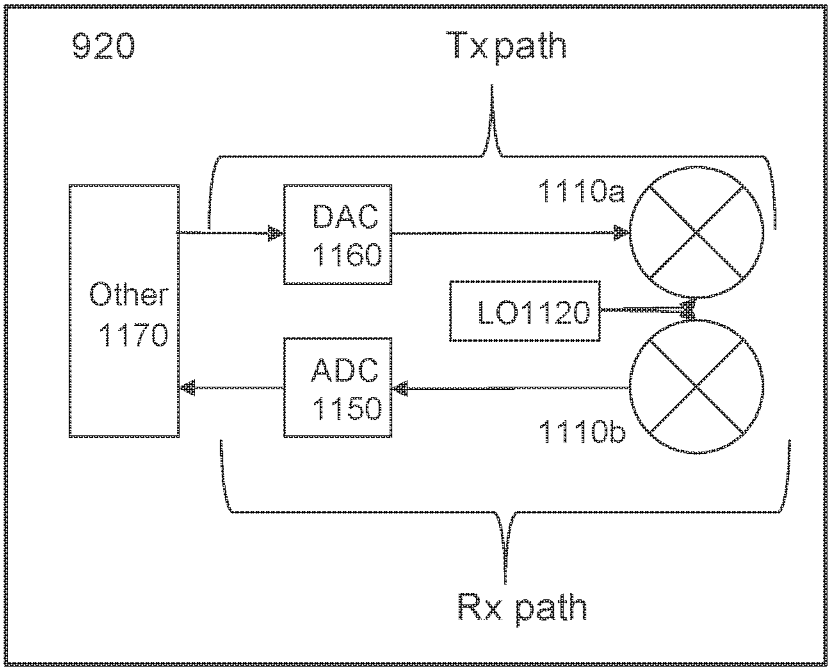
FIG. 12 exemplarily shows one example of a RF IC according to various aspects.

FIG. 12 shows one example of a transceiver chain/RFIC 920 that may be implemented. The receive signal path (Rx path) circuitry down-converts RF signals received from the RF FE 930 and provides baseband signals. Specifically, the receive signal path may include a mixer 1110*b* and an ADC 1150. The transmit signal path (Tx path) circuitry up-converts provided baseband signals and provides RF output signals to the RF front end 930 for transmission. Specifically, the transmit signal path may include a DAC 1160 and a mixer 1110*a*. The transceiver chain shown in FIG. 12 includes a synthesizer circuit, specifically, at least one local oscillator (LO) 1120 to generate reference signals for the mixers 1110*a* and 1110*b*.

The antenna 940, illustrated in FIG. 9, may include a single antenna for transmission and reception. In other cases, the antenna or antenna structure 940 may include multiple transmit antennas in the form of a transmit antenna array and multiple receive antennas in the form of a receive antenna array.

In other cases, the antenna 940 may be one or more antennas to be used as transmit and receive antennas. In such cases, the RF FE 930 may include, for example, a duplexer, to separate transmitted signals from received signals.

While the transceivers described herein include traditional super-heterodyning schemes or architectures, other type of transceiver or transmitter architectures and schemes may be used. In some aspects, the transceiver chain of the RFIC 920 may include components so as to implement a near zero IF scheme, a Direct Conversion scheme, or a digital transmission schemes, such as, for example, a Digital IQ transmission, a Digital Polar transmission, and the like.

In one example, the transceiver chain of the RFIC 920 may include a transmit path that includes or implements a direct digital transmitter (DDT). That is, in one simple example, a DDT may include a digital signal processor, a RF digital-to-analog converter (RFDAC), a RF filter/antenna coupler.

Further, a DDT may be implemented with or without an IQ-mixer. In general, a RF-DAC may be included on a RFIC to convert digital input into a RF signal. A DDT may include other digital components such as numerically controlled oscillator (NCO) and digital mixers for shifting an input signal to desired frequency. The use of a DDT can reduce the number of analog components needed in the transmitter or transmit path. For example, an analog LOs, analog filters, analog mixers, and etc., may be eliminated from the RFIC when a direct digital transmitter such as DDT is employed. Further, the use of a digital transmitter or digital transmission schemes such may bring structure energy savings and efficiencies.

DETAILED DESCRIPTION

Figure 13:
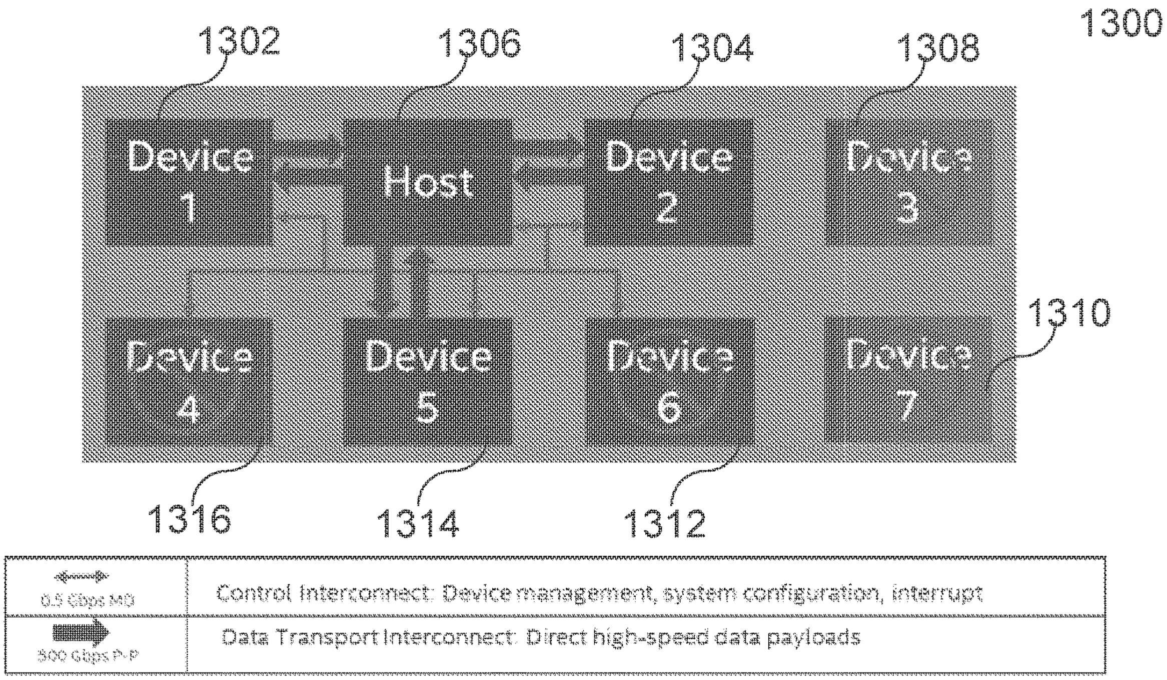
FIG. 13 exemplarily shows a wired control, manageability, sideband messaging interconnect used in conjunction with a high-speed data interconnect according to various aspects.

FIG. 13 illustrates wired interconnects of an in-package communication system 1300 or package-to-package communication system 1300 of the related art. FIG. 13 illustrates a wired control, manageability, sideband messaging interconnect used in conjunction with a high-speed data interconnect. Physical limitations may not allow for reach to all devices in the system. Conventionally, the control, manageability and sideband signal communication between chiplets inside a 3D heterogeneously integrated package (in-package) or packaged chips on a main circuit board are achieved through wired traces that can be arranged in series or parallel. There can be a wide range in speed (kHz to GHz), supported topologies, number of nodes/endpoints supported, transport and messaging types. However, these methods have limitations along all of those mentioned vectors, primarily due to the limitations of copper wire signaling. A wired control/manageability/sideband interconnect comes with disadvantages, e.g. hard to scale to high chiplet and package counts, long distances, large number of endpoints/nodes and higher data speeds. Very complex signal routing makes chiplet/package layout and device or system floor planning tedious and inflexible. It is very difficult to re-purpose the control/manageability/sideband signal connections and hence results in a high cost for our customers.

In various aspects, a wireless device-to-device communication system 1300 includes at least a first device 1302 and a second device 1304 (in the example of FIG. 13, a host 1306 and seven devices 1302, 1304, 1308, 1310, 1312, 1314, 1316—each of which may include a circuitry such as radio circuitry 910 of FIG. 9). Each of the first device 1302 and the second device 1304 can include an antenna 940, an RF FE 930, an RF IC 920 and a Baseband IC 950, as described above.

In various aspects, a device may be a die or a chiplet and the communication system 1300 may be an in-package communication system 1300. The devices may be formed on the same carrier in an in-package communication system 1300. Hence, the carrier may be denoted as package carrier. The package carrier may be a semiconductor carrier, including compound semiconductor material, or may be a printed circuit board (PCB). As example, the carrier may include silicon, e.g. may be a silicon carrier. As an alternative, the package carrier may include gallium arsenide or gallium nitride or silicon germanium, e.g. may be a gallium arsenide carrier or a gallium nitride carrier or a silicon germanium carrier. Any other suitable semiconductor material may be used in various implementations.

Alternatively, the device may be a package and the communication system 1300 may be, in general, a package-to-package communication system 1300. The packages may be formed on a common carrier or different carriers in a package-to-package communication system. However, the package-to-package communication system may be a package-to-package communication system, a board-to-board communication system or a rack unit-to-rack unit communication system, etc., as an example.

However, in various aspects, a first die and a second die of a first package may be wirelessly communicatively coupled, and, in addition, the first package may be wirelessly communicatively coupled to a second package. The antenna (s) used for the wireless communication between the first die and the second die may be the same as the antenna(s) of the first package used in the communication with the second package.

The different aspects described in the following can be applied on different devices and communication systems of including these devices depending on the application. The communication system according to various aspects may be configured to send or receive wireless radio frequency control signals associated with wireless radio frequency data signals of a stationary device, e.g. a server rack, a base station; or a mobile terminal, e.g. a smartphone, tablet or laptop. Illustratively, the wirelessly coupled devices are connected with each other without using a wiring structure as a radio frequency signal interface, but instead using one or more antenna(s) for forming the radio frequency signal interface according to various aspects.

A package may include one more dies arranged on a common package carrier and wirelessly communicating with each other via wireless in-package communication. At least a first package and a second package of a rack unit, a rack or another device can wirelessly communicate with each other via wireless package-to-package communication.

In in-package communication, at least a first die and a second die of the package may be wirelessly communicatively coupled to each other within the package according to various aspects described below. The control signals exchanged between the first die and the second die of the package may be associated to data of the control plane of the Open Systems Interconnection (OSI)-model required to establish, maintain or end an interconnection between the first die and the second die of the package of the data plane of the OSI-model.

In package-to-package communication, at least a first package and a second package may be wirelessly communicatively coupled to each other according to various aspects described below. The control signals exchanged between the first package and the second package may be associated to data of the control plane of the Open Systems Interconnection (OSI)-model required to establish, maintain or end an interconnection between the first package and the second package of the data plane of the OSI-model.

Currently, control, manageability and sideband messaging are transmitted through wired fabrics in in-package communication systems or over wired busses in package-to-package (pkg-pkg) communication systems that are often limited in electrical loading (# of nodes), distance and speed.

In various aspects, a broadcastable, full-duplex wireless communication system is provided for a control plane of the OSI-model for package-to-package communication and in-package communication of 3D heterogeneously integrated packages.

According to various aspects, more nodes, wireless signal transmission over longer distances and higher data transmission rates are supported. Alternatively or in addition, a more flexible product floorplan is enabled.

The device-to-device communication system according to various aspects utilizes miniaturized antenna technologies, e.g. material loading, distributed-component loading, topology-based approach), that leverages existing integrated circuit (IC) elements, e.g. dummy silicon chiplets, integrated heat spreaders, through silicon or molding TSVs, and IC package carriers tuned to sub-10 GHz carrier frequencies, mated with silicon process portable radio frequency (RF) transceivers. This way, wireless broadcastable, full-duplex control/manageability/sideband messages can be transmitted and received to/from chiplet-chiplet(s) within a 3D heterogeneously integrated package or from package-to-package within a product chassis. Thus, utilizing simple RF transceiver architectures and leveraging existing IC elements, can be efficient, inexpensive, technology portable and thus easily adopted by the semiconductor industry. This way, increased product floorplan flexibility thermal and mechanical constraints are addressed, costs are reduced and time to market is shortened. Illustratively, point-to-multi-point broadcastable control messaging is brought to products and systems for more intelligent device management. Off-chip sideband signals for more product functionality are potentially re-purposed. Thus, utilizing simple RF transceiver architectures and leveraging existing IC elements, can be efficient, inexpensive, technology portable and thus easily adopted by the semiconductor industry.

Figure 14:
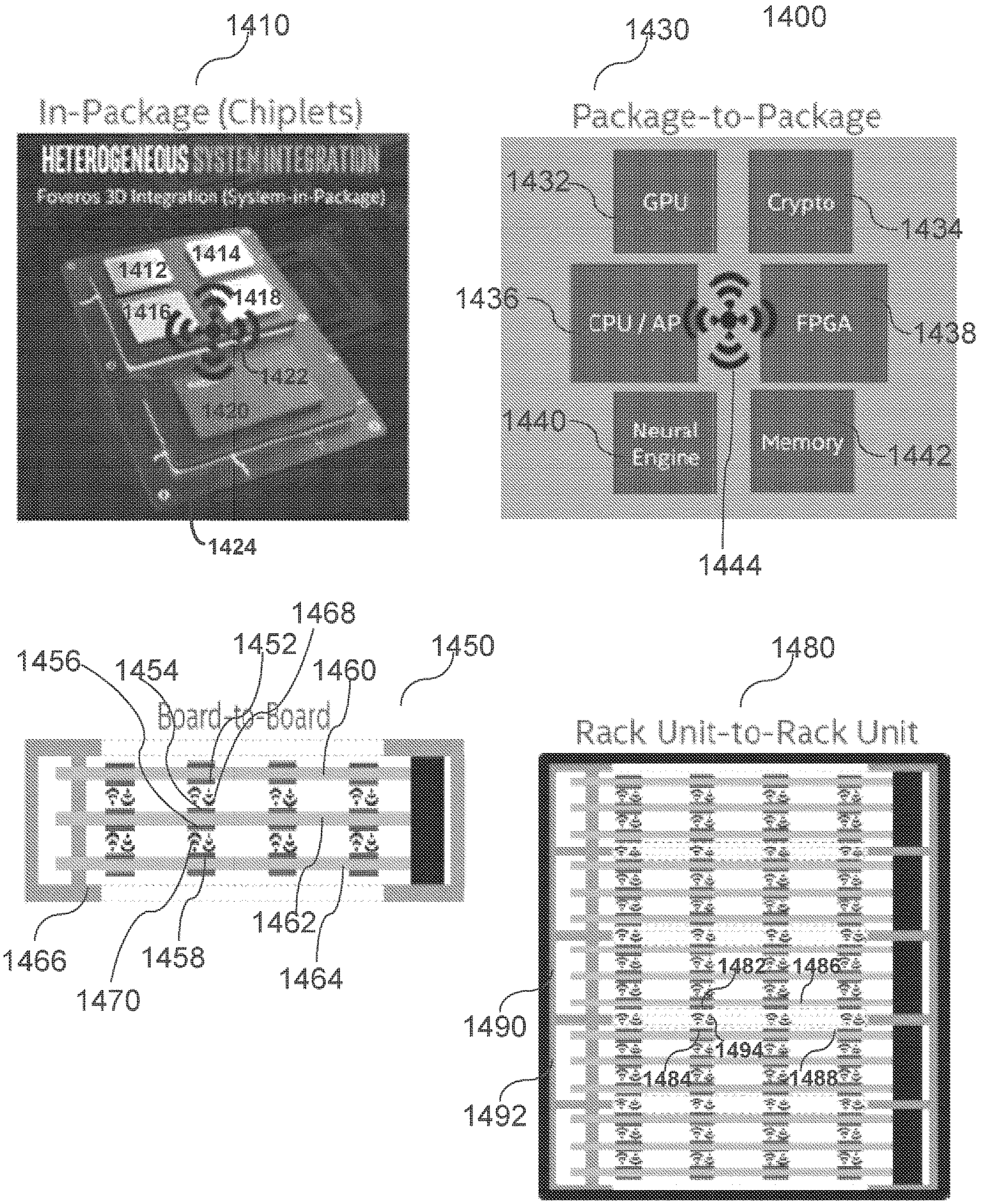
FIG. 14 exemplarily shows a wireless communication system for in-package, package-to-package, board-to-board and rack unit-to-rack unit communication according to various aspects.

FIG. 14 illustrates a wireless communication system 1400 for at least one of:

- in-package communication 1410 (in which case wireless chip-to-chip communication is provided between chips or chiplets 1412, 1414, 1416, 1418, 1420 via an RF interface 1422—all the chips 1412, 1414, 1416, 1418, 1420 are mounted on a common carrier 1424);
- package-to-package communication 1430 (in which case wireless chip-to-chip communication is provided between chips or chiplets of different packages—e.g. package-to-package communication 1430 may be provided between GPU 1432, Crypto chip 1434, CPU 1436, FPGA 1438, Neural Engine chip 1440, memory 1442, and the like—communication may be provided via RF interface 1444);
- board-to-board communication 1450 (in which case wireless chip-to-chip communication is provided between chips or chiplets 1452, 1454, and 1456, 1458 mounted on different boards 1460, 1462, 1464 within a common rack unit 1466—communication may be provided via RF interfaces 1468, 1470), and, alternatively or in addition, board-to-board communication 1450 may also be provided to connect boards that are arranged orthogonal to each other; or
- rack unit-to-rack unit communication 1480 (in which case wireless chip-to-chip communication is provided between chips or chiplets 1482, 1484 mounted on boards arranged (e.g. boards 1486, 1488) in different rack units (e.g. rack units 1490, 1492)—communication may be provided via e.g. RF interface 1494).

As shown in FIG. 14, such technology provides wireless broadcastable communication system capability to a spectrum of systems including linking rack units within a server chassis, printed circuit boards within a system/rack unit, IC packages on a printed circuit board and chips/chiplets within a semiconductor package.

In various aspects, wireless broadcastable and full-duplex control/manageability/sideband communication systems are described in more detail in the following. In various aspects, integrated antenna technologies operating with sub-GHz carrier frequencies and approximately 500 MHz bandwidth providing point-to-multi-point broadcastable RF channels between chips/chiplets within a package and between IC packages on printed circuit boards within systems are provided.

In various aspects, antenna integrated package/Patch (z+) and copper pillar/ball (end-fire) antennas integrated into the package are provided.

In various aspects, antennas on dummy silicon for In-package Wireless chip-to-chip (WC2C) Communications is provided.

In various aspects, a new edge antenna topologies/Leveraging Carrier Corners is provided.

In various aspects, integrated surface waveguide on metallic chassis for wireless package-to-package communication is provided.

In various aspects, short-range, full-duplex wireless coupler for 3-dimensional chip-to-chip communications is provided.

Figure 15:
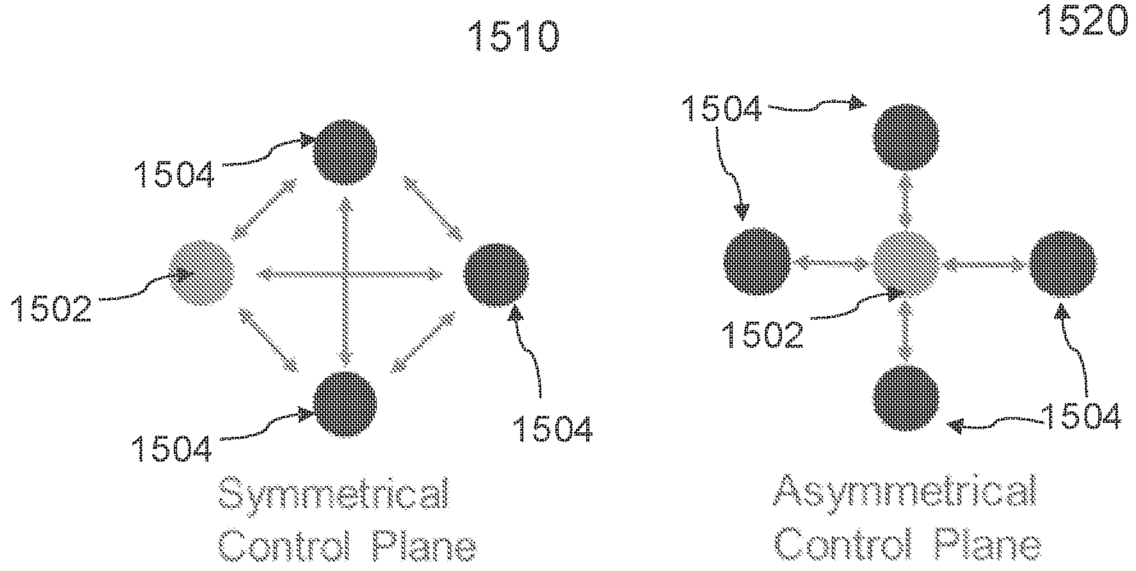
FIG. 15 exemplarily shows as an example of a wireless broadcastable communication system capability.

In various aspects, a network topology that support symmetrical configuration 1510 and asymmetrical configuration 1520 for Initiator network nodes 1502 and Target network nodes 1504 is provided. As an example, a wireless broadcastable communication system capability may support network configurations that meet or exceed those historically supported by a wired interconnect, such as symmetrical communication 1510 and asymmetrical communication 1520 as shown in FIG. 15.

Therefore, for full-duplex communication (simultaneous transmit and receive), each node in the network (i.e. chip/chiplet or IC package) can have two antenna channels, one for transmitting data and one for receiving data, which can occur simultaneously if operating with sufficient frequency separation.

Optionally, a low power receiver channel can be implemented to detect traffic on either of the channels in the network. In such a network, a node would be identified as an Initiator to configure the network and start communication and the rest would identify as Targets that would receive the broadcasted wireless messages. Each node could be reconfigured to identify as either Initiator or Target role, based on its function to enable system flexibility.

In various aspects, a device-to-device communication system may be provided. The device-to-device communication system may include a first device and a second device. Each of the first device and the second device may include an antenna, a radio frequency frond-end circuit, and a baseband circuit. Each of the first device and the second device may be at least one of a chiplet or a package. The device-to-device communication system further may include a cover structure housing the first device and the second device. Each of the first device and the second device may be at least one of a chiplet or a package. The device-to-device communication system further may include a radio frequency signal interface wirelessly communicatively coupling the first device and the second device. The radio frequency signal interface may include the first antenna and the second antenna.

In various aspects, the device-to-device communication system further may include a carrier. The first device and the second device may be arranged on the (same) carrier. The carrier may be a printed circuit board. Alternatively, the carrier may include a semiconductor material. The semiconductor material may include silicon or gallium nitride, for example.

Each of the first device and the second device may be a package and the device-to-device communication system may be a package-to-package communication system. Alternatively, each of the first device and the second device may be a chiplet and the device-to-device communication system may be a chiplet-to-chiplet communication system.

The first antenna and the second antenna may be configured for RF signals having a carrier frequency below 10 GHz;

Each of the first device and the second device may be configured for full-duplex communication.

The first device and the second device may be stacked over each other.

The communication system may include a plurality of devices, the plurality of devices including the first device and the second device. The plurality of devices may be arranged in at least a first stack of devices and a second stack of devices adjacent to the first stack. The first device may be arranged in the first stack and the second device may be arranged in the second stack.

A conventional custom application specific integrated circuit (ASIC) is usually configured for various artificial intelligence (AI) loads that require flexible communication topologies between each node (i.e. fully connected, cube, hybrid mesh, etc.). Similar to a human brain, there are major benefits for having the neural nodes connected in 3 dimensions, e.g. being able to support more advanced neural networks, better performance, etc.

Although in transversal plane (xy-plane) communications can be routed planar inside a PCB using traces, to establish the communication links in the 3rd dimension (Z) involves some sort of the electrical connectors for wired communications. The connector physical size and routing layout rules pose a limitation on how many AI nodes can be packed inside a given volume when these nodes need to be connected in three dimensions. Furthermore, even for a simpler case of planar routing using PCB traces for X and Y package-to-package communication links have limitations since these systems require many hundreds to thousands of compute nodes. The complex power delivery needs make signal routing a challenge, necessitating increased PCB layer counts and thus cost.

Illustratively, conventional solutions focused on signal input/output (I/O) routing from the package second level interconnect (SLI), e.g. balls, lands, pins, to another package SLI using traces on the PCB and with and without connectors. A disadvantage of the wired solutions of the related art include that the wired solutions do not provide simple package-to-package communication links in the Z direction (vertical direction of the package). Usually, in such a case, a connector is required which can cause signal degradation and can also make mechanical and thermal solutions more challenging. For example, added connectors make the assembly of the system much more complicated and thus increases the overall system cost. In addition, the presence of the connectors creates additional obstructions to air flow and impacts thermal management of these nodes. Since the conventional solutions require physical connections, the conventional solutions cannot be easily changed afterwards for different network topologies between the nodes, e.g. from fully connected to mesh cube. Traces on the PCB in the related art makes scaling of the system challenging since the number of nodes is increased by the nodes. With an increase in number of nodes, the power delivery system becomes more complicated, and does not leave enough room for signal routing.

Thus, in various aspects, a single or multi-body antenna is provided to make a conformal antenna array that can provide wireless communication links in three dimensions, e.g. using organic package compatible manufacturing structure techniques. It is to be noted that the above-described exemplary device-to-device communication system can be implemented as a package-to-package communication system. However, the package-to-package communication system as described in the following may be implemented in a higher level architecture in various aspects, e.g. a board-to-board or rack unit-to-rack unit communication system. As such, the package-to-package communication system as described in the following is only exemplary for illustration. It is further noted that various described aspects can co-exist with traditional wire-based routing techniques to increase data bandwidth or to provide sideband communication channels.

Figure 16:
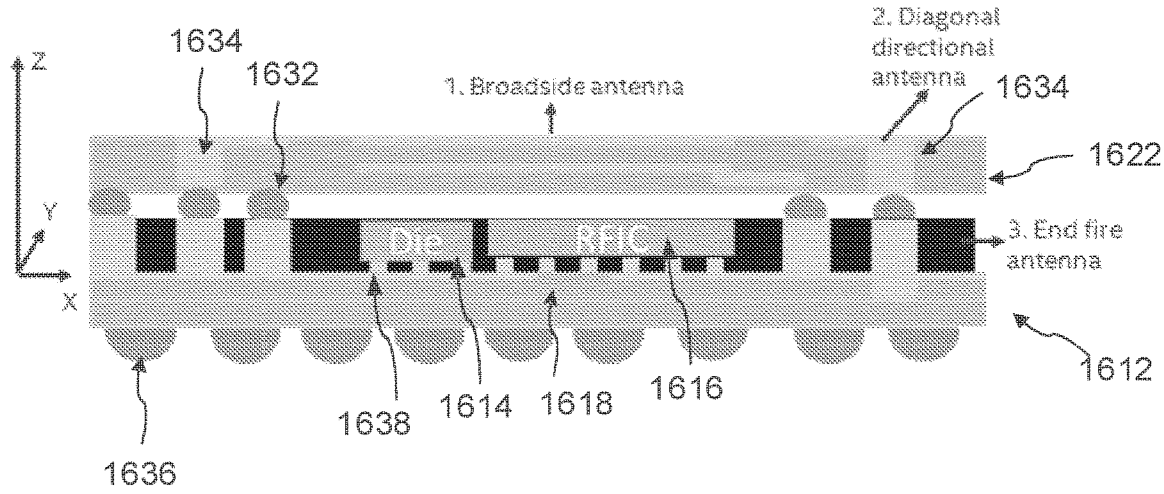
FIG. 16 exemplarily shows a cross-section of a package having three different antenna that cover three different angles.

FIG. 16 illustrates a cross-section of a package 1600 having three different antenna 1, 2, 3 that cover three different angles. A first antenna 1 may be a broadside antenna 1, a second antenna 2 may be a diagonal directional antenna 2, and a third antenna 3 may be an edge antenna 3 (also denoted as end-fire antenna). The antennas 1, 2, 3 of the package 1600 can be configured to create a radiation pattern for 3D package-to-package communications. This way, a package having a 3-D conformal antenna array may be provided. In FIG. 16, the package includes a package carrier 1612 and an antenna carrier 1622. One or more dice 1614, 1616 are arranged on the package carrier 1612. One or more antennas 1, 2, 3 are arranged on an antenna carrier 1622 or are integrated in the antenna carrier 1622. At the beginning of the manufacturing process, the antenna carrier 1622 is a carrier separate from the antenna carrier 1622.

In various aspects, one package 1600 includes one or more different dice 1614, 1616. By way of example, a compute die 1614 (illustrated in FIG. 16 as "die") and a radio frequency integrated circuit 1616 (RFIC) (also denoted as RF die) could be implemented as separate dice, and only the RFIC is connected to the antennas 1, 2, 3, (as shown in FIG. 16). Alternatively, the compute die 1614 and the RFIC 1616 may be integrated in one common package and may be mounted on the common package carrier 1612. Alternatively or in addition, there can be a different RFIC 1616 supporting the communication link for example for each communication link using one kind of antenna 1, 2, 3 of the plurality of antennas 1, 2, 3.

In various aspects, one or more antenna(s) 1, 2, 3 may be arranged on or integrated in the package carrier 1612. The at least one antenna 1, 2, 3 on or in the package carrier 1612 may be at least one of a broadside antenna 1, a diagonal directional antenna 2 or an edge antenna 3. In various aspects, the antenna of the package carrier 1612 may be an edge antenna 3 arranged off-center, e.g., at an edge of the package carrier 1612, as described in more detail below.

In various aspects, a multi-antenna devices may include multiple single feed antenna circuits. Each antenna circuit may be configured to operate within at least one of a distinct frequency range or angular distribution. For example, a first antenna circuit may operate within a low band (LB) frequency range (e.g., a 5 gigahertz (GHz) band), a second antenna circuit may operate within a high band (HB) frequency range (e.g., a 7 GHz band), and a third antenna circuit may operate within an ultra-high band (UHB) frequency range (e.g., a 10 GHz band). Alternatively or in addition, a first antenna circuit may operate within a broadside angular distribution from about −45° to about +45° to the normal of the package carrier, a second antenna circuit may operate within diagonal directional angular distribution between the normal of the package carrier 1612 and a direction perpendicular to the normal of the package carrier 1612, and a third antenna circuit may operate within an edge fire angular distribution in a range from about −45° to about +45° in a direction perpendicular to the normal of the package carrier 1612.

In other words, a package 1600 including a plurality of different antennas 1, 2, 3 is provided in various aspect. The plurality of antennas 1, 2, 3 may be manufactured with organic package processes. This way, a conformal antenna array can be provided for wireless package-to-package communications in 1, 2, or 3 dimensions. Because the package-to-package links are wireless, this makes the PCB layout process simpler and cheaper. In addition, wireless links can allow for dynamic network topology modifications to support different workloads. Furthermore, this approach reduces the need of using complex and expensive connectors to provide z-direction package-to-package communications.

The antenna carrier 1622 can be attached to the package carrier 1612 using, e.g., a ball grid array (BGA) 1632 or a solder-charge element, in various aspects. The one or more antenna(s) 1, 2, 3 of the antenna carrier 1622 can be coupled to the one or more dice 1614, 1616 on the package carrier 1612 using a via 1634, e.g. a TMV or a TSV. The one or more dice can be coupled using at least one (1638) of a BGA, a solder bump, or land arranged between a surface of the package carrier 1612 and the die 1614, 1616. The die 1612, 1614 may be coupled to the via coupling the die to an antenna (the via can also be denoted as antenna port) through a feed line 1618. The feed line 1618 may be embedded in the package carrier 1612. The package 1600 may be configured to be coupled to a board, e.g., using a BGA 1636.

Figure 17A:
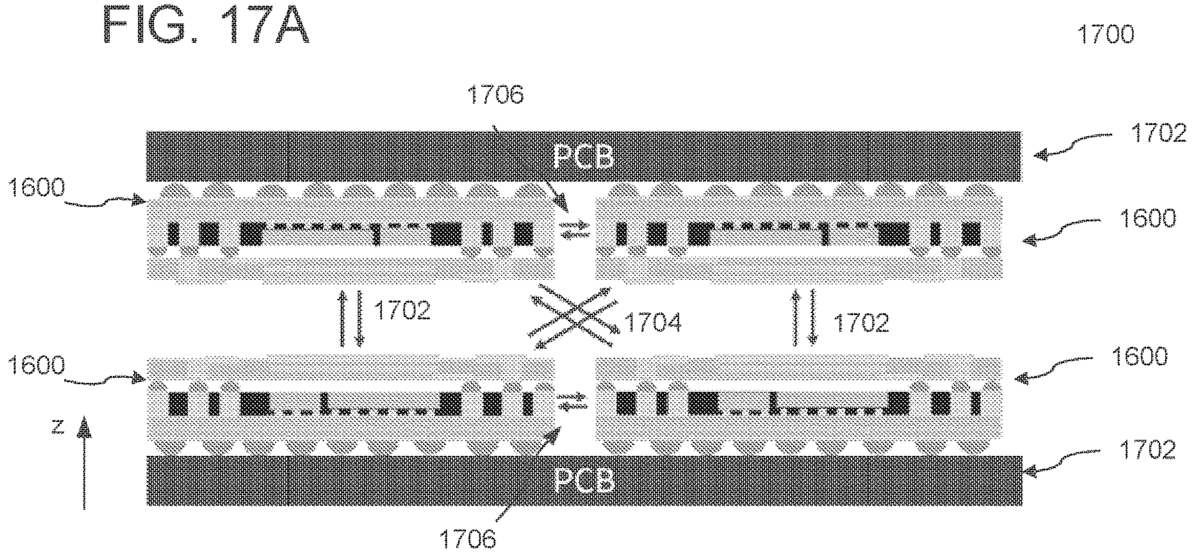
FIG. 17A and FIG. 17B exemplarily show views of package-to-package communications in three dimensions between packages arranged in 3 dimensions.
Figure 17B:
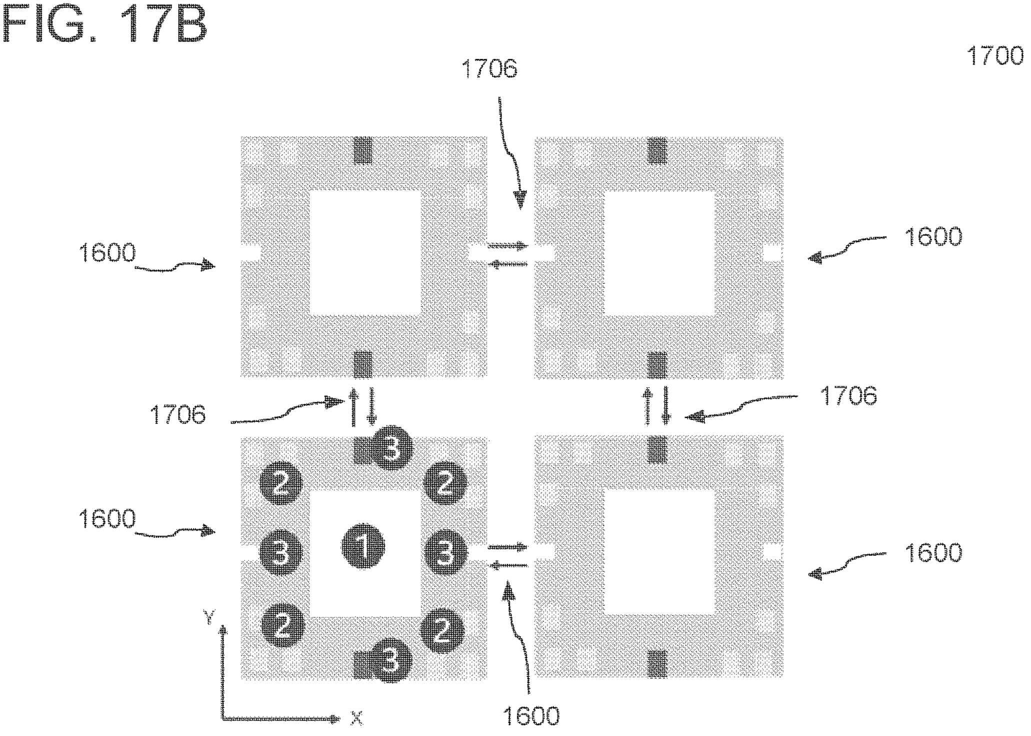

FIG. 17A shows a cross-sectional view and FIG. 17B shows a top view of package-to-package communication system 1700 in three dimensions between packages 1600 arranged in 3 dimensions (3-D). The packages 1600 may be configured according to a described aspect. As an example, each of the packages 1600 may include an antenna 1 normal directional to the package 1702, an antenna 2 diagonal directional to the package normal 1704, and an antenna 3 planar directional (90 degrees) to the package normal 1706.

At least a first package and a second package can be arrange on a common carrier 1702 (also denoted as board). Thus, the package-to-package communication system illustrated in FIG. 17A and FIG. 17B can also be denoted as board-to-board communication system 1700. However, the illustrated communication system 1700 may also be part of a rack unit-to-rack unit communication system including the package-to-package communication system, as an example.

In various aspects, each of the packages 1600 can have a plurality of antennas 1, 2, 3, This way, inter-package wireless communication links 1702, 1704, 1706 can be provided. In addition, packages 1600 can have antennas 1, 2, 3 on or in at least one of the package carriers 1612 or the antenna carrier 1622. A combination of package carrier 1612 and antenna carrier 1622 can be assembled into one package 1600 to form a package 1600 having different antennas with different stack-up. This way, more flexibility in floor planning is provided, as an example.

For example, to provide normal to package (z-direction) communication 1702, a broadside antenna 1 can be used. A broadside antenna can be configured as a patch coupler antenna in an antenna carrier 1622 (also denoted as interposer board). The broadside antenna 1 can be integrated into the package 1600 using standard package-on-package (POP) techniques. In various aspects, one or more broadside antenna(s) 1, e.g. tuned for various frequencies, can be arranged on the antenna carrier 1622. Thus, at least one of data bandwidth increase latency decrease can be enabled. A broadside antenna 1 can be tuned for different frequencies, for example, by at least one of controlling the antenna carrier 1622 stack up or the patch geometry of the broadside antenna 1.

In addition to the antenna 1, 2, 3 including metallic structures built into the antenna carrier 1622, the POP interconnects, e.g. as top side balls or copper pillars, can be part of the antennas 1, 2, 3. This way, antenna performance can be improved.

Figure 18:
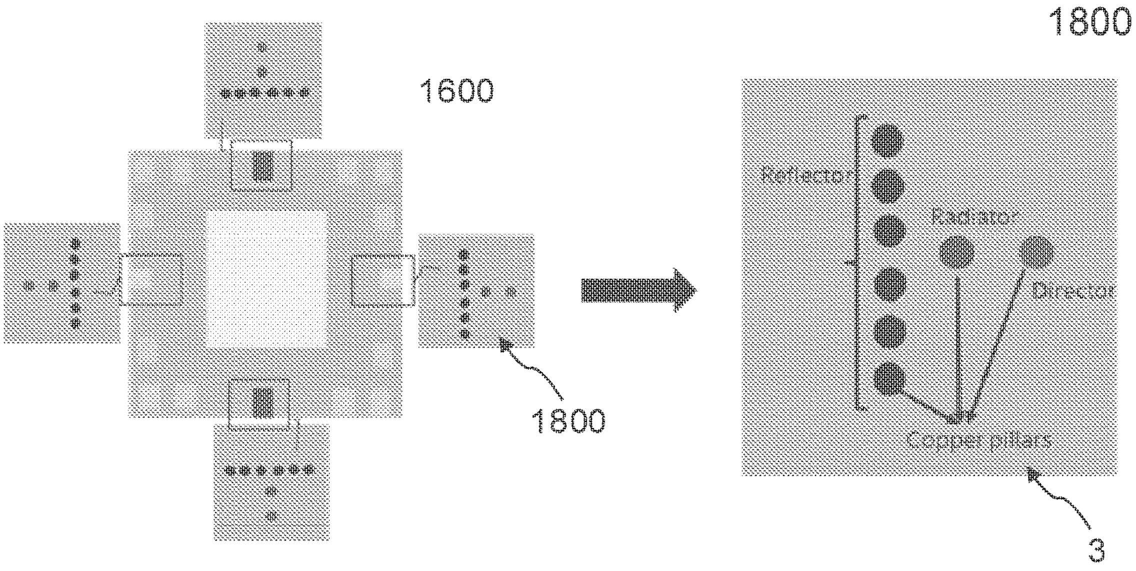
FIG. 18 exemplarily shows a top view of a package according to various aspects.

FIG. 18 illustrates a top view of a package 1600 according to various aspects including a schematic top view 1800 on an edge antenna 3, e.g., using copper pillars. In various aspects, the end-fire antenna 3 may be configured based on a Yagi-antenna concept or a Yagi-Uda antenna concept including a reflector and/or a director, as illustrated in FIG. 18. This way, a directional transversal plane (xy-plane) antenna can be provided. In various aspects, the end-fire antenna 3 may be realized in organic packages by leveraging POP level interconnects. By way of example, copper pillars can be arranged in a way to form at least one of the director or reflector of a Yagi- or Yagi-Uda antenna. The same or different interconnect in POP configuration, for example copper pillars, can be leveraged to form a radiator, a director and a reflector of a Yagi-Uda antenna, as illustrated on the right side of FIG. 18. However, this is described only by way of an illustrative example. The end-fire antenna 3 may also be formed by a tapered slot antenna, an antenna carrier-integrated waveguide antenna or a package carrier-integrated waveguide antenna etc.

In various aspects, a diagonal directional antenna 2 of a package may be configured as an inverted F-antenna (IFA) or a planar IFA (PIFA). This way, diagonal radiation patterns may be provided. Thus, diagonal package-to-package communications may be enabled.

In various aspects, a diagonal package-to-package communications may be enabled by a combination of an end-fire antenna 3 and a broadside antenna 1 in a phased array.

In various aspects, planar parts of at least one of an IFA antenna 2 or PIFA antenna 2 may be formed by using the metal planes in at least one of the antenna carrier 1622 or the package carrier 1612, illustrated in FIG. 16. The radiating parts of the IFA antenna 2 or PIFA antenna 2 may be formed by using POP interconnects, copper pillars, stacked TSVs 1634 in at least one of the antenna carrier 1622 or package carrier 1612. Alternatively or in addition, one or more holes may be formed in the antenna carrier 1622 to place a radiating antenna 2 after the antenna carrier 1622 is attached to the package carrier 1612.

In various aspects, the antenna carrier 1622 can be at least one of a PCB-based antenna carrier 1622 or an organic carrier board. The antenna carrier 1622 can enable a wider variety of antenna layouts and customization without suffering structure from the organic carrier manufacturing structure challenges. In addition, the antenna carrier 1622 can include one or more pieces. For example, the broadside antenna 1 can be located on a different piece of the antenna carrier 1622 than the diagonal antenna 2. This way, different stack-ups to form these antenna structures are enabled. In various aspects, a package 1600 including an antenna carrier

Figure 19:
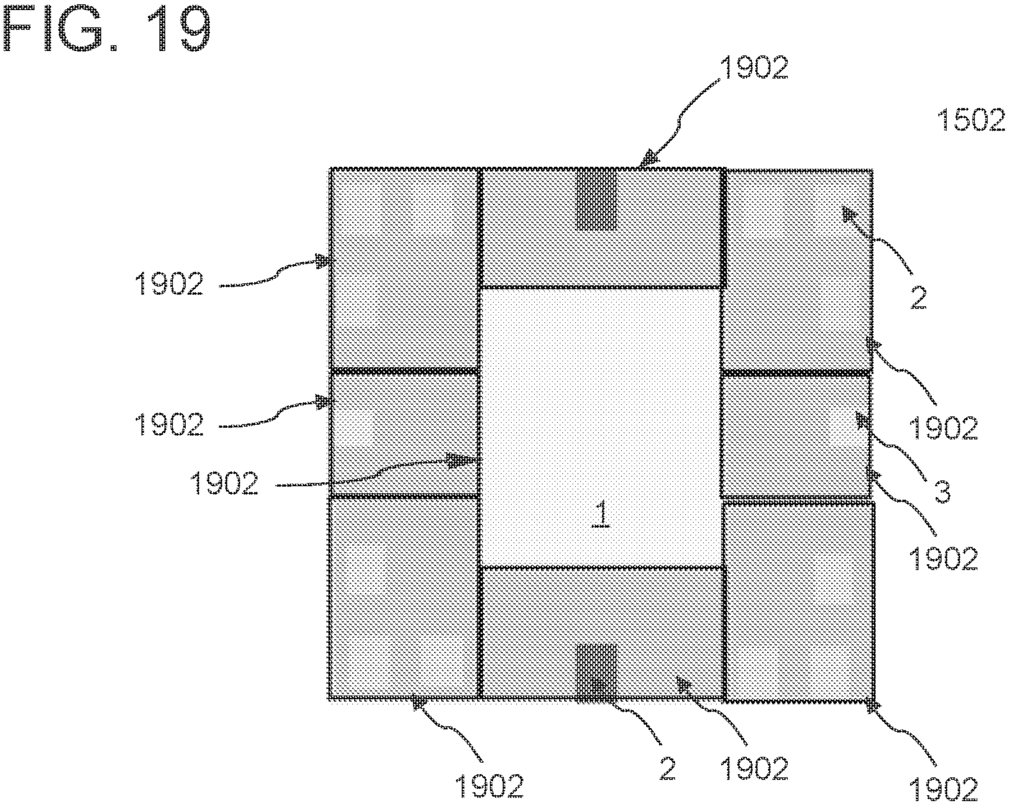
FIG. 19 exemplarily shows a top view of a package according to various aspects.

1622 having one or more antennas 1, 2, 3 can enable multiple package configurations for different antennas. For example, the broadside antenna 1 for adjacent packages can be configured to work at different frequencies to improve performance, for example, a better isolation between the z-direction wireless links. FIG. 19 illustrates a top view of a package 1600 according to various aspects including the antenna carrier 1622 made out of nine separate antenna sub-carriers 1902 (also denoted as pieces). Each of the antenna sub-carrier 1902 can include one or more of the antennas 1, 2, 3 of the package 1600. The antennas 1, 2, 3 of one antenna sub-carrier 1902 can be of the same type, e.g. only end-fire antennas 3, or antennas of different types, e.g. diagonal directional antennas 2 and end-fire antennas 3 on or in the same antenna sub-carrier 1902. This way, a standardized and modularized antenna (sub-) carrier(s) may be realized.

In various aspects, for applications in which a long radiating antenna is required, e.g. longer than what might be possible using POP level interconnects such as balls or copper pillars, holes in at least one of the antenna carrier 1622 or package carrier 1612 may enable to insert radiating components after mounting the antenna carrier 1622 on the package carrier 1612. For example, copper rods can be used as the radiating components of the IFA or PIFA of the package 1600.

In various aspects, the interspace between the antenna carrier 1622 and the package carrier 1612 may be filled with at least one of an underfill, a mold or an air. Alternatively or in addition, a dielectric material, such as a magneto-dielectric material, may at least partially fill the interspace or may be arranged near the radiating components to increase antenna gains and/or bandwidths.

If active integrated circuits and/or passive circuits, e.g. resistive, capacitive, and inductive components, are needed for proper antenna operation, these circuits can be arranged on the surface of the package carrier 1612 facing away from the antenna carrier 1622, or can be embedded in the package carrier 1612, or can be arranged in the interspace between the package carrier 1612 and the antenna carrier 1622, can be embedded in the antenna carrier 1622 or on a surface of the antenna carrier 1622 facing away from the package carrier 1612.

In various aspects, one or more antenna(s) 1, 2, 3 of the plurality of antennas of the package 1600 include a part of one or more redistribution layer(s) (RDL).

Figure 20:
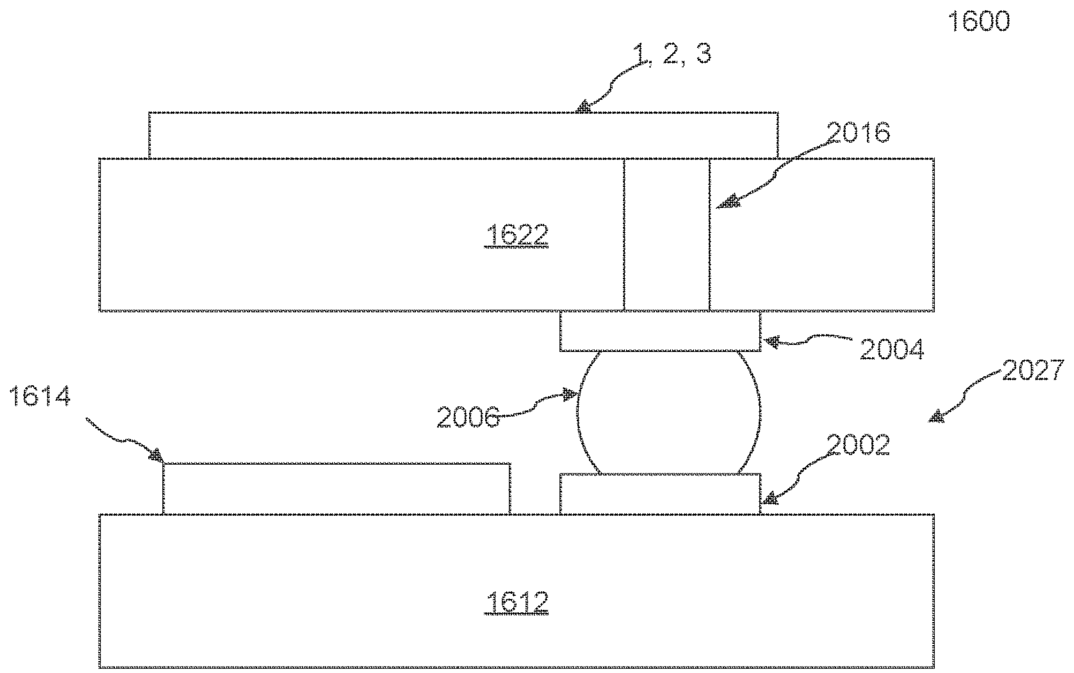
FIG. 20 exemplarily shows a schematic cross-section of a package according to various aspects.

FIG. 20 illustrates a schematic cross-section of the package 1600 according to various aspects. The package 1600 may include at least one die 1614 (also denoted as chip) on the package carrier 1612 (also denoted as first carrier). The chip 1614 may include one or more chiplets (also denoted as functional blocks). The first carrier 1612 includes a dielectric having two parallel main processing sides. An antenna feed port 2002 can be formed on a first of the two parallel main surfaces on the main processing sides of the dielectric of the first carrier 1612.

The package 1600 further includes one or more antennas 1, 2, 3 on or in a second carrier (also denoted as antenna carrier 1622). The one or more antennas 1, 2, 3 may be any one of the antennas 1, 2, 3 as described above. The second carrier 1622 includes two parallel main processing sides. A radio frequency feed port 2004 can be formed on a first of the two parallel main processing sides of the second carrier 1622. The one or more antennas 1, 2, 3 can be formed at a second main processing side of the two parallel main processing sides.

The first main processing side of the first carrier 1612 may be facing the first main processing side of the second carrier 1622.

The package 1600 further includes a radio frequency signal interface 2027. The radio frequency signal interface 2027 includes the antenna feed port 2002 coupled to the radio frequency feed port 2004. Illustratively, the radio frequency signal interface 2027 may be the communicative connection of the at least one die 1614 on the package carrier 1612 with at least one antenna 1, 2, 3 on the second carrier 1622.

At least one of the antenna feed port 2002 or the radio frequency feed port 2004 may include a ball grid array or a solder-charge element 2006. In other words, the radio frequency signal interface 2027 includes a ball grid array or a solder-charge element in various aspects.

The one or more antennas 1, 2, 3 may be coupled to the radio frequency feed port 2004 through a via 2016, e.g. a TSV or a TMV. The via 2016 may extend from the first main processing side of the second carrier 1622 to the second main processing side of the second carrier 1622.

At least one of the first carrier 1612 and second carrier 1622 may include a printed circuit board.

In various aspects, the one or more antennas 1, 2, 3 may be configured as a broadside antenna 1, as described above.

The first carrier 1612 may include a further antenna feed port and the second carrier 1622 may include a further radio frequency feed port formed on the first main processing side of the second carrier 1622 and a further antenna formed on a second main processing side of the second carrier 1622. A further radio frequency signal interface may include the further antenna feed port coupled to the further radio frequency feed port. The further antenna may have a different main radio frequency propagation direction than the antenna, as described above.

The antennas 1, 2, 3 may be connected through different line feeds with the antenna feed ports. Line feeds may be embedded in the first carrier 1612 (see FIG. 16).

The one or more antennas 1, 2, 3 may be configured as a directional antenna. The further antenna may be configured as a diagonal directional antenna 2.

The first carrier 1612 may further include a radio frequency integrated circuit RFIC 1616 on the first carrier 1612.

The chip 1614 may include a first side facing the first side of the first carrier 1612 and the first carrier 1612 may include a line feed coupled to the first side of the chip 2002. The line feed may be coupled the antenna feed port 2002.

In various aspects, the first carrier 1612 may include an integrated antenna connected to the chip 1614, the integrated antenna being integrated in the first carrier 1612. The integrated antenna may be configured as an end-fire antenna 3, as an example. The end-fire antenna 3 may be arranged at an edge of the first carrier 1612 (see FIG. 16).

In various aspects, the antenna may be configured as a directional antenna for radio frequency signals in a frequency range from about 5 GHz to about 25 GHz, e.g. having a frequency in the sub-10 GHz range.

In various aspects, a package-to-package planar system may include a first package 1600 and a second package 1600 each configured according to a described aspect. The first package 1600 and the second package 1600 may be communicatively coupled by at least one antenna 1, 2, 3 of each of the first package 1600 and the second package 1600. The first package 1600 and the second package 1600 may be arranged so that the second main processing sides of the second carriers 1622 of the first package 1600 and the second package 1600 may be arranged in at least one of facing each other, in a common plane or diagonally displaced, as illustrated in FIG. 17A and FIG. 17B. The first carrier 1612 and the second carrier 1622 of the first package 1600 and the second package 1600 may be arranged on a common carrier 1702 (illustrated in FIG. 17A) via the second main processing sides of the first carrier 1612 of the first package 1600 and the second package 1600.

Chip products using 3D heterogeneous integrating technologies are expected to provide performance improvement, cost efficiency, and layout flexibility, compared to monolithic integration. However, they face interconnect challenges, e.g. tangled wires and challenging to support point-to-multipoint communications.

Figure 21A:
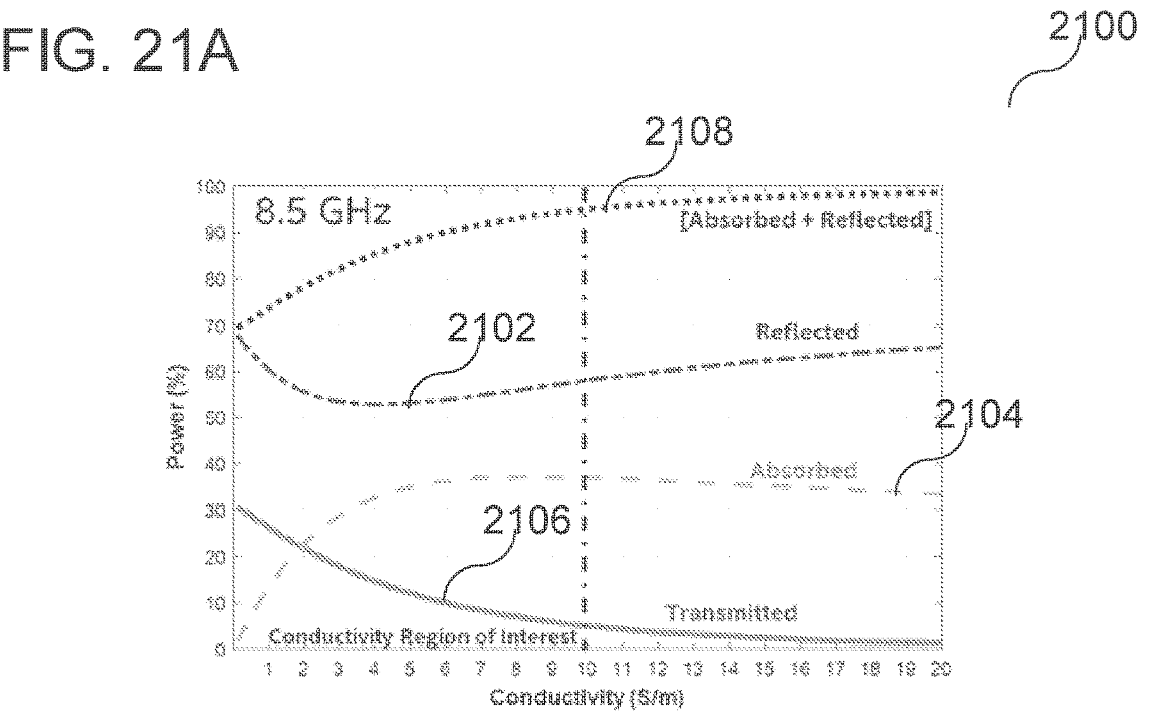
FIG. 21A exemplarily shows the percentage of reflected, absorbed and transmitted power versus silicon conductivity when plane waves are incident to a silicon slab with 2 mm thickness—for a plane wave having a frequency of 8.5 GHz.
Figure 21B:
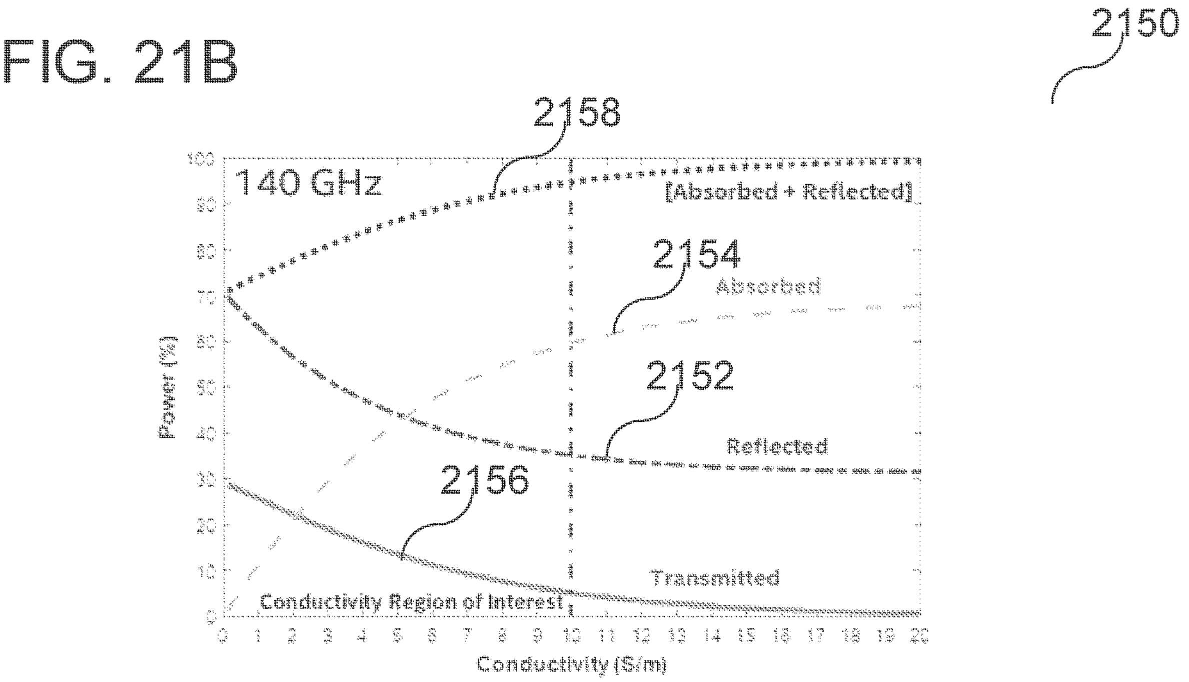
FIG. 21B exemplarily shows the percentage of reflected, absorbed and transmitted power versus silicon conductivity when plane waves are incident to a silicon slab with 2 mm thickness—for a plane wave having a frequency of 140 GHz.

Further, it is extremely challenging for electromagnetic waves to penetrate silicon dice unless the silicon conductivity is low (<1 S/m). FIG. 21A and FIG. 21B depict diagrams 2100, 2150 illustrating the percentage of reflected power (first characteristic 2102, 2152), absorbed power (second characteristic 2104, 2154), and transmitted power (third characteristic 2106, 2156) and absorbed power plus reflected power (fourth characteristic 2108, 2158) versus silicon conductivity when plane waves are incident to a silicon slab with 2 mm thickness—for a plane wave having a frequency of 8.5 GHz (FIG. 21A) and for a plane wave having a frequency of 140 GHz (FIG. 21B).

However, many silicon integrated circuit technologies use a higher conductivity than 1 S/m. By way of example, using silicon having a higher conductivity, silicon acts like a reflector at sub-10-GHz range (FIG. 21A) while it acts like an absorber at sub THz range (FIG. 21B) for a given thickness of silicon in terms of channel perspectives. Thus, from an antenna perspective, this implicates a narrow-bandwidth antenna for sub-10-GHz range and inefficient antenna for sub-THz range if a silicon die is used as an antenna carrier and, hence, maximum throughput and communication range and angular coverage is limited by silicon.

Further, wireline interconnects of the related art, such as silicon interposers and embedded multi-die interconnect bridge (EMIB) do not offer flexible chiplet topologies or broadcastable, point-to-multipoint data communication system.

Further, conventional wireless point-to-point links via silicon antennas, that do not consider silicon conductivity to improve antenna radiation performance and use micro-bump antennas, experience poor communication link response and narrow operational bandwidth, resulting in low throughput.

Hence, in various aspects, leveraging "dummy" silicon dice is used to address the wireless chip-to-chip antenna challenges using high conductivity silicon (>1 S/m). In other words, the wireless communication system according to various aspects provide performance improvement, cost efficiency, and layout flexibility compared to a monolithic integration. Heterogeneous chiplets with different sizes and profiles are used. Thus, in addition, "dummy" silicon dice may further be used to meet mechanical and thermal requirements.

Thus, in various aspects, the dummy silicon dice are facilitated as a silicon antenna carrier for in-package WC2C to leverage communications by creating a radiating structure on the dummy silicon die surface and/or creating a through-silicone-via (TSV) antenna structure inside a dummy silicon die or silicon-based package.

Alternatively, in various aspects, a dummy silicon itself may be driven as a dielectric antenna. The conductivity of the antenna silicon (also denoted as dummy silicon) may be different from other silicon with circuits in order to improve antenna radiation efficiency.

This way, narrow bandwidth and poor link performance issues of WC2C antennas of the related art can be overcome. Alternatively or in addition, broadcastable, point-to-multipoint data communication systems are enabled. Alternatively or in addition, excessive complexity and topological limitations of wired interconnect solutions of the related art are addressed. Alternatively or in addition, flexible floor planning of 3D-integrated products to alleviate thermal/mechanical constraints are addressed and time-to-market is reduced. Alternatively or in addition, cost and latency may be reduced. Alternatively or in addition, antenna footprint space on higher-technology chiplets is not taken. Alternatively or in addition, various layout rules that are imposed on higher-technology chiplets are not implied.

Figure 22A:
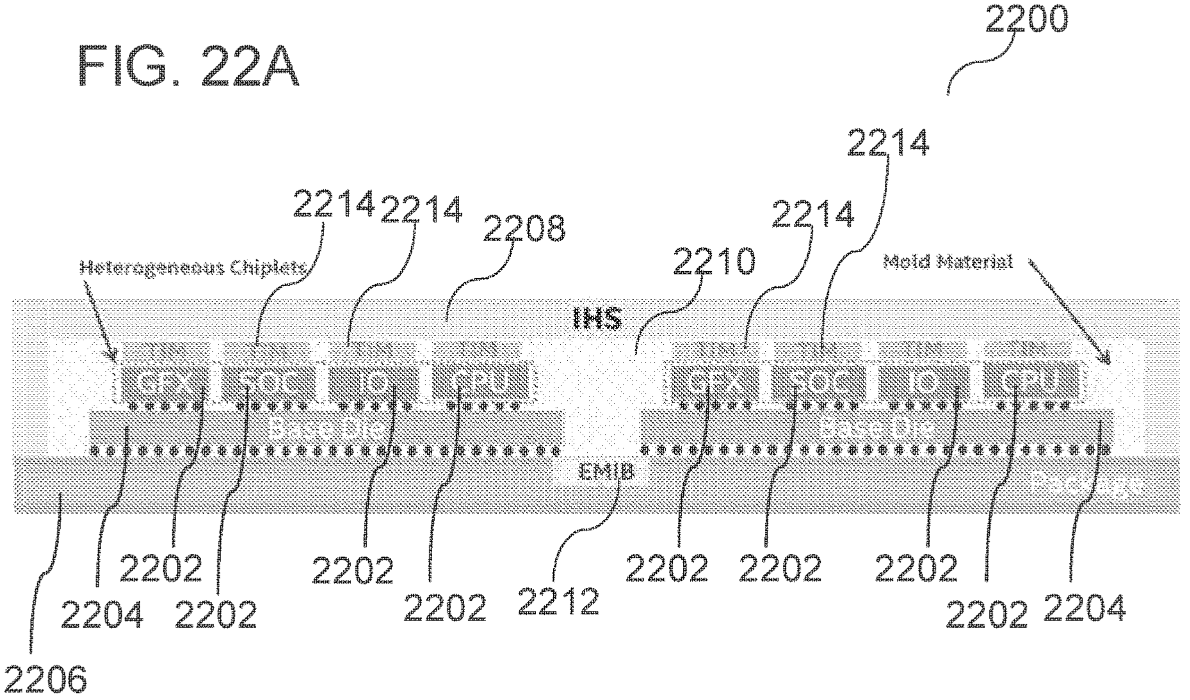
FIG. 22A and FIG. 22B exemplarily show views of an example heterogeneous array of chiplets on a base die enclosed or encapsulated by a common integrated-head-spreader (IHS) according to various aspects.
Figure 22B:
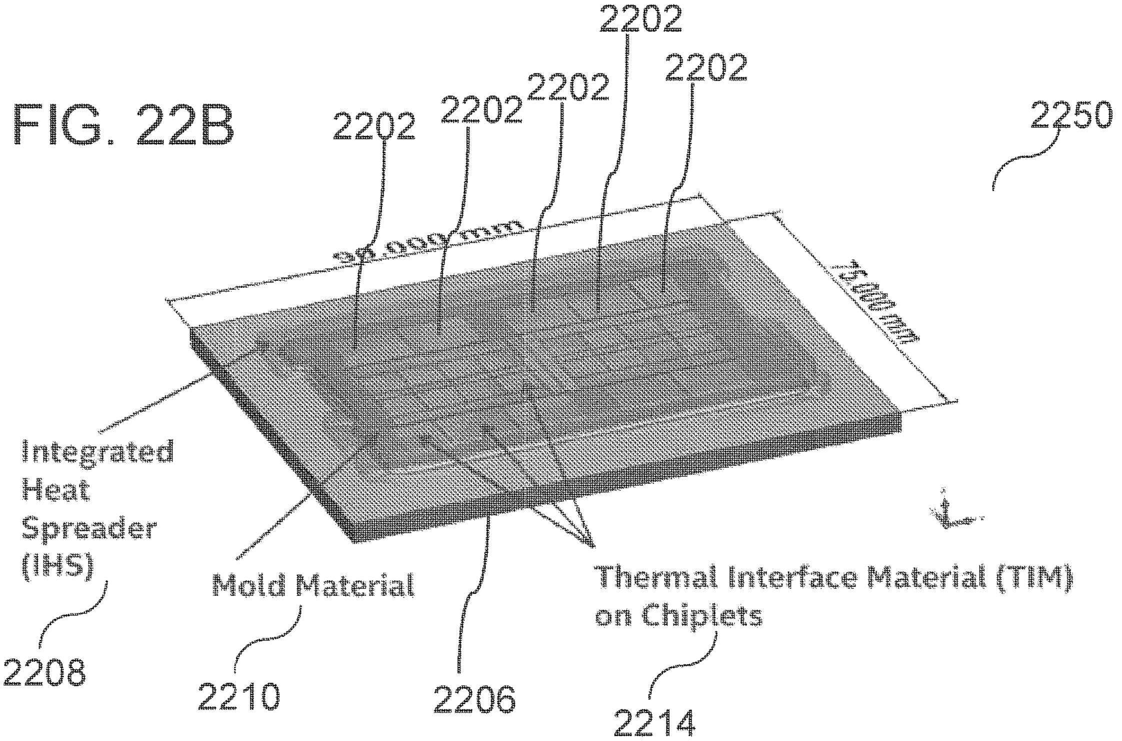

FIG. 22A and FIG. 22B depict a cross-sectional view 2200 (FIG. 22A) and a top view 2250 (FIG. 22B) of a geometry of an exemplary heterogeneous array of chiplets 2202 on a base die 2204 (also denoted as package carrier) arranged on another carrier 2206 (in FIG. 22A denoted as package, also denoted as board) and are enclosed or encapsulated by mold material 2210 and further covered by a common integrated-head-spreader (IHS) 2208. FIG. 22A illustrates a cross-sectional view of two groups of heterogeneous chiplets 2202 that are connected through embedded multi-die interconnect bridge (EMIB) 2212 and FIG. 22B illustrates a perspective view of heterogeneous chiplets 2202 under the integrated-heat-spreader (IHS) 2208. Thermal interface materials (TIM) 2214 may be inserted between the chiplets 2202 and IHS 2208 in order to enhance thermal coupling between them. However, TIM 2214 is often optimized for maximum thermal coupling between chiplets 2202 and IHS 2208. Arrays of heterogeneous chiplets 2202 may be interconnected through silicon interposers and EMIB 2212. Empty area between the IHS 2208 and chip package may be filled with mold material 2210.

Potential channels, e.g. as waveguide structure for radio frequency signals, can be considered for in-package or package-to-package wireless chiplet-to chiplet or chip-to-chip communications, as an example, in at least one of a package channel, a silicon channel, a TIM channel, or a mold channel.

A silicon channel may demand low-conductivity silicon for wireless signals to penetrate the silicon carrier as illustrated in FIG. 21A and FIG. 21B. Silicon antennas may suffer from high reflections at sub-10-GHz range and result in a narrow impedance bandwidth and low throughputs when high-conductive silicon (>>1 S/m) is used. However, high-conductivity silicon dice are e.g. provided for low power consumption for integrated circuits on silicon. On the other hand, high conductivity silicon can suffer from low radiation efficiency (<−10 dB) at sub-THz range, which can lead to significantly reduced communication range and can prevent point-to-multi-point communication capability.

In various aspects, the mold channel between the silicon package carrier 1612 and the IHS 2208 may act as a waveguide structure for RF signals. The cut-off frequency of the mold channel may be in the mmW band. The mold channel may be used to address various control-plane and data-plane communications in wireless chip-to-chip communications in various aspects.

Figure 23:
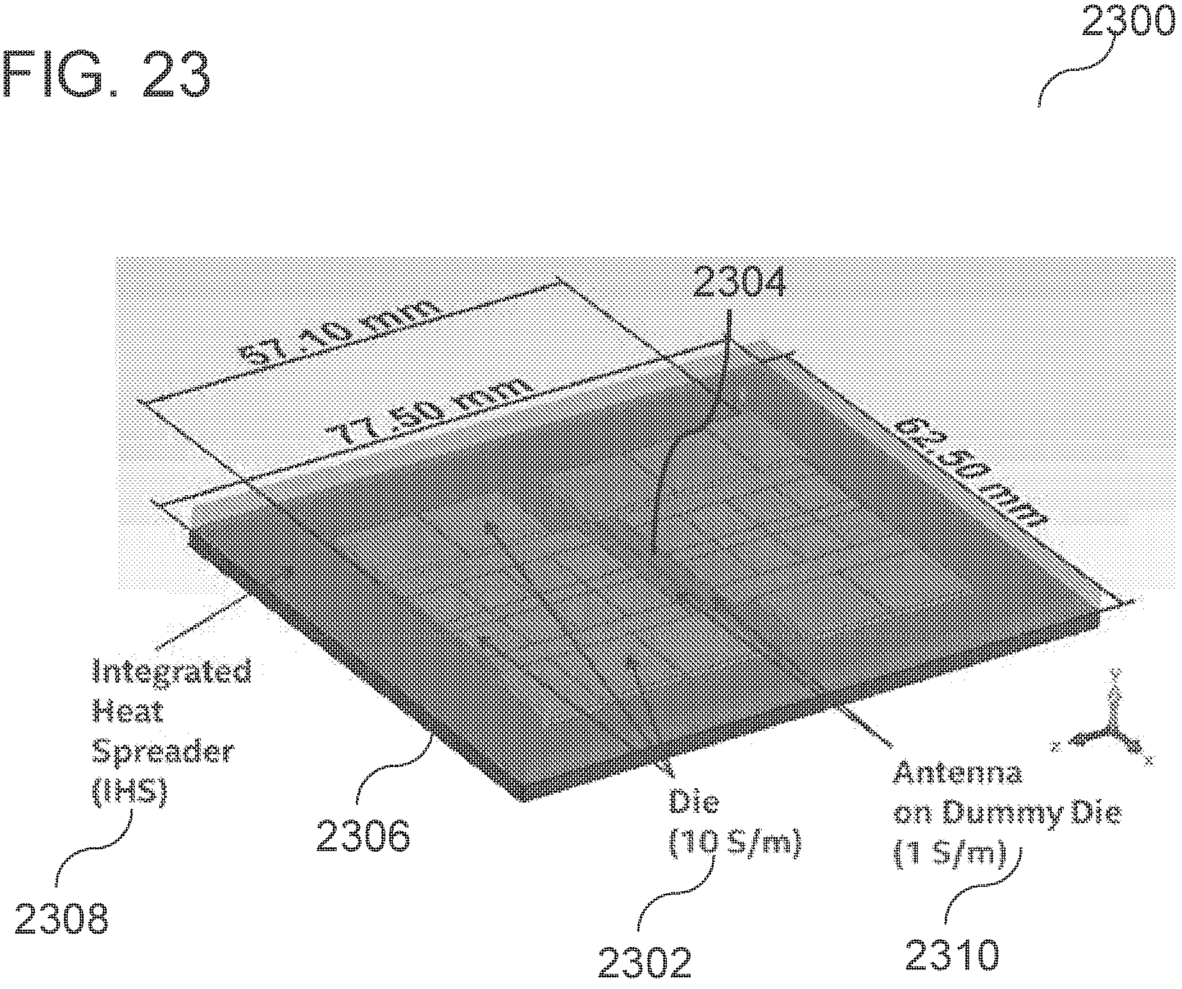
FIG. 23 exemplarily shows an example of a WC2C communication system according to various aspects.

FIG. 23 illustrates an example WC2C communication system 2300 according to various aspects including heterogeneous chiplets mixed with high-conductivity (10 S/m) dice 2302 and low-conductivity dummy dice (1 S/m) 2304 on top of a package 2306 (also denoted as package carrier) (10 S/m). Here, horizontally-polarized, folded dipole antennas 2310 may be provided to bump up the radiation resistance by a factor of four and to leverage the low-profile nature of the package. These antenna structures are located between a dummy die 2304 and the package 2306. Although the chiplets are enclosed by a metallic IHS 2308 and the package carrier, cavity resonances are minor due to the low Q nature of the highly-conductive silicon.

The area of base die is larger than or equal area of sum of heterogeneous dies 2302, 2304, but may be is smaller than area of package 2306. The base die may be made from monolithic silicon and may be located between heterogenous dies/chiplets and package.

Figure 24:
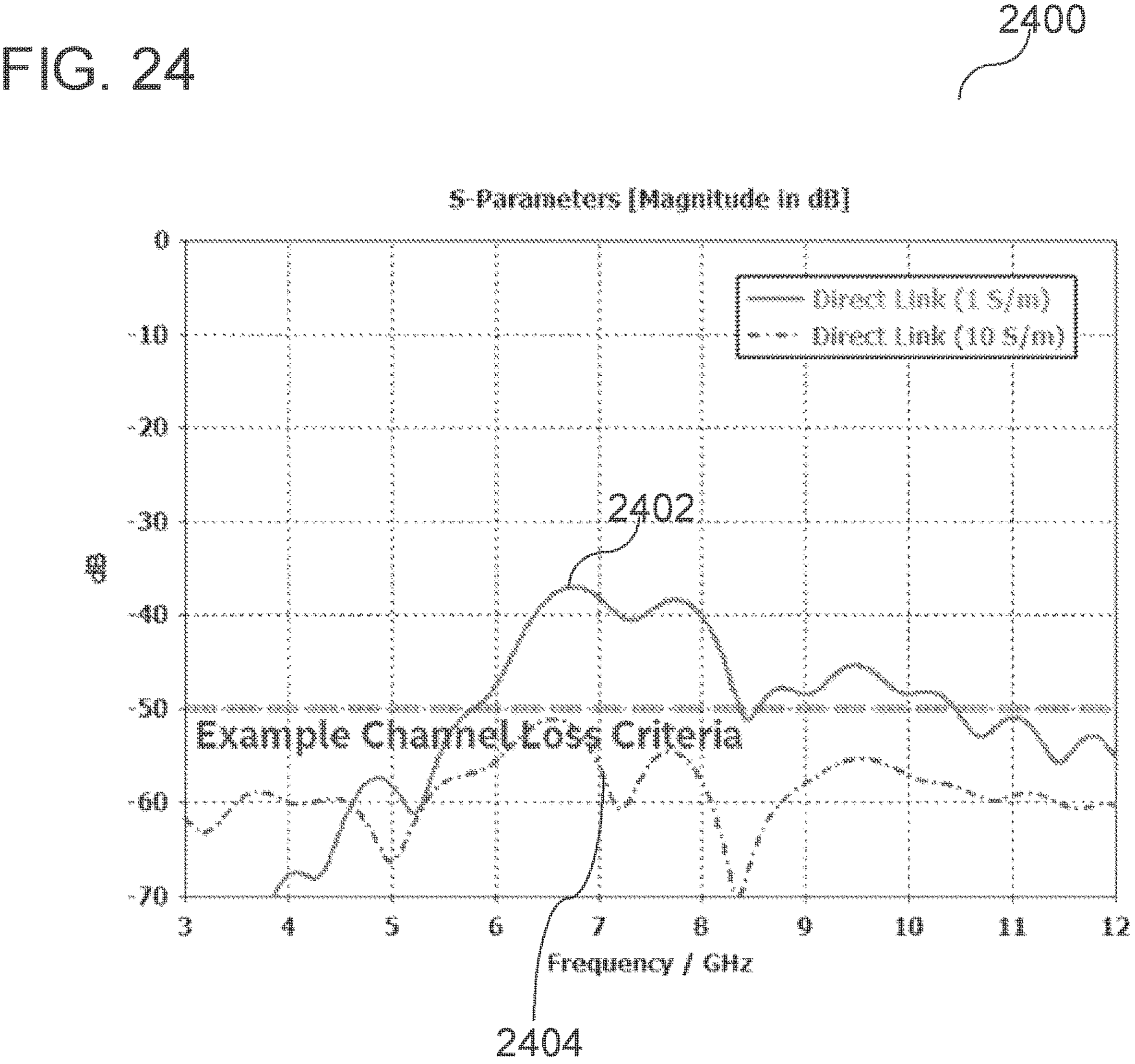
FIG. 24 exemplarily shows a direct link performance comparison of a communication system according to various aspects.

FIG. 24 shows a diagram 2400 illustrating a direct link performance comparison between a package having only 10 S/m dice (dashed line 2404) and a package having dice of mixed conductivity (solid line 2402), e.g. 1 S/m for dummy die 2300 and 10 S/m for other dice. Full-wave simulation results in FIG. 24 indicate that the direct link performance with dummy die 2304 with 1 S/m conductivity outperforms the other case (all dice have 10 S/m conductivity) by 10+dB difference and the dummy die 2304 offers a 2 GHz transmission bandwidth. Thus, antennas 2310 on the dummy die 2304 with low conductivity 1 S/m) can extend the communication range and, in addition, may increase layout flexibility. Layout flexibility may be increased since no additional constrains from various layout rules that are imposed on higher-technology chiplets are applied. In various aspects, the antennas 2310 on dummy die 2304 with low electrical conductivity can be scaled to sub-THz or higher frequencies.

Figure 25:
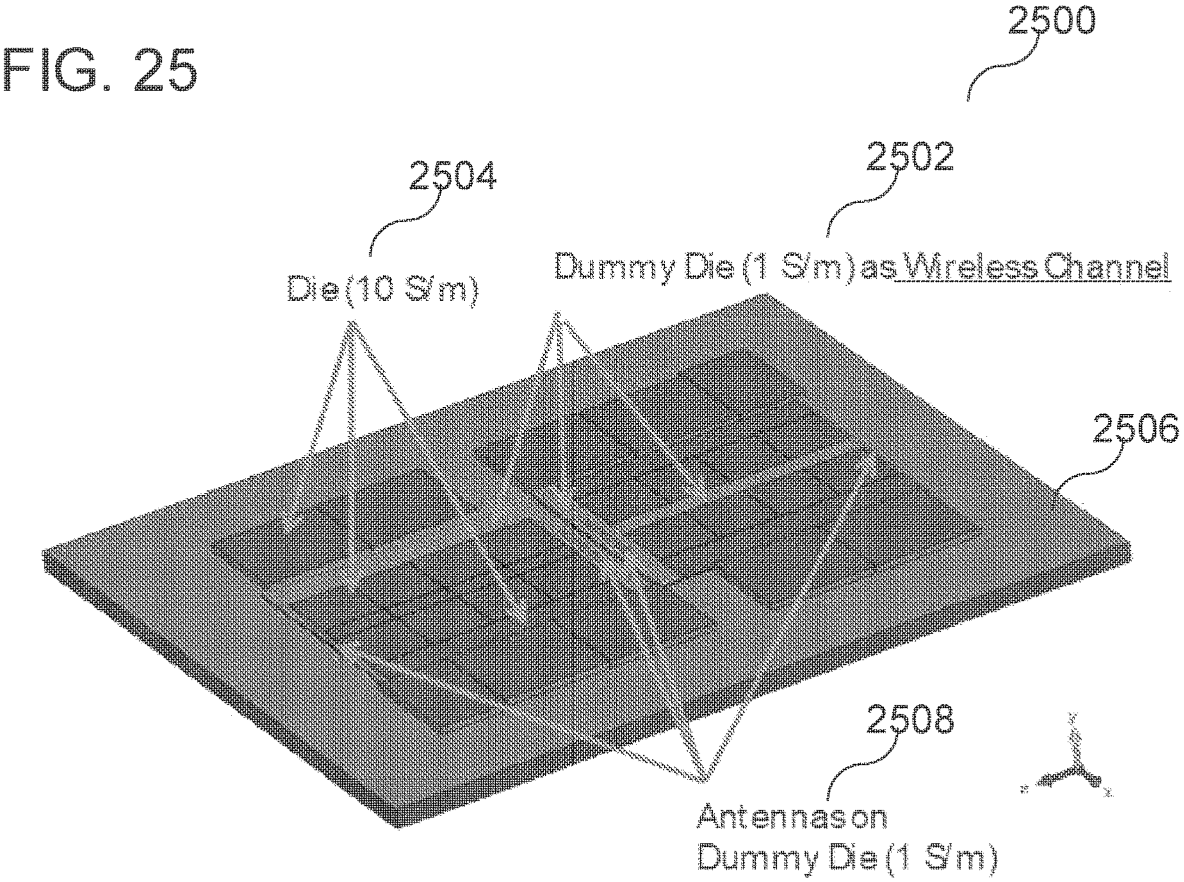
FIG. 25 exemplarily shows an example wireless channel for point-to-multipoint communications according to various aspects.

FIG. 25 illustrates communication system 2500 providing an example wireless channel for point-to-multipoint communications by leveraging low-conductivity dummy dice 2502 and high-conductivity (10 S/m) dice 2504 on top of a package 2506. The area of base die is larger than or equal area of sum of heterogeneous dies 2502, 2504, but may be is smaller than area of package 2506. The base die may be made from monolithic silicon and may be located between heterogenous dies/chiplets and package 2506.

Furthermore, FIG. 25 shows antennas 2508 located on low-conductivity dummy dice 2502. The silicon dummy dice 2502 can also be used for creating guided wireless channels as illustrated in FIG. 25. The dummy silicon channel can be combined with the package channel, the TIM channel, and the mold channel in various WC2C communication system. Although FIG. 25 illustrates a 2-D example, the communication system 2500 using a dummy die 2502 can be easily scaled to 2.5-D integration communication systems and 3-D integration communication systems.

In other words, in various aspects, dummy silicon 2502 as a silicon antenna 2508 carrier for in-package WC2C may leverage communications at least by one of creating radiating structure on the silicon die surface or creating a through-silicone-via antenna structure inside the dummy die 2502. Alternatively, the dummy silicon 2502 itself can also be driven as a dielectric antenna 2508. This way, sophisticated antenna structures may be created to enhance antenna bandwidth and radiation performance when through-mold-via technologies are used together. The conductivity of the antenna 2508 silicon may be different from other silicon with circuits in order to improve radiation efficiency of the silicon antenna 2508. The dummy die 2502 with lower conductivity may also be used for creating wireless channels.

Figure 26:
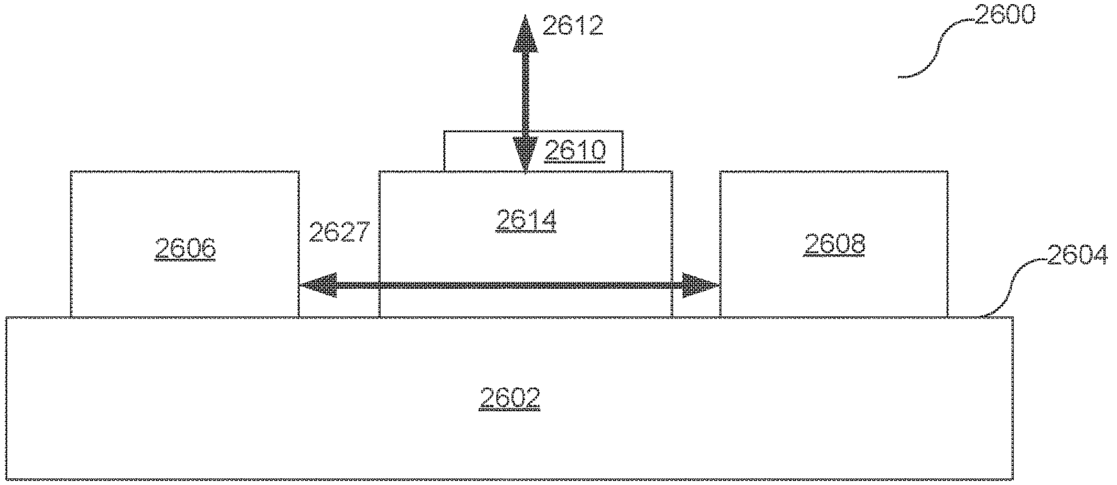
FIG. 26 exemplarily shows a schematic cross-section of a package according to various aspects.

FIG. 26 illustrates a schematic cross-section of a package 2600 according to various aspects. The package 2600 may include a package carrier 2602 having a plane surface 2604. At least a first die 2606 and a second die 2608 may be arranged on the plane surface 2604 of the package carrier 2602. At least one dummy die structure 2614 (also denoted as dummy die) may be arranged on the plane surface 2604 of the package carrier 2602. The first die 2606 and the second die 2608 may be wirelessly coupled via a radio frequency signal interface 2627. The radio frequency signal interface may include the dummy die structure 2614.

The first die 2606 and the second die 2608 may be arranged on a same side of the package carrier 2602.

In various aspects, a base die may be arranged between the dies 2606, 2614, 2608 and the package carrier 2602.

The dummy die structure 2614 may be configured as a radio frequency waveguide structure to guide radio frequency signals between the first die 2606 and the second die 2608.

The dummy die structure 2614 may have a conductivity of about 1 S/m or less.

The dummy die structure 2614 may be configured as a radio frequency reflector for the RF signal to be transmitted through the radio frequency signal interface.

In various aspects, at least one antenna 2610 may be arranged on the at least one dummy die structure 2614. Alternatively or in addition, the dummy die structure 2614 may be configured as a package-input-output interface (e.g. as an antenna) of the package 2600.

In various aspects, the at least one antenna 2610 may be arranged (vertically) between the dummy die structure 2614 and the package carrier 2602, between the dummy die structure 2614 and a base die (not illustrated), between a base die (not illustrated) and the package carrier 2602, or may be exposed on the dummy die structure 2614 (illustrated in FIG. 26).

In various aspects, the radio frequency signal interface 2627 may be an in-package radio frequency signal interface.

In various aspects, the package carrier 2602 may include a semiconductor material. As an example, the semiconductor material may include or be a silicon material. In various aspects, the package carrier may be or may include the base die.

The dummy die structure 2614 may include or be silicon.

Usually, planar antennas on a carrier, such as a patch antenna, a PIFA, a planar dipole, and a slot antenna are used in wireless communication such as cell phone, wireless mouse, and wireless display. One of the biggest challenges of such a planar antenna is that it take a lot of space on a package PCB. By way of example, it can be very difficult to scale when multiple of planar antennas are required to cover a wide angular communication range. In addition, planar antennas may not work well with the presence of a package ground plane (also denoted as package ground plane or package board ground plane). Thus, wired interconnections among packages can impose significant challenges on interconnection count scalability. When the interconnection counts increases, the package size must grow to meet the routing demands for any additional interconnection, and hence results in high routing complexity, high crosstalk, high latency, and high cost directly. In addition, in wired solutions of the related art, point-to-multipoint communications without "tangled" wires may not be possible.

Figure 27:
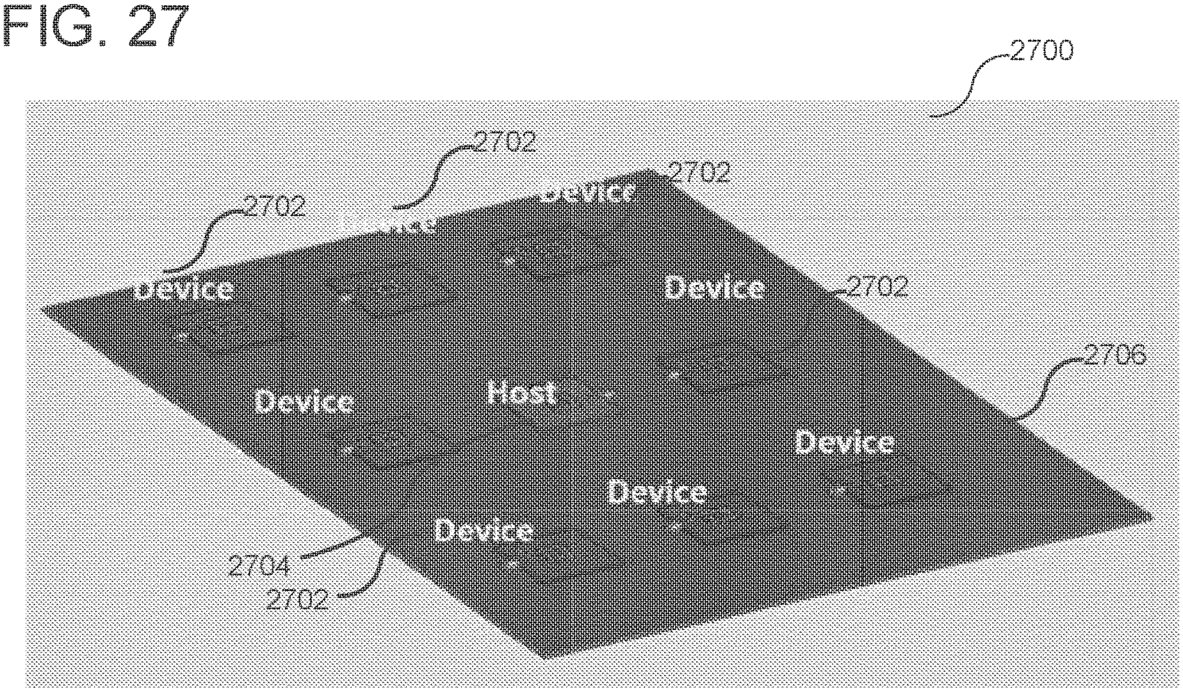
FIG. 27 exemplarily shows a package-to-package wireless communication system according to various aspects.

FIG. 27 illustrates a package-to-package wireless communication system 2700 according to various aspects. Wireless interconnections among packages 2702, 2704 offer the flexibility such as multi-drop and broadcasting as illustrated in FIG. 27, wherein one host 2704 (also denoted as first package) wirelessly sends signals to eight other devices 2702 (also denoted as second package to ninth package) arranged on the same carrier 2706 (also denoted as board) through multi-drop wireless connections (also denoted as wireless links). Hence, physical interconnections can be drastically reduced. This way, some of the challenges that wired interconnection face may be overcome.

Figure 28:
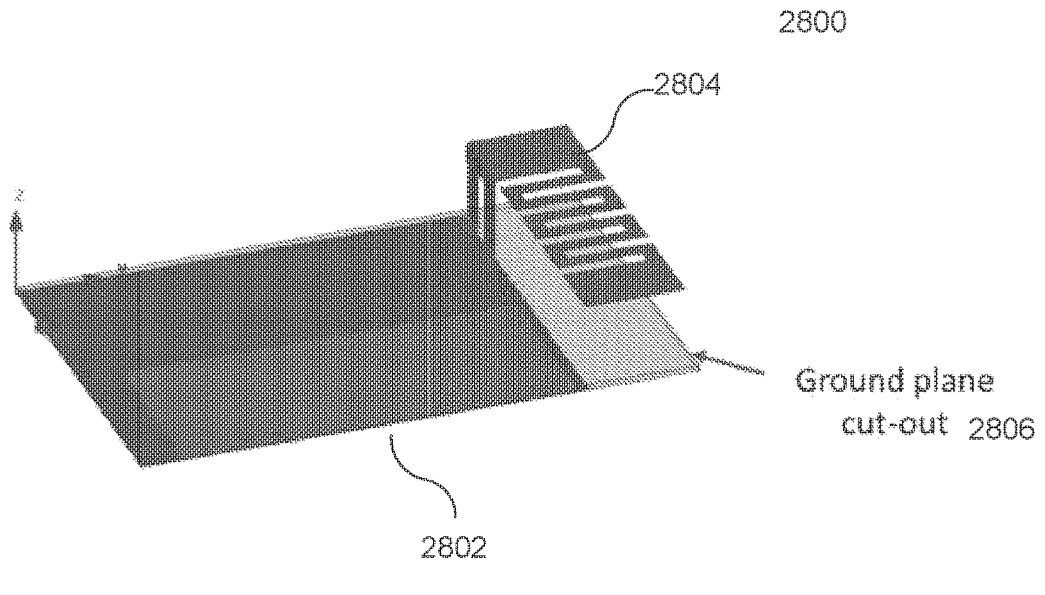
FIG. 28 exemplarily shows a planar antenna on a package.

However, a planar antenna 2804 of a package 2800 such as the one shown in FIG. 28 has a dominant horizontal polarization. The presence of a ground plane 2802 causes the image currents that cancels out the current on antenna for far field radiation. To work around, a ground plane cut-out 2806 is required as indicated in FIG. 28. In a planar inverted-F antenna (PIFA) with ground plane cut-outs on the package carrier of the related art causes a large footprint on the package, narrow band and low radiation efficiency and limited communication distance due to image current cancellation caused by board ground plane 2802.

For various applications, the planar antenna 2804 may not be ideal for package-to-package wireless communication. By way of example, the planar antenna 2804 can often take a lot of space on a package carrier that may be already overcrowded. Hence, required ground plane cut-outs in the related art may even further complicate carrier trace routing.

Figures 29A, 29B, 29C, 29D:
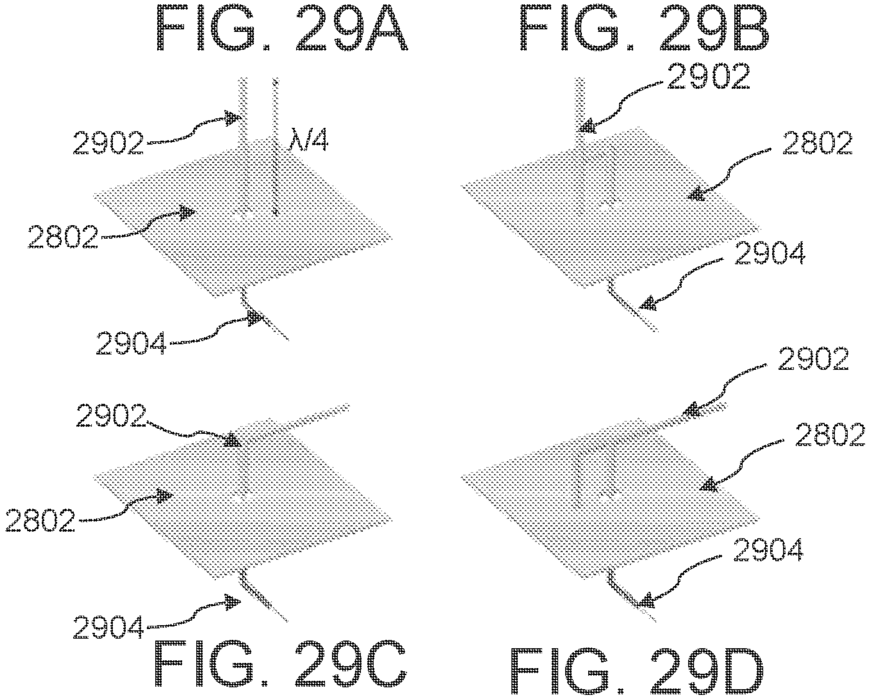
FIG. 29A to FIG. 29D exemplarily show conventions for vertically polarized antennas.

FIG. 29A to FIG. 29D depict a convention for vertically polarized antennas illustrating a ground plane 2802, an antenna feed 2904 and an antenna 2902 (also denoted as radiating part). Illustratively, due to the presence of package board ground plane 2802, e.g. a vertically polarized antenna, a wider ground plane is presented in the antenna layout and the antenna is often center located with respect to the ground plane. FIG. 29A and FIG. 29B only support vertical polarization, FIG. 29C and FIG. 29D support both horizontal and vertical polarization, but the vertical polarization dominantly contributes to the far field radiation. For a package-to-package wireless communication, the antenna layouts shown in FIG. 29A to FIG. 29D may be impractical since they have a large size, and, in addition, they usually have a narrow band.

Thus, in various aspects, one or more edges of the package or package carrier can be used to form a dual loop antenna as illustrated in FIG. 30A to FIG. 32. The dual loop antenna according to various aspects enables at least one of a horizontal polarization or a vertical polarization for near field radiation, or vertical polarization for far field radiation. Thus, cost of package real estate may be minimized. Furthermore, carrier embedded lumped elements may be utilized in various aspects to extend the operational bandwidth of the package. In addition, the size of antenna may be reduced while maintaining radiation efficiency.

Figure 30A:
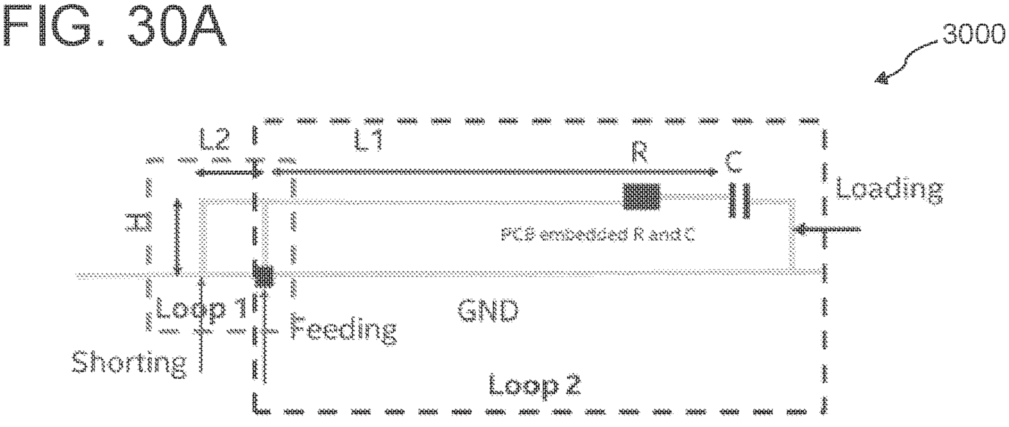
FIG. 30A to FIG. 30C exemplarily show a package edge radiated dual loop antenna according to various aspects.
Figure 30B:
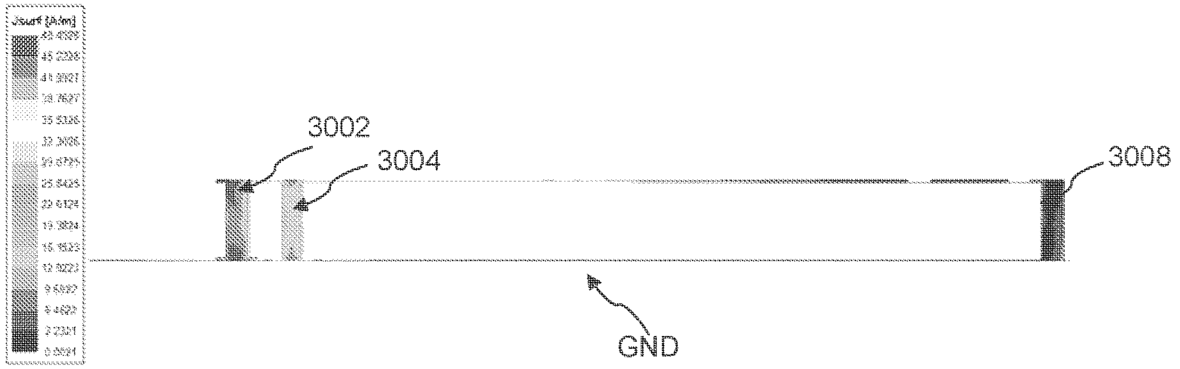
Figure 30C:
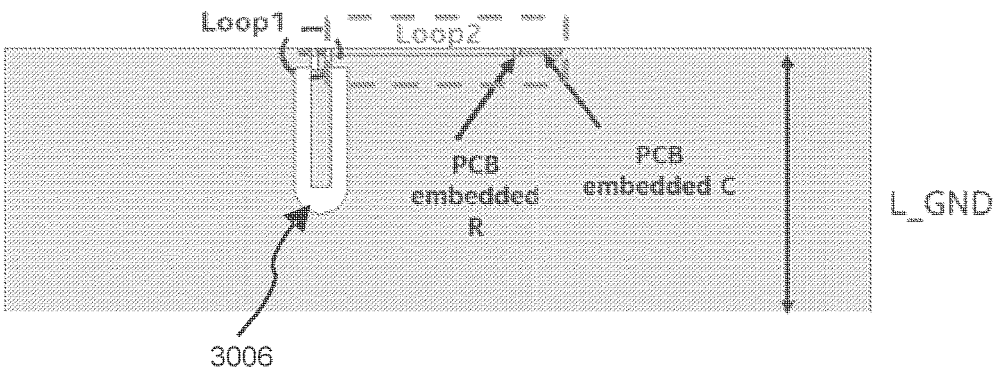

FIG. 30A, FIG. 30 and FIG. 30C illustrate a package edge radiated dual loop antenna 3000. FIG. 30A illustrates an antenna according to various aspects, FIG. 30B illustrates a corresponding antenna current distribution and FIG. 30C illustrates an antenna top-down view.

The carrier is illustrated as ground plane GND in FIG. 30A and FIG. 30B. Moreover, FIG. 30A may be only a representation of a side view of a real package edge radiated dual loop antenna layout. In this aspect, the package edge antenna 3000 can include two loops denoted as “Loop1” and “Loop2”. The first loop labeled as “Loop 1” can be formed by two vertical pins 3002, 3004 denoted as “Shorting” pin 3002 and “Feeding” pin 3004, an edge of a strip of length L2 above a side ground plane, and an edge of the side ground plane. The second loop denoted as “Loop 2” may be formed by the “Feeding” pin 3004, the edge of a strip of length L1, the edge of the side ground plane, and the “Loading” pin 3008.

FIG. 30B illustrates an antenna surface current density plot of the structure of FIG. 30A. FIG. 30B illustrates that “Loop1” may predominantly support vertical polarization and “Loop2” may be predominantly support horizontal polarization. Both, horizontal polarization and vertical polarization, may contribute to the near field communication, which may be a preferred communication for package-to-package wireless communication when the packages are placed to each other in near field. The vertically polarized “Loop1” may further support the far field communication. This way, according to various aspects, the package may have an extended communication distance.

As illustrated in FIG. 30C, the antenna 3000 may use a series resistive loading to implement the embedded resistor R to lower the quality factor of the antenna 3000 for bandwidth expansion. In addition, a series capacitor C may be provided for capacitive load to reduce the size of the antenna 3000 even further. The antenna resonant frequency may be governed by the loop inductance of Loop 1, the capacitance introduced by Loop 2, and the capacitance of the series capacitor C.

Illustratively, in various aspects, TSVs, a strip, and a side ground plane may be used to form a package edge dual loop antenna which may enable both horizontal and vertical polarization. This may provide strong near field communication while supporting far field communication with the vertical polarization. The antenna 3000 may serially load the antenna 3000 with both resistively and capacitively using embedded resistor and capacitor to extend the bandwidth and to further reduce the overall size of the antenna 3000 and broaden the impedance bandwidth. This way, almost no space on the package carrier may be taken and the package may be easily manufactured. Further, wide band allows high data rates for a package-to-package interconnect. Further, long communication distance may enable interconnect throughout many system types, e.g. small—large client devices and small server units.

In other words, a package including vertically polarized antennas 3000 along the edge of the package may be provided in various aspects. Those antennas 3000 may utilize exposed TSVs along the package edges as main radiation elements. Also, package edge antennas may use of a package ground plane as part of impedance matching network to achieve higher bandwidth and angular coverage. Package edge antennas according to various aspects can be are electrically small by proper loading S, as described in more detail below. Hence, the antenna(s) 3000 require(s) about no additional space on the package carrier of the package. In various aspects, there can be placed as many as 4 antennas on a single package. Therefore, channel counts can be increased, the angular coverage can be expanded and higher frequency diversity to mitigate the interference can be promoted.

The package edge radiated dual loop antenna 3000 may be placed along the edge of a package as illustrated in FIG. 30C. One of the physical implementations of the antenna concept shown in FIG. 30A to FIG. 30C is illustrated in FIG. 31A and FIG. 31B.

Figure 31A:
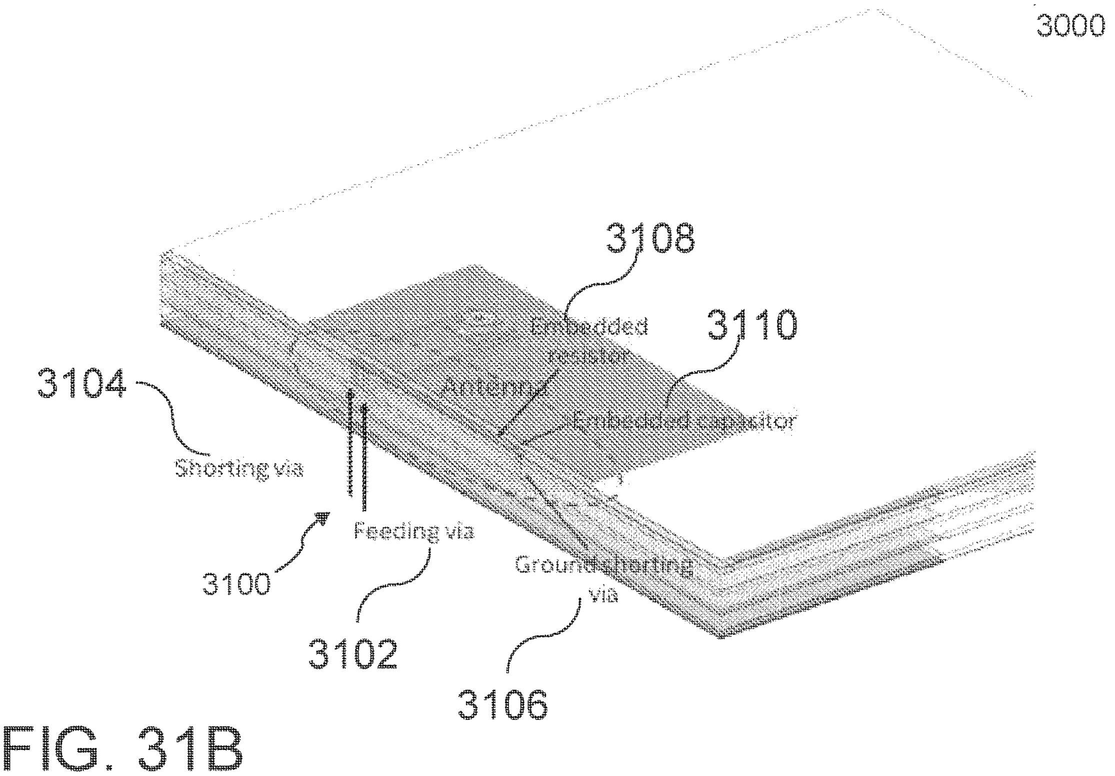
FIG. 31A and FIG. 31B exemplarily illustrate a package edge radiated dual loop antenna layout according to various aspects.
Figure 31B:
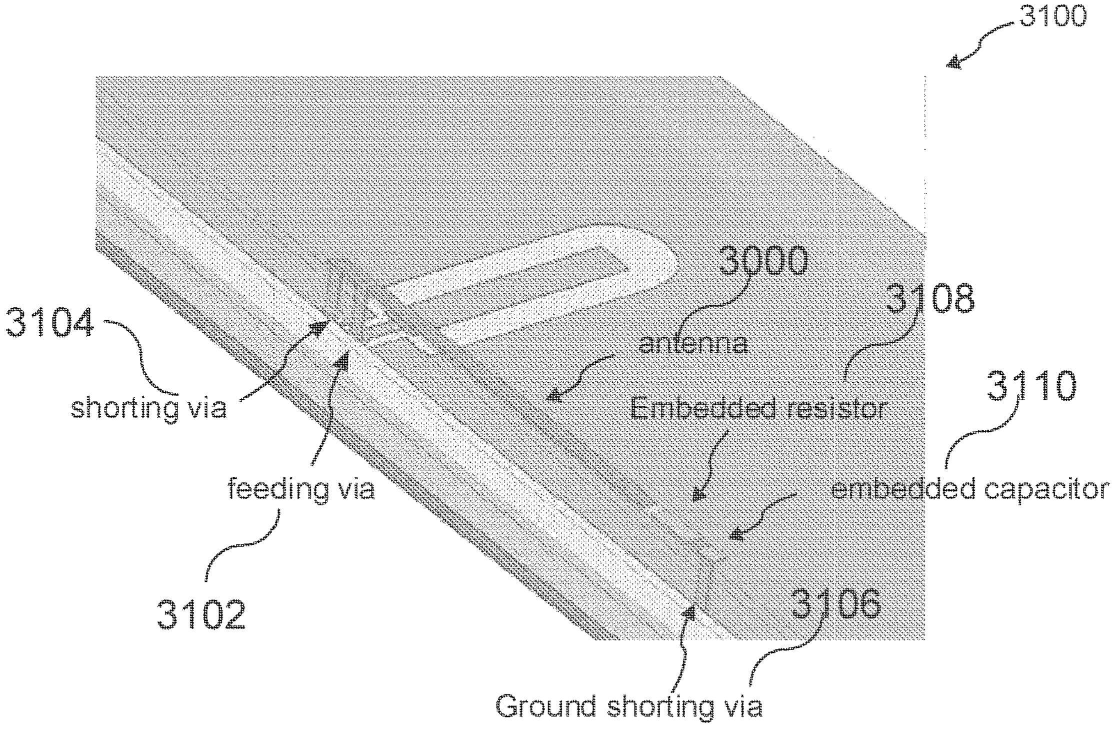

FIG. 31A and FIG. 31B illustrate a package edge radiated dual loop antenna 3000 layout with FIG. 31A depicting a 3-D view and FIG. 31B depicting a zoomed view 3100 on antenna and feeding.

The “Feeding”, “Shorting”, and “Loading” pins implemented as feeding via(s) 3102, shorting via(s) 3104, and loading via(s) 3106, respectively, e.g. TSVs, may be all exposed at the edge of the package. Depending on the package carrier, interposer, organic package stack-up, etc. all the TSVs may be either PTH TSVs or stacked micro-TSVs or a combination thereof. Furthermore, the vias or TSVs 3102, 3104, 3106 may be constructed by other means, such as placing pins and/or growing copper pillars. The resistor and capacitors may be embedded in an interlayer of the package carrier. Alternatively, the resistor 3108 and capacitors 3110 may be surface mounted on the top surface of the package. The antenna 3000 may be connected to a transceiver through a strip line as illustrated in FIG. 31B. Alternatively, the antenna 3000 may be directly fed from the backside of the package carrier.

In various aspects, the vertically polarized antenna has an omnidirectional radiation pattern on azimuth plane. Due to the finite ground plane, the pattern can be skewed. To have a wider angular coverage, the size of the ground plane may be configured to reduce the pattern skew.

Figure 32A:
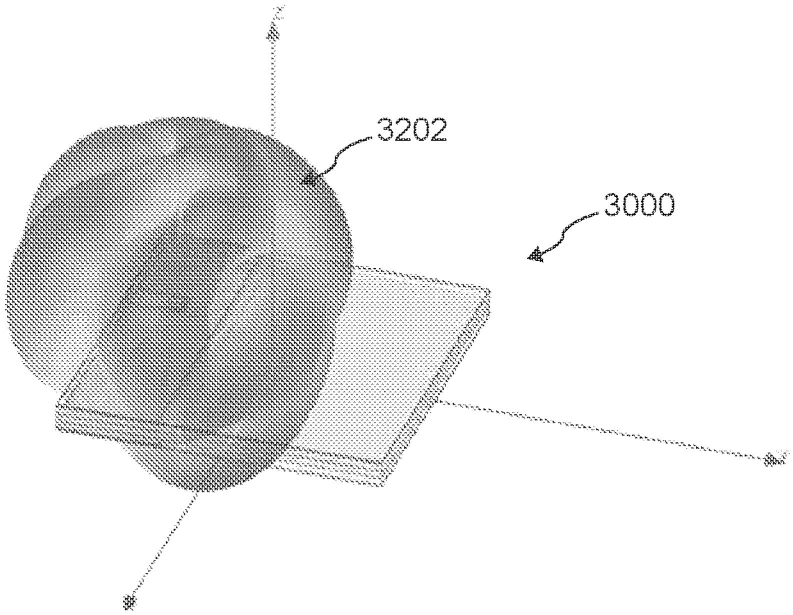
FIG. 32A and FIG. 32B exemplarily show gain radiation patterns of a package edge radiated dual loop antenna according to various aspects.
Figure 32B:
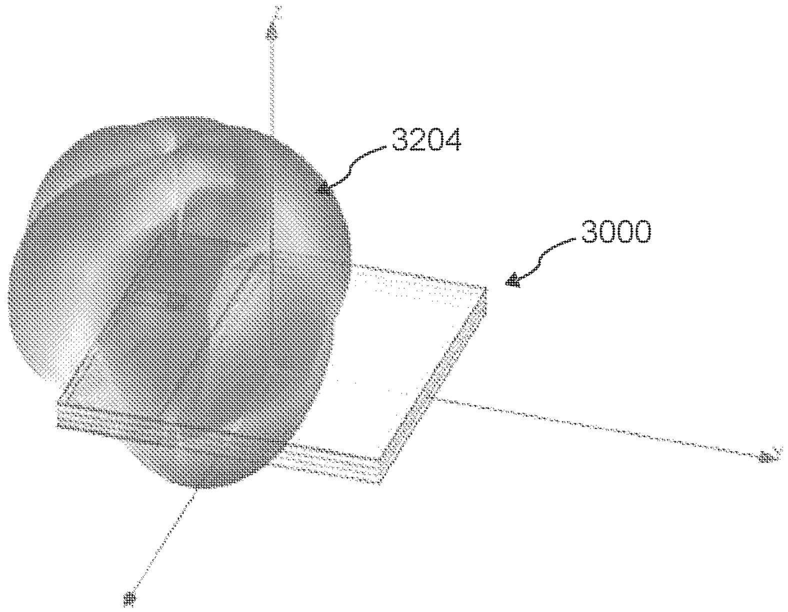

FIG. 32A and FIG. 32B illustrate 3-D gain radiation patterns 3202, 3204 of package edge radiated dual loop antenna 3000. Theta-polarized 3-D gain pattern 3202 ($G_\theta$) of the antenna layout is illustrated in FIG. 32A while Phi-polarized 3-D gain pattern 3204 ($G_\varphi$) of the antenna layout is illustrated in FIG. 32B. The gain plots show that both horizontally polarized (or Phi polarized) and vertically polarized (or Theta polarized) radiation exist. Horizontally polarized radiation and vertically polarized radiation may be equally strong. However, only the vertically polarized radiation may survive in far field when the package board ground plane may be placed below the antenna in close proximity to the package edge radiated dual loop antenna.

Figure 33:
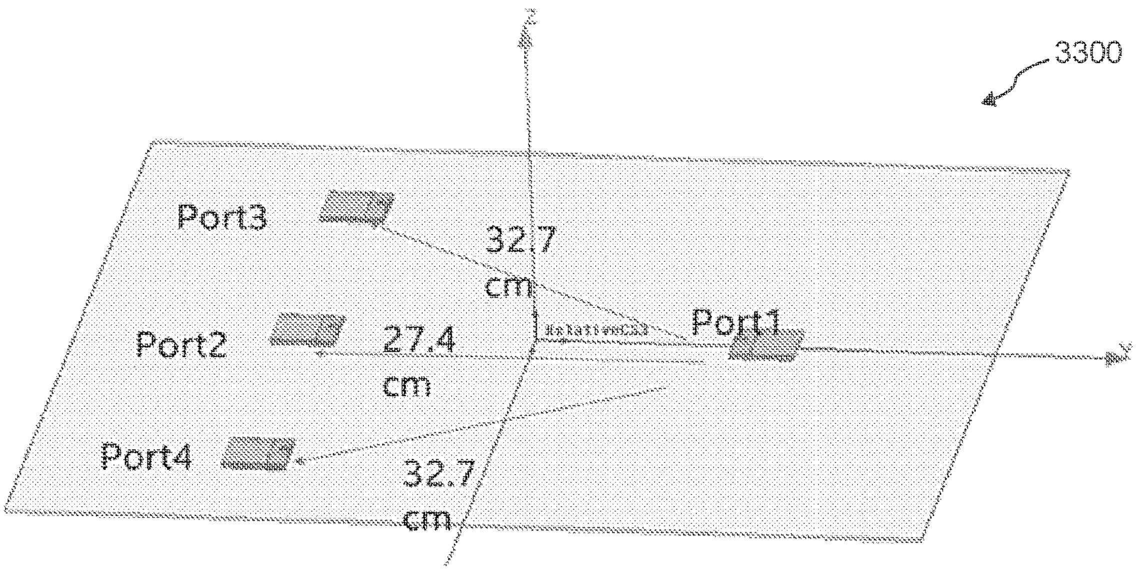
FIG. 33 exemplarily shows a package edge antenna one-to-three link simulation setup.
Figure 34:
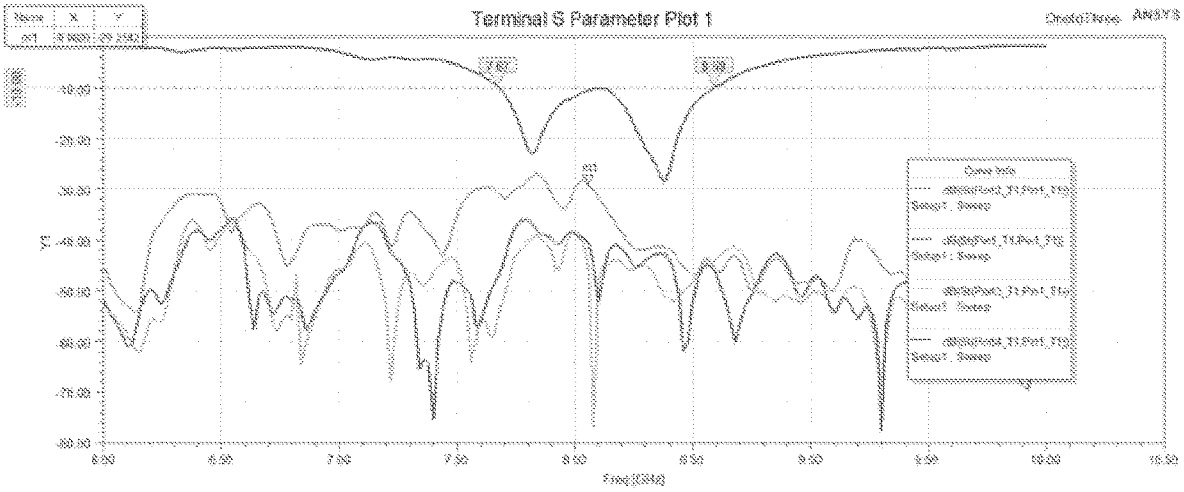
FIG. 34 exemplarily shows the simulated S-parameter of the package edge antenna one-to-three link simulation setup of FIG. 33.

To evaluate the link performance of the package edge radiated dual loop antenna layout in an enclosed environment formed by a package board and a chassis, 8 GHz package edge antennas may be configured and simulated in a set up as illustrated in FIG. 33 illustrating a package edge antenna one-to-three link simulation setup 3300. To be representative, a metallic chassis 5 mm above the top packages is included in the simulation besides the package board ground plane. FIG. 34 depicts the package edge antenna one-to-three link simulated S-parameter in a diagram 3400.

FIG. 35 depicts a link budget summary 3500 of an 8 GHz package edge radiated dual loop antenna, also denoted as link level performance, as described before. All the simulation results confirm the concept of the package edge antenna and its performance.

Figure 36:
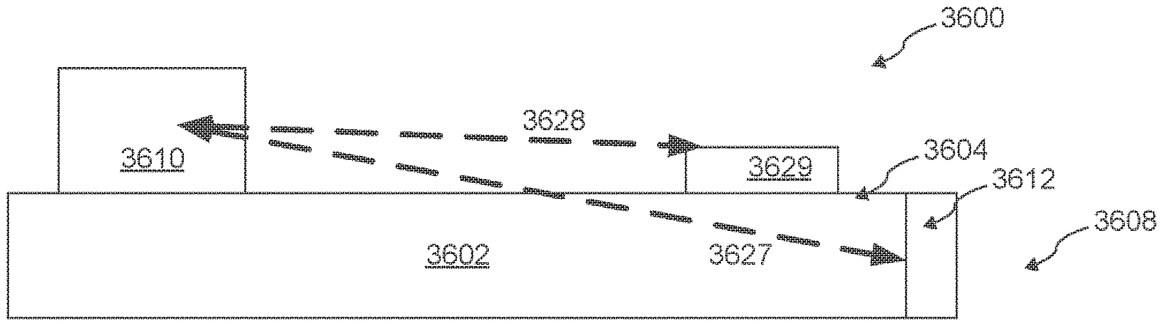
FIG. 36 exemplarily shows a schematic cross-section of a package according to various aspects.

FIG. 36 illustrates a schematic cross-section of a package 3600 according to various aspects. In various aspects, the package 3600 includes a package carrier 3602 having a planar surface 3604 and an edge surface 3608 extending orthogonal to the planar surface 3604, at least one die 3610 arranged on the planar surface 3604, and a first antenna 3612 arranged on an orthogonal portion of the edge surface 3608. The first antenna 3612 may be exposed on the edge surface 3608. A radio frequency signal interface 3627 may be configured to couple the first antenna 3612 with the die 3610.

The edge surface 3608 may be a first edge surface and the package carrier 3602 may further include at least a second edge surface. A second antenna may be arranged on the second edge surface. Each of the first antenna and the second antenna may be configured as vertically polarized antennas. The first antenna and the second antenna may be vertically polarized antennas configured to include at least one of different polarizations or propagation directions.

The first antenna 3612 may be arranged along the edge surface 3608.

A third antenna 3629 may be arranged on or above the planar surface 3604. The first antenna 3612 and the third antenna 3629 may be configured to include at least one of different polarizations or propagation directions.

The first antenna 3612 may include one or more TSVs as main radiation elements.

The package carrier 3602 can include a ground plane. The first antenna 3612 can be coupled to the ground plane.

The first antenna 3612 may be configured as a directional antenna.

The first antenna 3612 may be configured for near/field communication and for far/field communication.

Usually, wireline interconnects, such as silicon interposers and embedded multi-die interconnect bridge (EMIB) are used for connecting chips. However, wireline interconnect lacks the flexibility of broadcasting and multi-drop. Further, directive wireless communication using phase array or other beamforming network (BFN) are used for device-to-device communication. However, phase array or other BFN may lead to higher power consumption, larger package area, and higher cost.

Further, a wireless channel between packages (also denotes as package-to-package communication) is susceptible to multiple reflections between a cover and a package carrier or a board PCB of the package. Free space path loss decay rate can also be significant ($1/r^2$) and even more at near field distances ($\sim 1/r^3$).

Besides the path loss, the received signal strength can be angular dependent due to the multi-path nature of the communication channel. The phase of the received signal can be prone to error which requires more equalization taps to correct and, thus, resulting in higher latency.

To address the problems imposed by the multipath, in various aspects, RF signals (also denoted as RF energy) are coupled to a cover of a package in the form of surface wave energy that is bound to a surface of the cover. The surface of the cover may be a film that may be glued or coated to the surface of the cover for example. The surface wave power decay is also proportional to 1/r, thus creating a lower loss channel. A metal pattern attached to the surface of the cover may be selectively chosen to lower the surface impedance in the surface waveguide (SWG) region while the surround medium has a higher impedance. The electric fields thus can propagate mainly in the SWG region.

Coupling from the package to the SWG may be accomplished with a mode transformer that converts the radiated near field RF signals from the package edge to a surface wave mode.

Further, the electromagnetic wave bound to the SWG region may create an RF signal channel that is more immune to multipath reflection and less phase error may be introduced. Further, transmission distance of RF signals may be increased. Consequently, less equalization taps and power may be required for RF communications. Thus, the decoding can be significantly simplified as well as the latency can be greatly improved.

Hence, compared to the wired solution, various aspects provide multidrop and broadcasting of RF signals. Hence flexible floor planning for package placement is offered. Further, no additional space on package is required and hence low cost. Further, no direct current (DC) power consumption and wide band is required.

Figure 37:
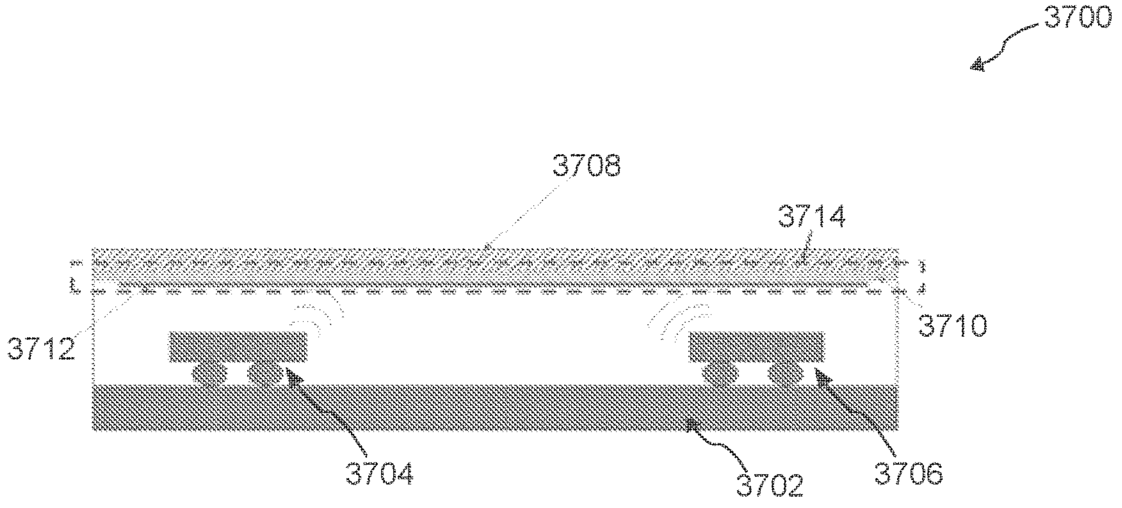
FIG. 37 exemplarily shows a cover including an integrated surface waveguide for package-to-package wireless communication according to various aspects.

FIG. 37 depicts a board or a package having a first device 3704, e.g. a first package device 3704, and a second device 3706, e.g. a second package device 3706, on a common carrier 3702, e.g. a board 3702, and covered by a common cover 3708, e.g. an integrated heat spreader (IHS) 3708. The cover 3708 can include a film 3710 having a metallic pattern 3712 facing the first the packages 3704, 3706. The metallic pattern 3712 is configured to form a surface wave 3714 from RF signals emitted by at least one of the packages 3704, 3706. The surface wave facilitates the transmission of the RF signal from one package to the other package. Thus, the packages 3704, 3706 can be wirelessly coupled through an RF signal interface. The RF signal interface can include the surface wave 3714 according to various aspects.

In other words, the cover 3708 can include an integrated surface waveguide for package-to-package wireless communication. In various aspects, a surface waveguide (SWG) can include package antennas (also denoted as antennas). The SWG can be formed by a patterned thin film and a metallic cover. The electromagnetic wave generated by a package antenna is coupled to the SWG and then propagates along the SWG as a guided surface wave.

As indicated in FIG. 37, the film 3710 of dielectric material, e.g. coated or glued to the surface of the cover 3708, used for the SWG may have a thickness in the range of 0.5 mm to 1 mm thickness. The film 3710 may be in the form of thin film or a flexible carrier which can be deformed. The film 3710 can be attached seamlessly on the interior surface of the cover 3708. The relative dielectric permittivity of the film can be within 3 to 6.

To have an SWG, proper metallic patterns 3712 may be printed on one of the surfaces of the dielectric material of the film 3710. A metallic pattern 3712 according to various aspects is illustrated in FIG. 38A and FIG. 38B.

Figure 38A:
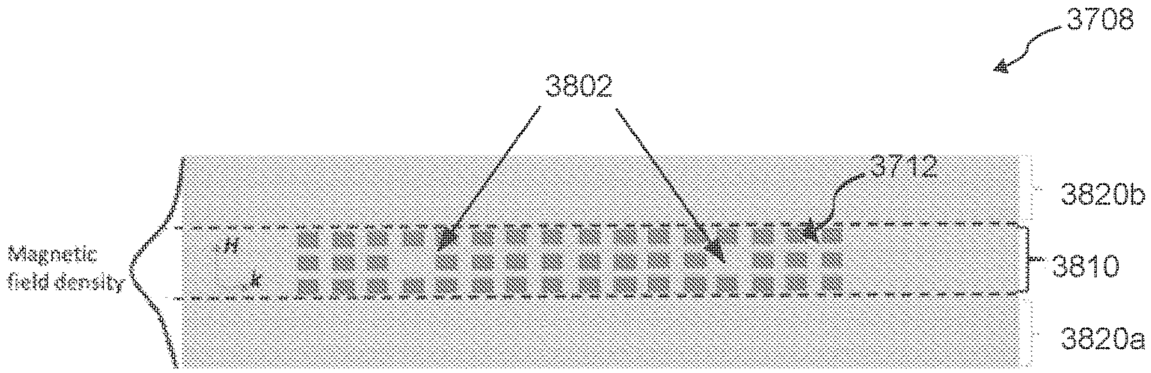
FIG. 38A and FIG. 38B exemplarily show a metallic pattern on a thin film according to various aspects, FIG. 39A and FIG. 39B exemplarily show sub-wavelength patch structures according to various aspects.
Figure 38B:
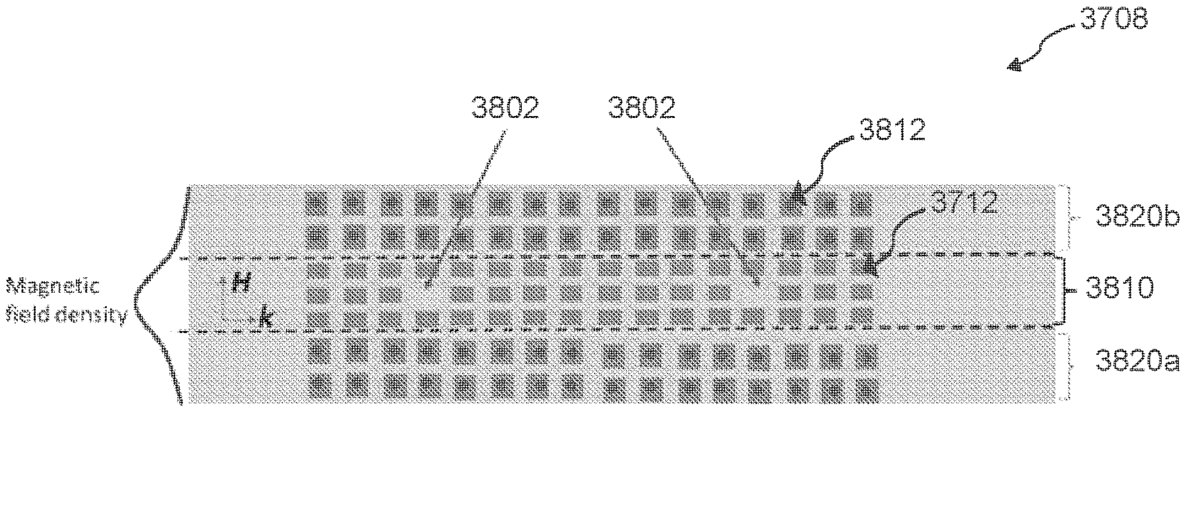

FIG. 38A and FIG. 38B depict a metallic pattern 3712 on the thin film. In this pattern 3712, the overall surface is divided into three lateral parts 3810, 3820*a*, 3820*b*. First parts 3820*a*, 3820*b* can be devised to have high surface impedance within the operational frequency band and can sandwich a second part 3810 configured to have a low surface impedance. This way, surface wave propagation along the second part 3810 is encouraged and the magnetic field at two edges of the cover is shortened having a peak at the center of the thin film as indicated on the left side of FIG. 38A and FIG. 38B.

The first part 3820*a*, 3820*b* may be free of metallic pattern as illustrated in FIG. 38A, or may have a mushroom-like metallic-dielectric structure 3812 configured to cause a higher surface impedance than the plain metallic pattern 3712, as illustrated in FIG. 38B. Packages are located beneath predetermined positions 3802 that are free of metallic pattern 3712 under the cover 3708.

Figure 39A:
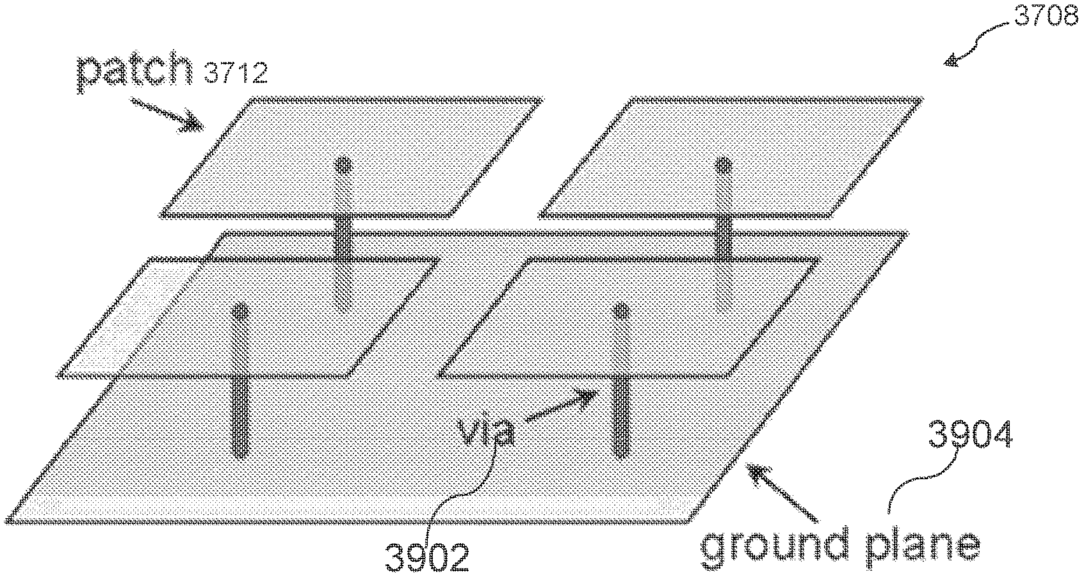
Figure 39B:
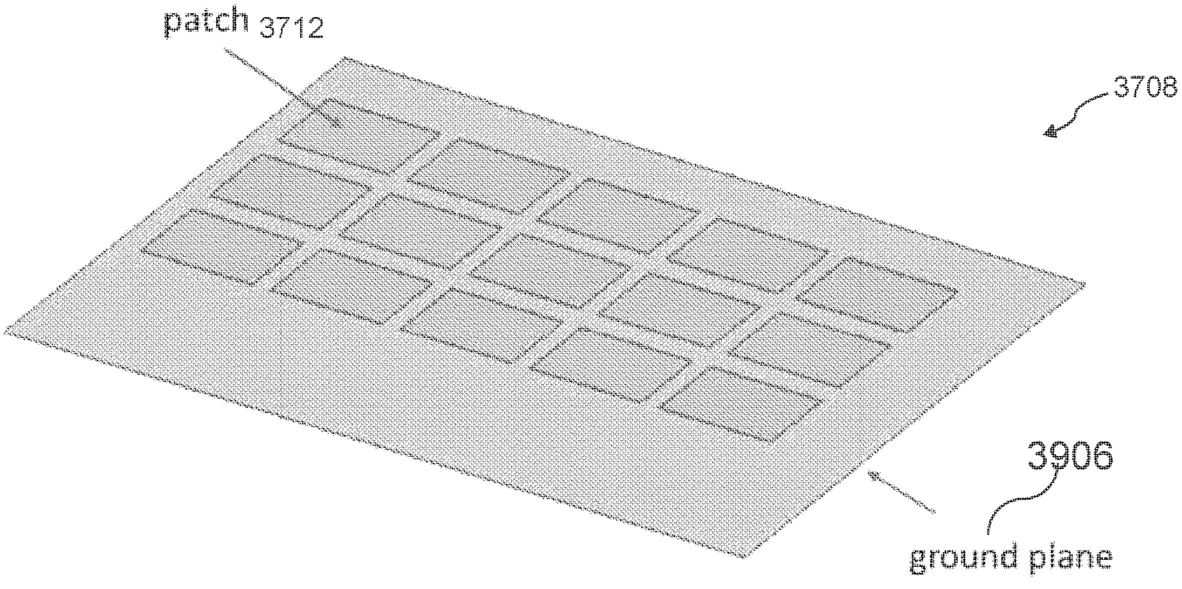
Figure 40:
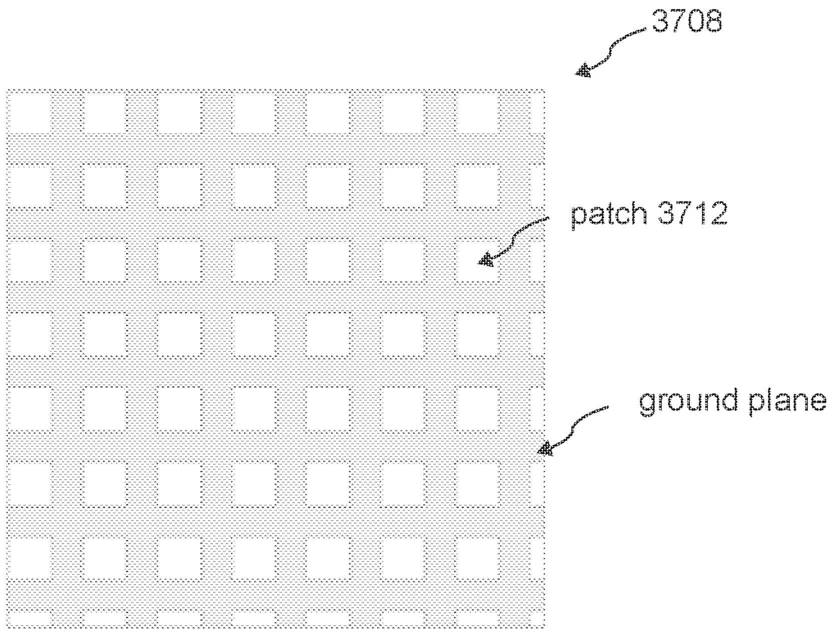
FIG. 40 exemplarily shows a sub-wavelength grid according to various aspects.

In various aspects, a sub-wavelength patch structure 3712 with ground TSVs or without ground TSVs can be used to realize high surface impedance as demonstrated in FIG. 39A and FIG. 39B. A sub-wavelength grid presented in FIG. 40 can also provide high surface impedance and act as artificial magnetic conductor. FIG. 39A and FIG. 39B depicts sub-wavelength patched array for high surface impedance region with FIG. 39A showing a patch 3712 with ground TSVs 3902 coupled to a ground plane 3904 and FIG. 39B showing patch without ground TSVs and a direct coupling to ground plane 3906. FIG. 40 depicts sub-wavelength grid for high surface impedance region.

However, other patterns can be used to create an artificial magnetic conductor to form the first part 3820*a*, 3820*b* (see FIG. 38A and FIG. 38B) having a high surface impedance region. All metallic pattern 3712 used to form a SWG can be print or silver ink-jet printed a surface of a flexible carrier, e.g. film 3710 illustrated in FIG. 37, for cost reduction, as an example.

In various aspects, SWG construction can be achieved in multiple ways. By way of example, these can include laminating a metallic pattern in between plastic films such as polyamide, mylar, ULTEM, PEEK, PTFE, but are not limited thereto. The second part 3810 (see FIG. 38) can be mass produced by chemical etching processes or traditional machining processes such as stamping or milling.

Another way of forming the SWG could include metal patterning a high surface impedance carrier (for example, plastic). Metal patterning can be achieved by chemical vapor deposition, transfer printing or laser direct structing (LDS), inkjet printing, lithographical processes.

If SWG is not directly constructed on the cover 3708, mechanical fasteners such as screws, or chemical fasteners such as epoxies can be used to attach the SWG to the cover 3708.

Figure 41:
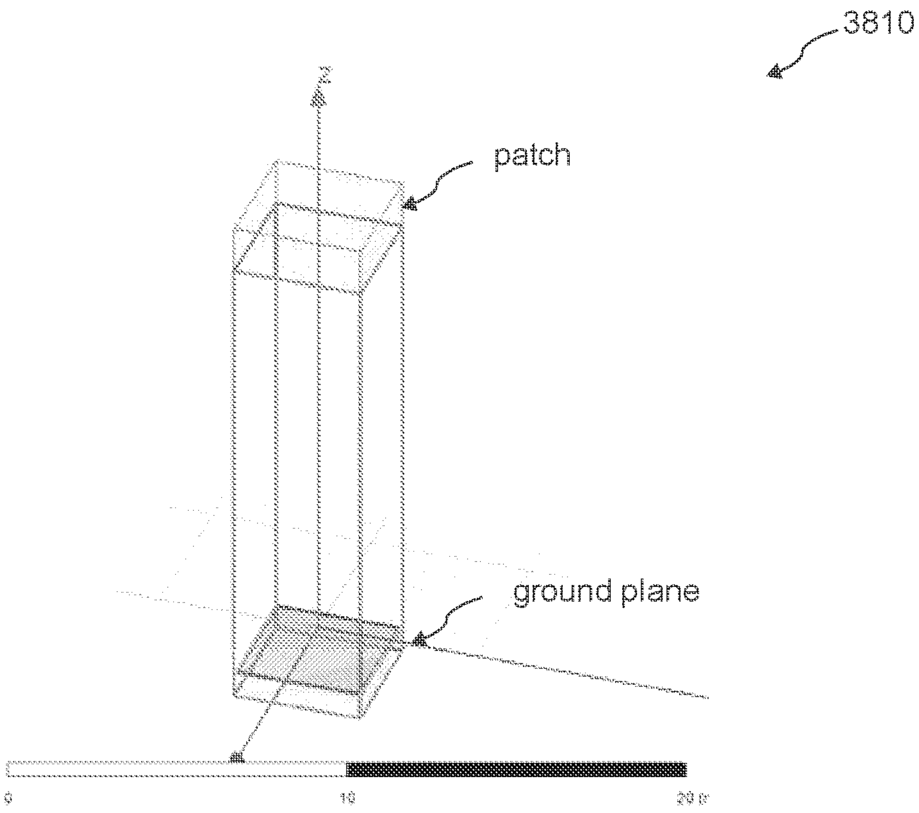
FIG. 41 exemplarily shows a model of a patch unit cell according to various aspects.
Figure 42:
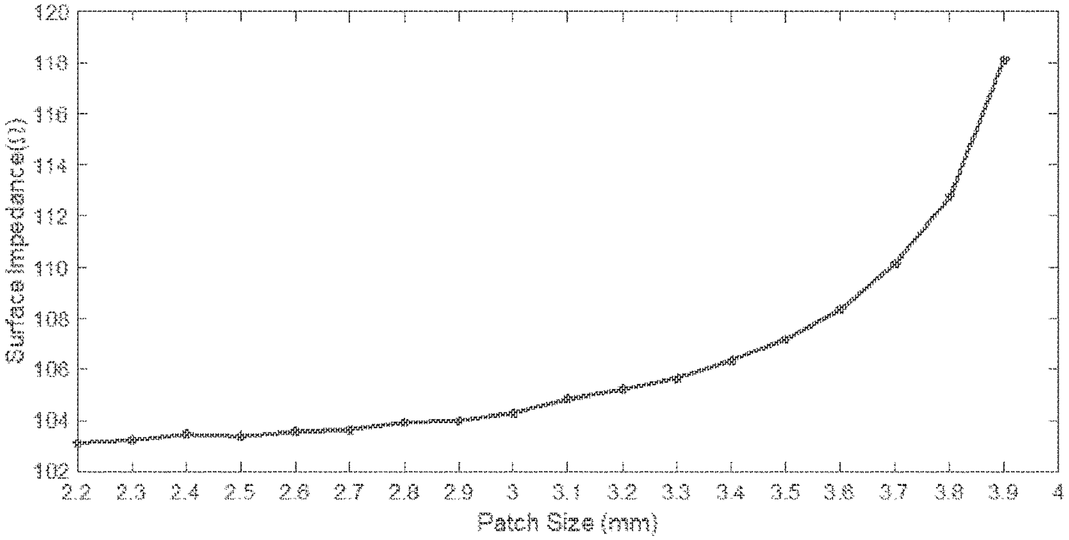
FIG. 42 exemplarily shows the surface impedance vs the patch size of a patch pattern according to various aspects.

The low surface impedance region 3810 (see FIG. 38) can be formed by an array of patches as illustrated in FIG. 38A and FIG. 38B. The size of the patch and the period of the patch can adjust the impedance. For validation purpose, a model of a 4 mm×4 mm patch unit cell on 31 mil Rogers 5880 (DK=2.2) carrier is created and simulated in HFSS as shown in FIG. 41 that is illustrating a 3-D model of a patch unit cell for low impedance region 3810. The achievable surface impedance vs the patch size is calculated through the eigenmode frequency calculation and is illustrated in diagram 4200 in FIG. 42, illustrating the patch size vs the surface impedance for the low surface impedance region 3810.

Figure 43A:
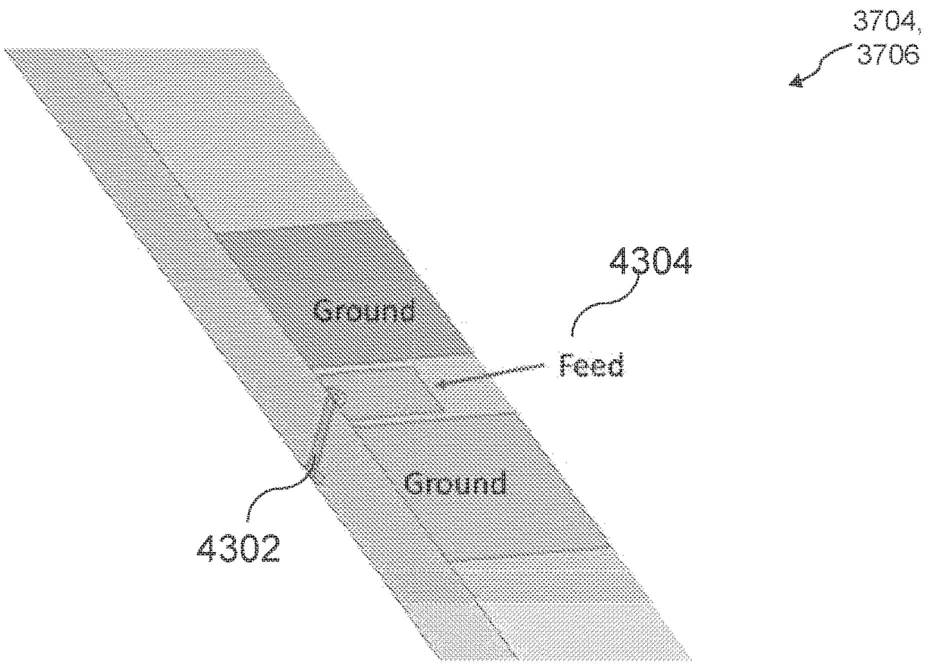
FIG. 43A exemplarily shows a 3-D view of a package edge exposed TSV serving as package antenna according to various aspects.
Figure 43B:
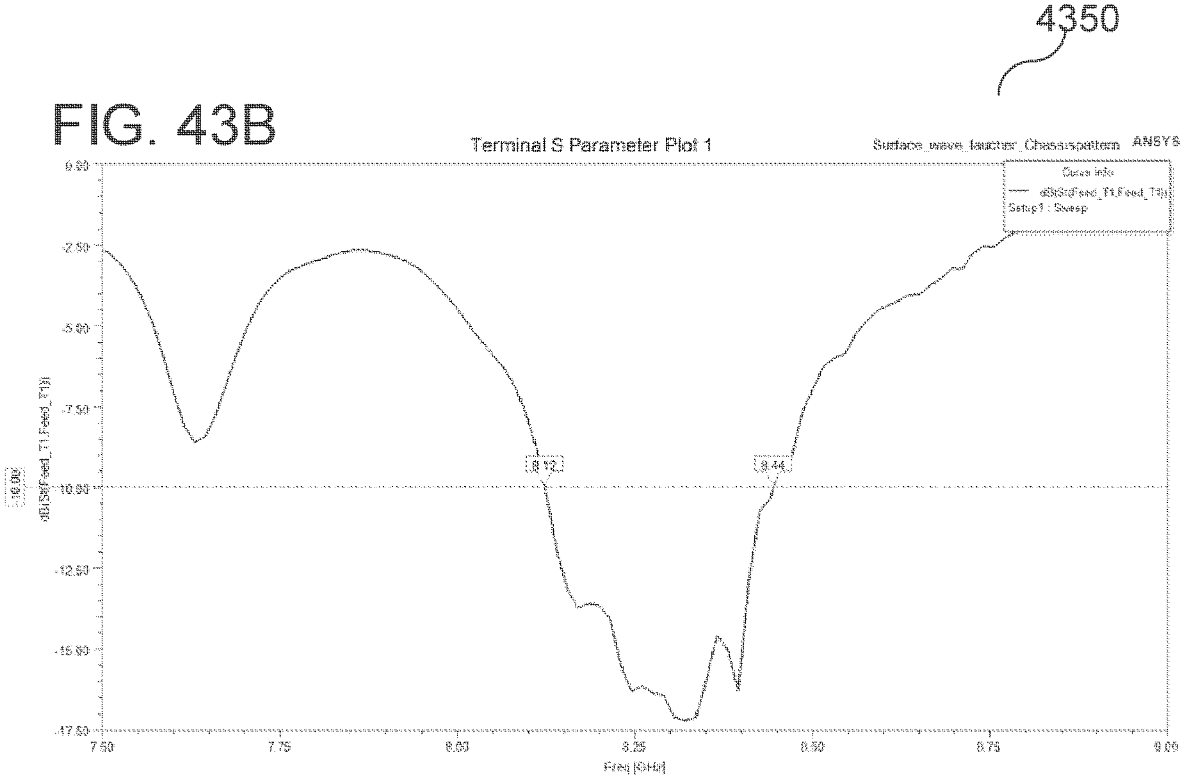
FIG. 43B exemplarily shows the Simulated Return Loss (RL) of the package antenna of FIG. 43A.

FIG. 43A and FIG. 43B show a package edge exposed TSV serving as package antenna with FIG. 43A showing 3-D view of the package antenna and FIG. 43B showing the Simulated Return Loss (RL) of the radiator. An edge exposed TSV 4302 illustrated in FIG. 43A can be one of the aspects for a package antenna of the package 3704, 3706 (see FIG. 37) to couple the electromagnetic energy (also denoted as RF signal) to the SWG. A coplanar waveguide shown as Ground-Feed-Ground 4304 may be considered as the feeding network to the antenna for the purpose of layout simplicity and impedance matching. The simulated return loss (RL) of the radiator presented in a diagram 4350 in FIG. 43B and shows a 320 MHz RL bandwidth.

Figure 44:
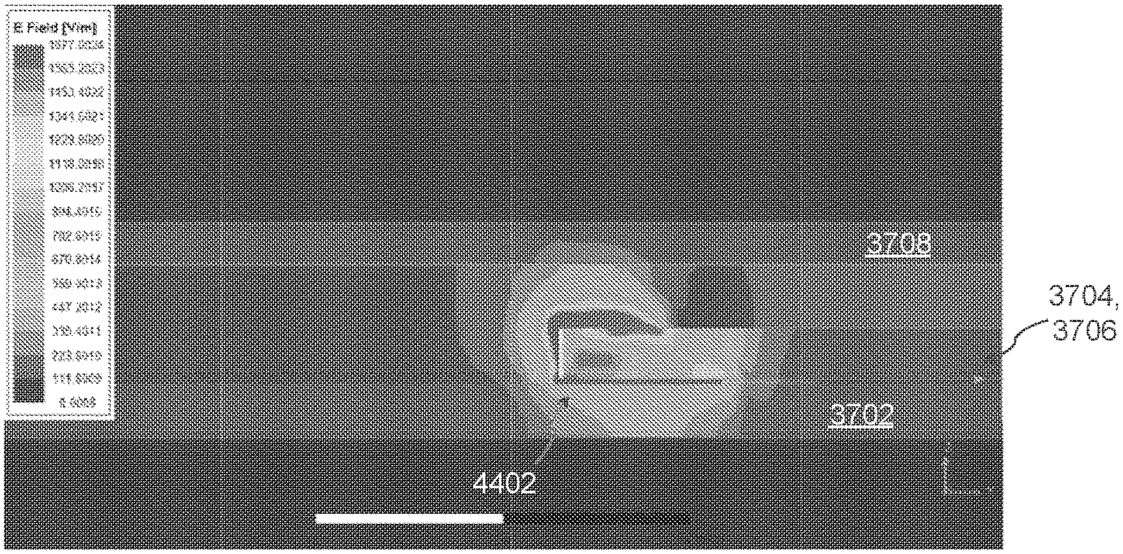
FIG. 44 exemplarily shows a diagram depicting the electrical field of an SWG coupled to a cover according to various aspects.

FIG. 44 illustrates an electrical field (of the RF signal) sent by one of the packages 3704, 3706 (see FIG. 37) and coupled to the cover SWG at 8.28 GHz. As illustrated in FIG. 44, the package edge exposed TSV 4402 couples the wave on a bottom of a ground plane of a package board 3702 and to the SWG of the cover 3708. However, the wave coupled to the package board ground plane may only create a standing wave while the wave coupled to the SWG can become a guided surface wave propagating along the low impedance region 3810 (see FIG. 38A and FIG. 38B) of the SWG.

Figure 45A:
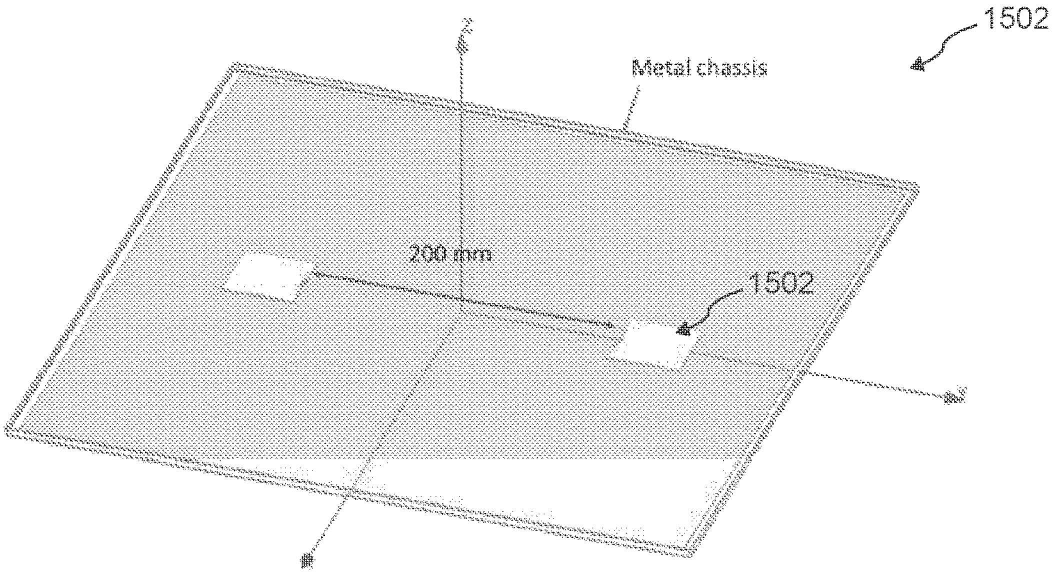
FIG. 45A exemplarily shows a 3-D Model for Link Performance Simulation without SWG.
Figure 45B:
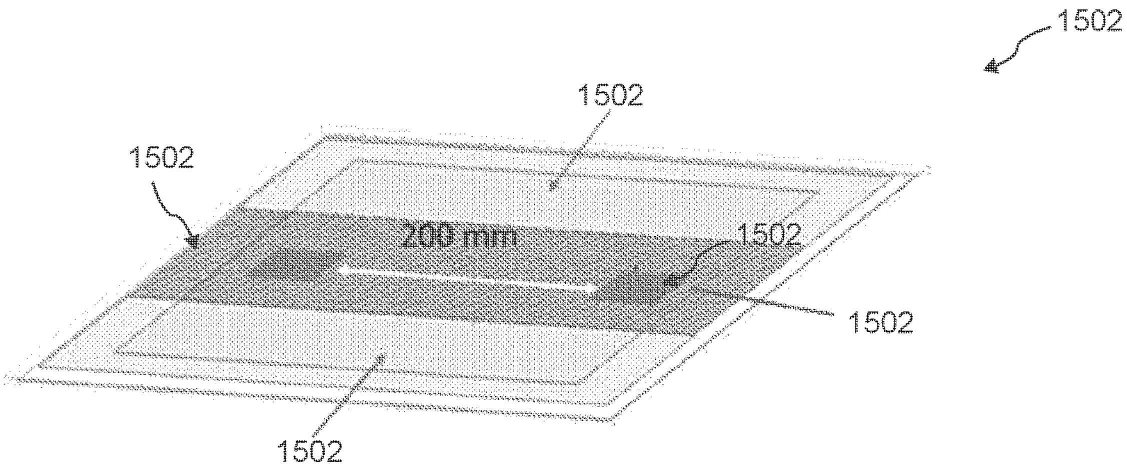
FIG. 45B exemplarily shows a 3-D Model for Link Performance Simulation with SWG FIG. 46A exemplarily shows an S-parameter comparison of Link Performance Simulation of a package having a cover with SWG and of a package having a cover without SWG.
Figure 46A:
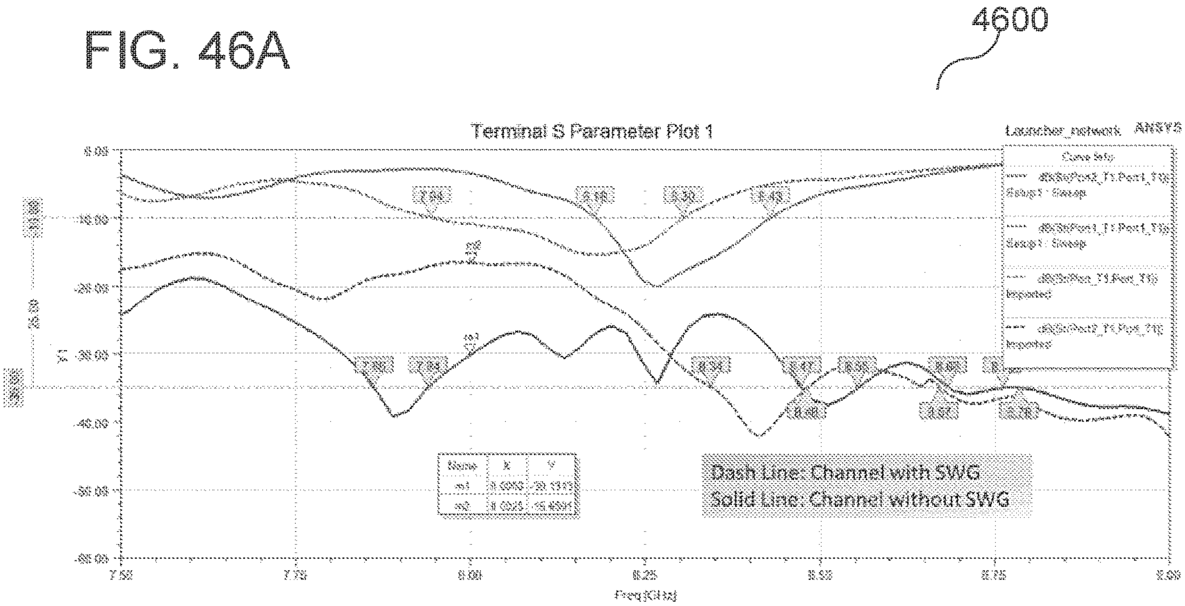
FIG. 46B exemplarily shows a Group delay comparison of Link Performance Simulation of a package having a cover with SWG and of a package having a cover without SWG.
Figure 46B:
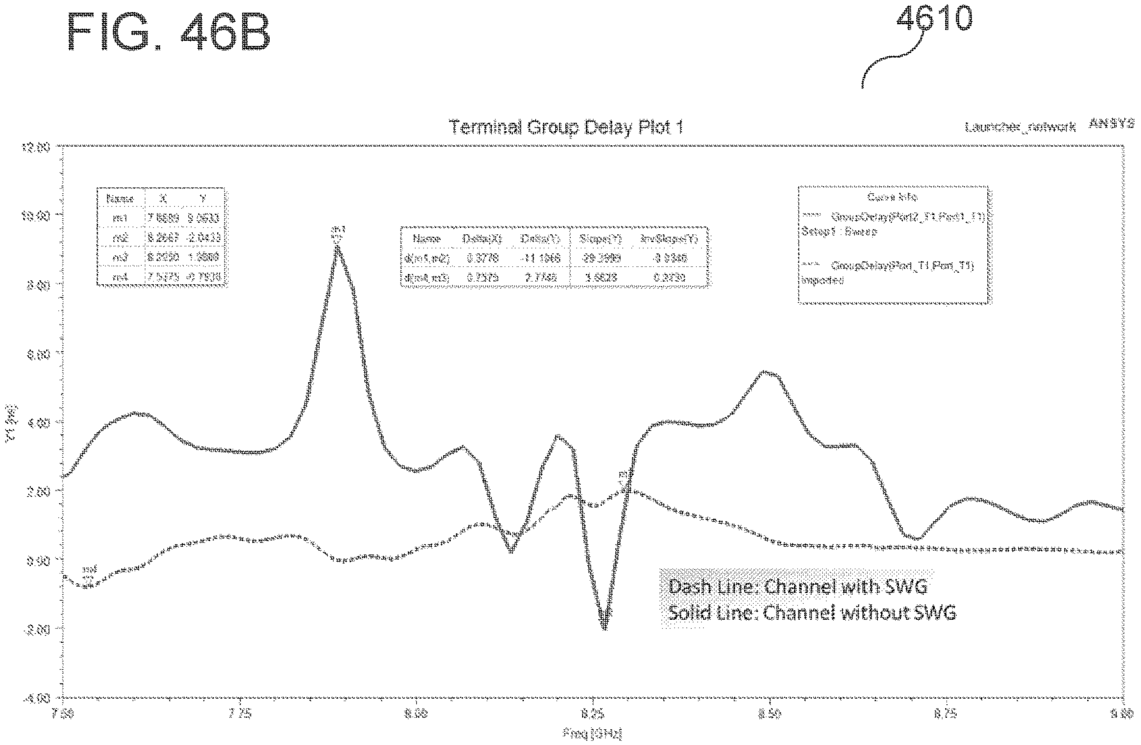

FIG. 45A and FIG. 45B illustrate a 3-D Model for Link Performance Simulation with FIG. 45A a cover without SWG and FIG. 45B a cover with SWG. To evaluate the effectiveness of SWG, one-to-one links with or without SWG are modeled in a high-frequency structure simulator (HFSS). Their performances are compared as illustrated in FIG. 46A and FIG. 46B with FIG. 46A showing S-parameter comparison in a first diagram 4600 and FIG. 46B showing the Group delay in a second diagram 4610. As shown in FIG. 46A, coupling to the SWG changes the reflection experienced by the package antenna. Illustratively, SWG changes the reflection of the package antenna since the SWG can be considered as a superstrate of the package antenna and, hence, can load the package antenna. The presence of the SWG broadens the reflection bandwidth by about 110 MHz. In addition, the SWG strengths the peak transmission by about 9 dB within the 7.5 GHz to 9 GHz band compared to the communication link without SWG. Besides the S-parameter comparison, the Group delay of the links with SWG and without SWG is compared. As revealed in FIG. 46B, the communication link without SWG has a group delay variation of 11.1 ns comparing structure to 2.77 ns for the communication link with SWG. Thus, the SWG can mitigate the multipath transmission and, hence, can reduce the group delay fluctuation and, hence, can reduce a phase error drastically.

Figure 47:
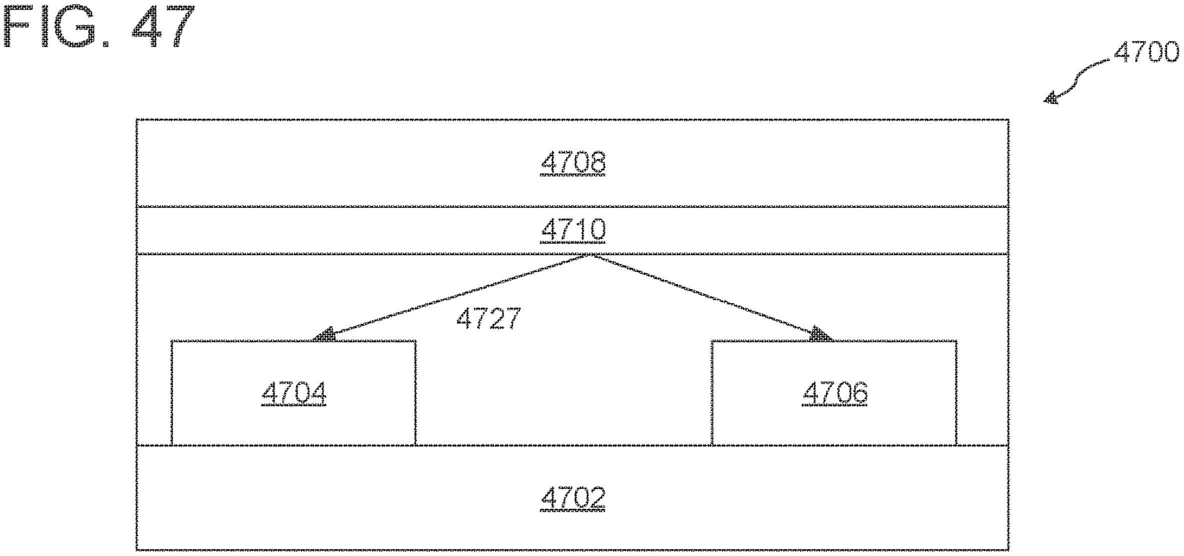
FIG. 47 exemplarily shows a schematic ross-section of a package system according to various aspects.

FIG. 47 illustrates a schematic cross-sectional view of a package system 4700, also denoted as a package-to-package communication system, according to various aspects. The package system 4700 may include at least a first package 4704 and a second package 4706 on a carrier 4702, e.g. a board 4702. The first package 4704 and the second package 4706 may be arranged on a same side of the board 4702. Each of the first package 4704 and the second package 4706 may include at least one antenna to transmit and/or receive radio frequency (RF) signals. A cover 4708 may be arranged at a distance over the first package 4704 and the second package 4706 at the same side of the board 4702 as the first package 4704 and the second package 4706. The cover 4708 may include at least one conductive element 4710 forming a predefined pattern also denoted as metallic pattern 3712) on a side of the cover 4708 facing the first package 4704 and the second package 4706. The package system 4700 may further include a radio frequency signal interface 4727 configured to connect the at least one antenna of the first package 4704 to the at least one antenna of the second package 4706. The radio frequency signal interface 4727 may include the at least one conductive element, e.g. the metallic pattern 3712 as described above.

In various aspects, the at least one conductive element may be configured as a surface waveguide (SWG) for radio frequency signals, e.g. the RF signals to be sent or received by the first package 4704 or second package 4706.

In various aspects, the cover 4708 may include a metallic carrier that may be covered by a dielectric layer and the conductive pattern may be arranged on the dielectric layer, see e.g. FIG. 37. As an example, the at least one conductive element may be configured as electrically floating.

In various aspects, the at least one conductive element may be configured as a radio frequency filter.

In various aspects, the at least one conductive element may be configured as a surface acoustic wave structure.

In various aspects, the at least one conductive element may include a plurality of metal structures (e.g. the pattern described above). The plurality of metal structures may be electrically isolated from each other.

In various aspects, the at least one conductive element may include at least a first region (region 3810 in FIG. 38A and FIG. 38B) and a second region (region 3820*a*, 3820*b* in FIG. 38A and FIG. 38B). The at least one conductive element may be configured to have a first surface impedance in the first region and a second surface impedance in the second region, the second surface impedance being higher than the first surface impedance. The at least one conductive element in the first region and the conductive element in the second region may be positioned along an optical connecting line of the first package 4704 and the second package 4706. As an example, the at least one conductive element in the first region may be formed atop of the first package and the second package and atop of the optical connecting line. As an example, the at least one conductive element in the second region may be arranged laterally positioned to the at least one conductive element in the first region. As an example, the at least one conductive element may include in the second region a dielectric part may be arranged on the metal structure, the dielectric part protruding from the metal structure towards the side of the package carrier.

In various aspects, the cover 4708 may be attached to the board 4708.

In various aspects, a package may include at least a first die and a second die on a carrier. The first die and the second die may be arranged on a same side of the carrier. Each of the first die and the second die may include at least one antenna to transmit and/or receive radio frequency signals. A cover may be arranged at a distance over the first die and the second die at the same side of the carrier as the first die and the second die. The cover may include at least one conductive element forming a predefined pattern on a side of the cover facing the first die and the second die. The package may further include a radio frequency signal interface wirelessly connecting the antennas of the first die and the second die. The radio frequency signal interface may include the at least one conductive element. In various aspects, the at least one conductive element may be configured as a surface waveguide for radio frequency signals.

In various aspects, the cover may include a metallic carrier that may be covered by a dielectric layer and the conductive pattern may be arranged on the dielectric layer. As an example, the at least one conductive element may be configured as electrically floating.

In various aspects, the at least one conductive element may be con figured as a radio frequency filter.

In various aspects, the at least one conductive element may be configured as a surface acoustic wave structure.

In various aspects, the at least one conductive element may include a plurality of metal structures. The plurality of metal structures may be electrically isolated from each other.

In various aspects, the at least one conductive element may include at least a first region and a second region. The at least one conductive element may be configured having a first surface impedance in the first region and a second surface impedance in the second region, the second surface impedance being higher than the first surface impedance.

As an example, the at least one conductive element in the first region and the conductive element in the second region may be positioned along an optical connecting line of the first die and the second die. In various aspects, the at least one conductive element in the first region may be formed atop of the first die and the second die and atop of the optical connecting line. In various aspects, the at least one conductive element in the second region may be arranged laterally positioned to the at least one conductive element in the first region. In various aspects, the at least one conductive element may include in the second region a dielectric part may be arranged on the metal structure, the dielectric part protruding from the metal structure towards the side of the carrier.

In various aspects, the cover may be attached to the carrier.

Figure 48:
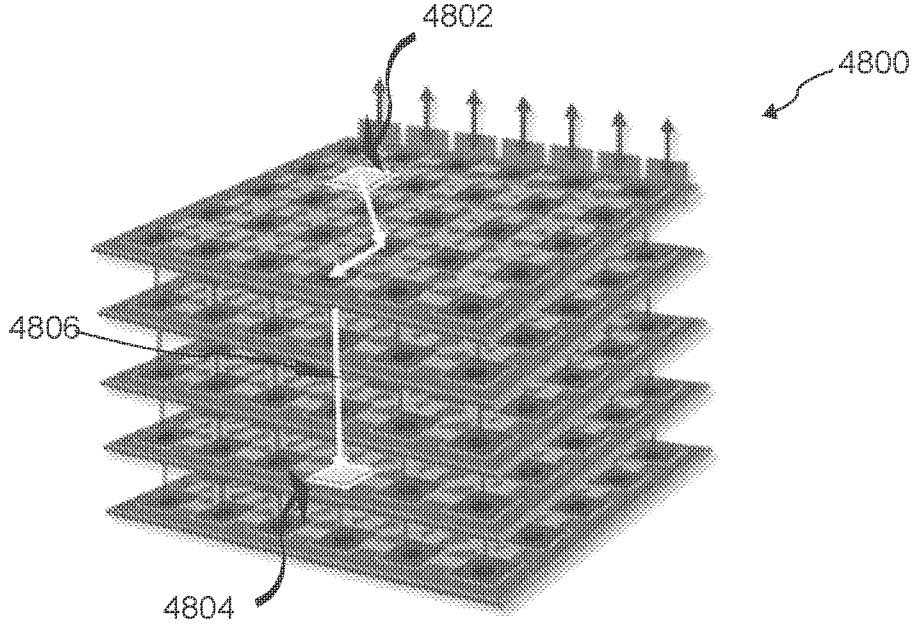
FIG. 48 exemplarily shows an example of a communication between stacked packages.

Conventionally, 3-D chip-to-chip communication through a wired mesh interconnect becomes cumbrous and problematic when many chips are involved. One example is a 3-D stack 4800 as shown in FIG. 48. To have a first chip 4802 and a second chip 4804 communicate with each other, a signal 4806 has to pass the routings on each package and then be interconnected through a backplane. Depending on their relative locations, some of the chips in the 3-D stack 4800 may suffer from excessive insertion loss and latency to communicate with each other and, hence, high power consumption. Further, routing congestion and resulting large packages are usually two major drawbacks. These well-known problems increase exponentially with the increase of chip counts on each package and hence is very difficult to scale.

Thus, if the communication between two chips 4802, 4804 can take advantage of a wireless communication between two z-axis stacked packages, the excessive latency and insertion loss can be mitigated. Also, the routing congestion on each package can be efficiently reduced. In addition, wireless communication offers scalability and reconfigurability.

However, the wireless communication between chips on two adjacent packages faces several challenges because of the small foot-print for the coupler and very tight spaces between adjacent channels such as the coupling distance (chip-to-chip communication range) is usually limited, coupler operational bandwidth is narrow, and severe channel-to-channel interference can be present.

Figure 49:
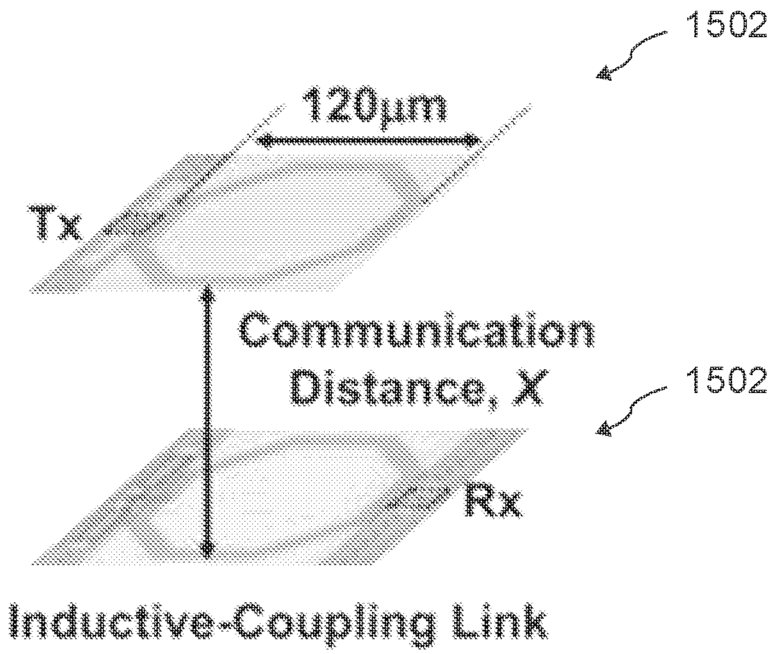
FIG. 49 exemplarily shows an inductive coupling for chip-to-chip wireless communication.

Conventionally, wireless communication between chips on two adjacent packages are often accomplished through reactive technologies, such as inductive coupling as shown in FIG. 49 illustrating inductive coupling link of the conventional chip-to-chip wireless communication. However, for very short communication distance, inductive coupling through coils has its coupling strength decaying as $1/X^6$, where X is the coupling distance. The reported communication distance is less than 1 mm. For large package/die area for the coil, coupling coefficient is directly related to the geometric means of self-inductance of the coils. To increase the coupling coefficient giving the coupling distance, the size of the coil must be increased accordingly. In addition, inductive coupling is sensitive to the misalignment between the coupled coils and has a significant lateral interference between the intra-pairs on the same package.

Thus, a chip-to-chip communication system according to various aspects avoids or reduces the interference, the communication range, and data rate problems under the space constrains. The short-distance wireless coupler according to various aspects may enable a small form factor, a polarization diversity, and a frequency diversity. Through simulations, the package-to-package RF modulated, wireless interface supports a communication range up to 1.5 cm to about 6 cm with 500 Mbps or a higher data rate.

Illustratively, a package-to-package, RF modulated, wireless interface is provided in various aspects that supports communication up to 1.5 cm to 6 cm at 500 Mbps or higher using dual planar coupling structures. A dual planar coupling structure can have a ring structure and a patch in multiple layers to enhance the coupling efficiency besides having them work together to achieve targeted operational frequencies. By exciting them accordingly, at least one of the frequency diversity or the field orthogonality can be accomplished. Also coupling two resonating modes, a wider impedance bandwidth can be achieved. In addition, properly arranging the couplers with frequency diversity and field orthogonality in adjacency promotes high isolation among adjacent communication channels.

Hence, using a dual planar coupling structure according to various aspects, less foot-print on the printed circuit board, higher isolation among couplers in a close proximity, longer air interconnection distance, e.g. 5 times longer than the inductive coupling, and less transceiver layout complexity, lower cost, and lower power consumption can be enabled.

In various aspects, the chip-to-chip communication system includes an edge-shorted coupler with ring structure and offset-fed coupler with corrugated edge ring structure.

Figure 50A:
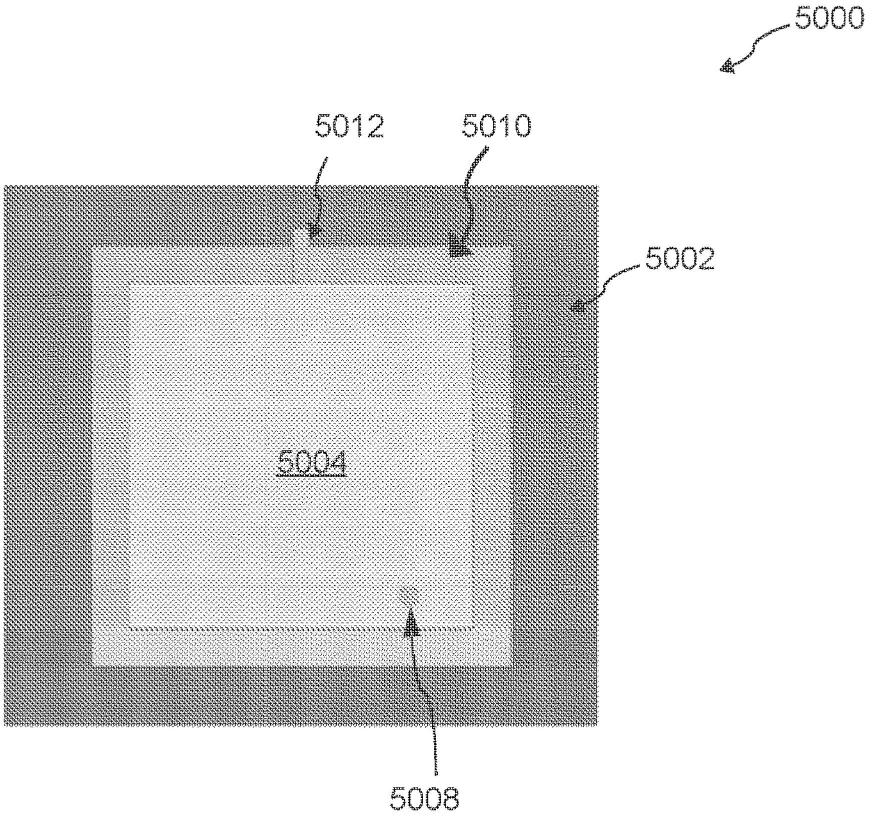
FIG. 50A to FIG. 50C exemplarily show an example of a dual planar coupling structure according to various aspects.
Figure 50B:
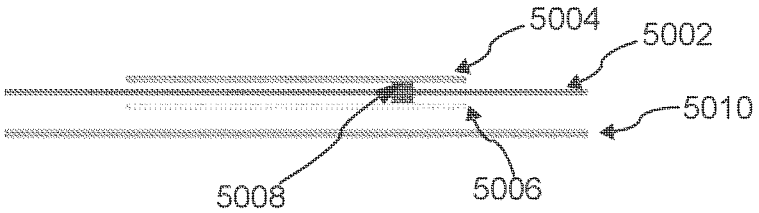
Figure 50C:
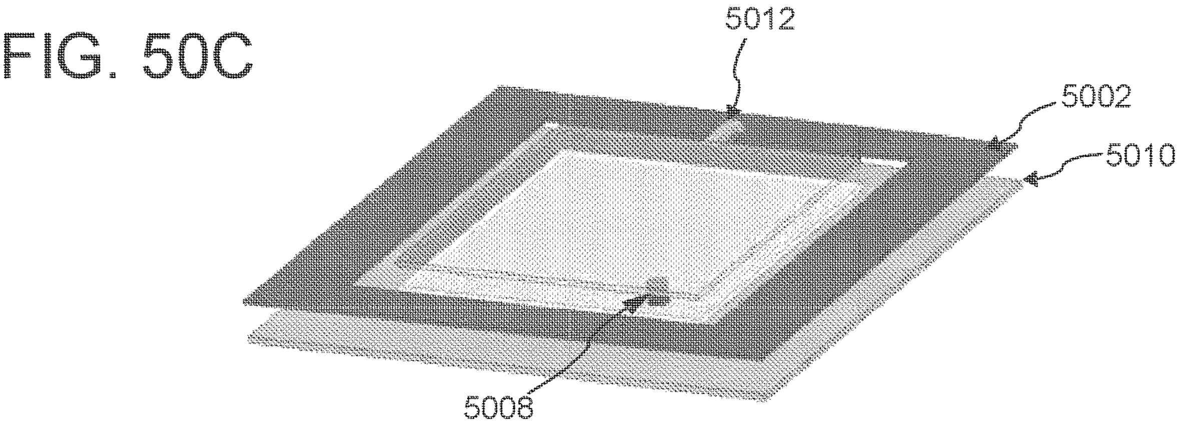

FIG. 50A to FIG. 50C schematically illustrate an example of a dual planar coupling structures according to various aspects. FIG. 50A illustrates a top view, FIG. 50B illustrates a cross-sectional view and FIG. 50C illustrates a 3-D perspective view. The chip-to-chip communication system includes a dual planar coupling structure 5000 with a ring structure 5002, as described in more detail in the following, to simulate the structure with the ring structure 5002 and without the ring structure 5002. The coupler 5000 may include two stacked patches 5004, 5006 and the ring structure 5002. The stacked patches 5004, 5006 are located on a top layer and a third layer from the top. The stacked patches 5004, 5006 can be edge-shorted through a TSV 5008. The TSV 5008 can be arranged off from the center of at least one of the patches 5004, 5006, e.g. close to an edge of at least one of the patches 5004, 5008. The ring structure 5002, e.g. on the second layer from the top, can work as at least one of a coupler or an impedance matching network. A finite ground plane 5010 can be arranged on the fourth layer from the top. The area of the example layout can be 5 mm×5 mm, as an example. The targeted resonant frequency can be in the sub-10 GHz range, e.g. in a range from about 6 GHz to about 8 GHz.

The coupler 5000 can excited through a microstrip feed 5012 in the center of the top patch 5004. With different TSV locations, different current modes can be excited that can result in different resonant frequency and impedance bandwidths. The current distributions on both the top patch 5004 and along the ring structure 5002 are presented in FIG. 51A to FIG. 51D. In order to maximize the impedance bandwidth, the TSV is off from the center of the patch. FIG. 51A to FIG. 51D show the effect of the ring structure 5002 of a dual planar coupling structure 5000 according to various aspects. Here, FIG. 51A to FIG. 51D illustrate simulated S-parameter and field of the Invented Coupler with FIG. 51A illustrating current distribution at 8.25 GHz, FIG. 51B illustrating the coupler without vs. with Ring $S_{11}$ Comparison in a first diagram 5100, and FIG. 51C and FIG. 51D illustrate an E-field 5102 at 8 GHz without ring structure (FIG. 51C) vs. an E-field 5104 at 8 GHz with the ring structure (FIG. 51D).

Thus, to demonstrate the impact of the ring structure 5002 on the coupler 5000 performance, a coupler without the ring structure is simulated (see FIG. 51B and FIG. 51C). Its performance is compared with the performance of the coupler with the ring structure. The comparison presented illustrates that the presence of the ring structure significantly impacts the impedance matching of the coupler since the layout with the ring structure has 481 MHz impedance matching bandwidth while the layout has a reflection higher than −2.5 dB across the whole band. Also, the electrical field (E-field) on E-plane for these two layouts at 8 GHz are compared in FIG. 51B. Apparently, the presence of the ring structure 5002 creates more uniformed near field than the one without the ring structure.

Figure 52A:
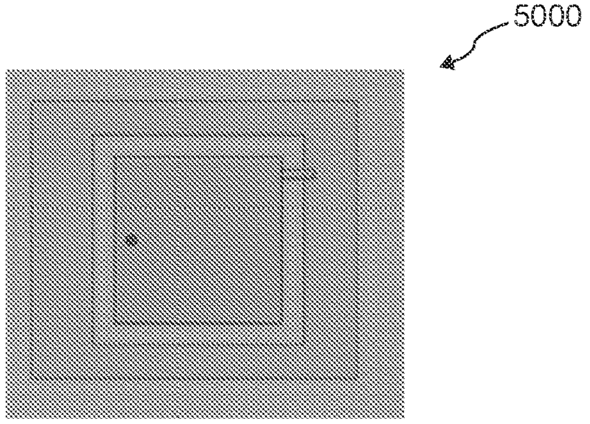
FIG. 52A to FIG. 52D exemplarily show the effect of an example of a dual planar coupling structure according to various aspects.
Figure 52B:
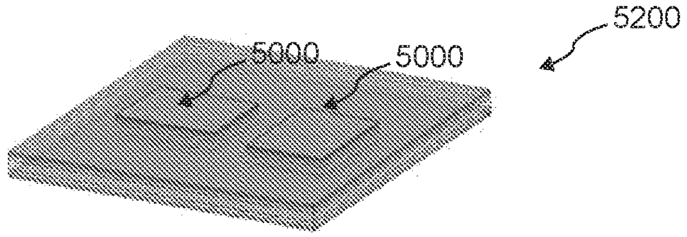
Figure 52C:
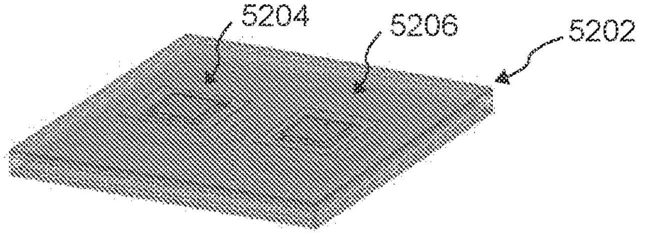
Figure 52D:
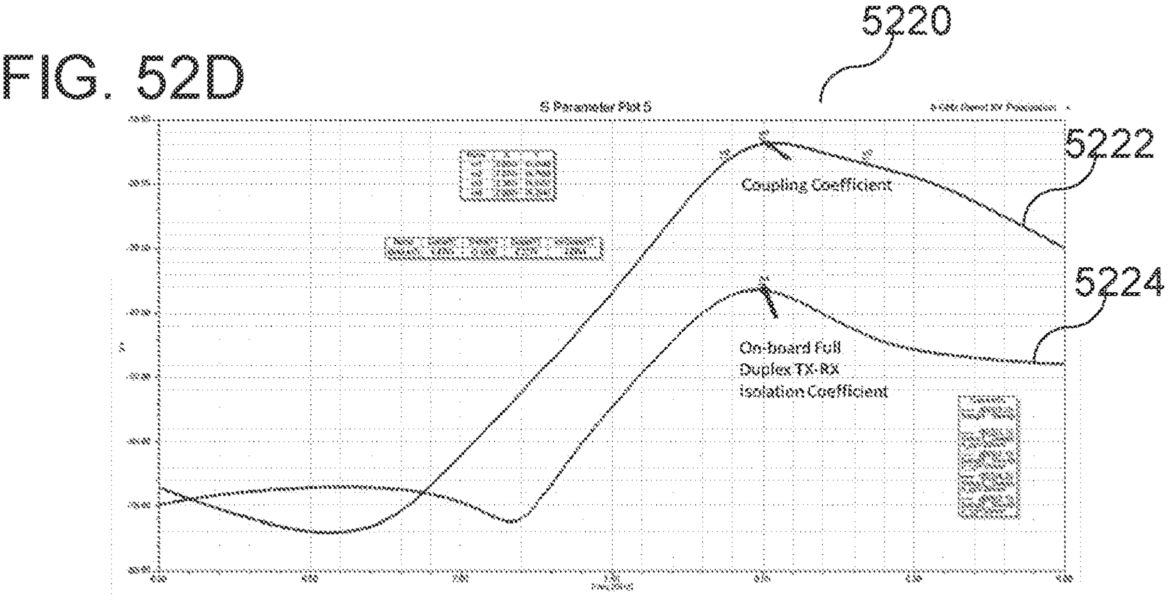

FIG. 52A to FIG. 52D illustrates an edge shorted coupler full duplex antenna according to various aspects with FIG. 52A illustrating a top-down view of a single coupler, FIG. 52C illustrating a 3-D view of 2 couplers 5204, 5206, and FIG. 52D illustrating in a diagram 5220 simulated air link (solid line 5222) and duplex isolation (dashed line 5224) performance. The performance of this aspect is evaluated through simulating in its full duplex communication configuration shown in FIG. 52B. It is to be noted that the via 5008 (see FIG. 50A) is located at a center of the patch while a microstrip feed is offset from the center of the patch. At 1.5 cm coupling distance, the layout has the peak TX-RX air coupling of −13.8 dB and 470-MHz 3-dB coupling bandwidth as demonstrated in FIG. 52D as a solid line while the on-board duplex isolation is −36.9 dB marked as a dashed line in FIG. 52D.

Figure 53:
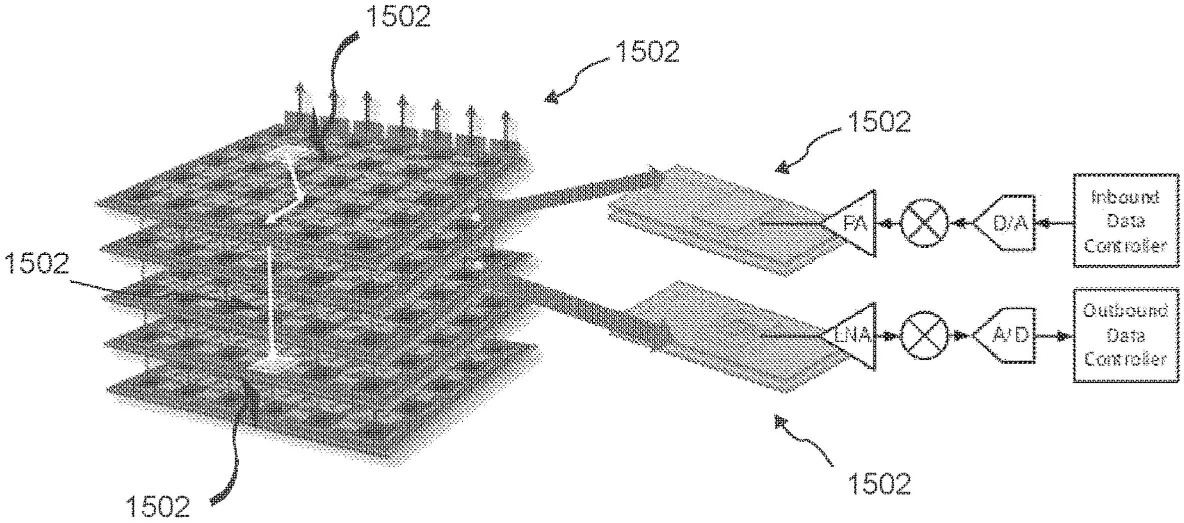
FIG. 53 exemplarily shows a circuit simulation illustrating a circuit simulation setup.

The effectiveness of the coupler layout presented in FIG. 52C is evaluated through a circuit simulation illustrated in FIG. 53 illustrating a circuit simulation setup. Transistor level circuits and behavioral models for the transmitter and the receiver respectively have been included in the simulation and EM simulation model for the coupler with 30 mm coupling distance has also been embedded. The following stream of 12 symbols has been used for simulation: (ON, 180°), (ON, 0°), (OFF), (ON, 180°), (ON, 180°), (OFF), (ON, 0°), (ON, 180°), (OFF), (ON, 0°), (ON, 0°), and (OFF).

Figure 54:
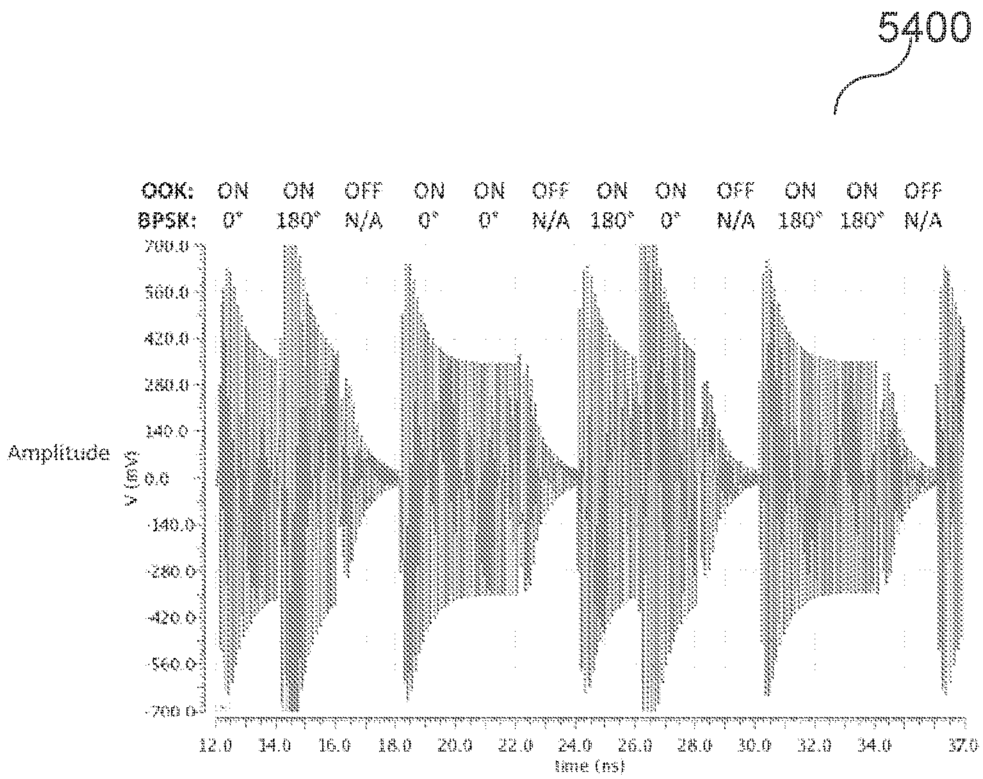
FIG. 54 exemplarily shows a transmitted 8 GHz RF signal with OOK+BPSK modulation and 750 Mbps data rate according to various aspects.

FIG. 54 illustrates a transmitted 8 GHz RF signal with OOK+BPSK modulation and 750 Mbps data rate from the transmitter in a transmission diagram 5400.

Figure 55:
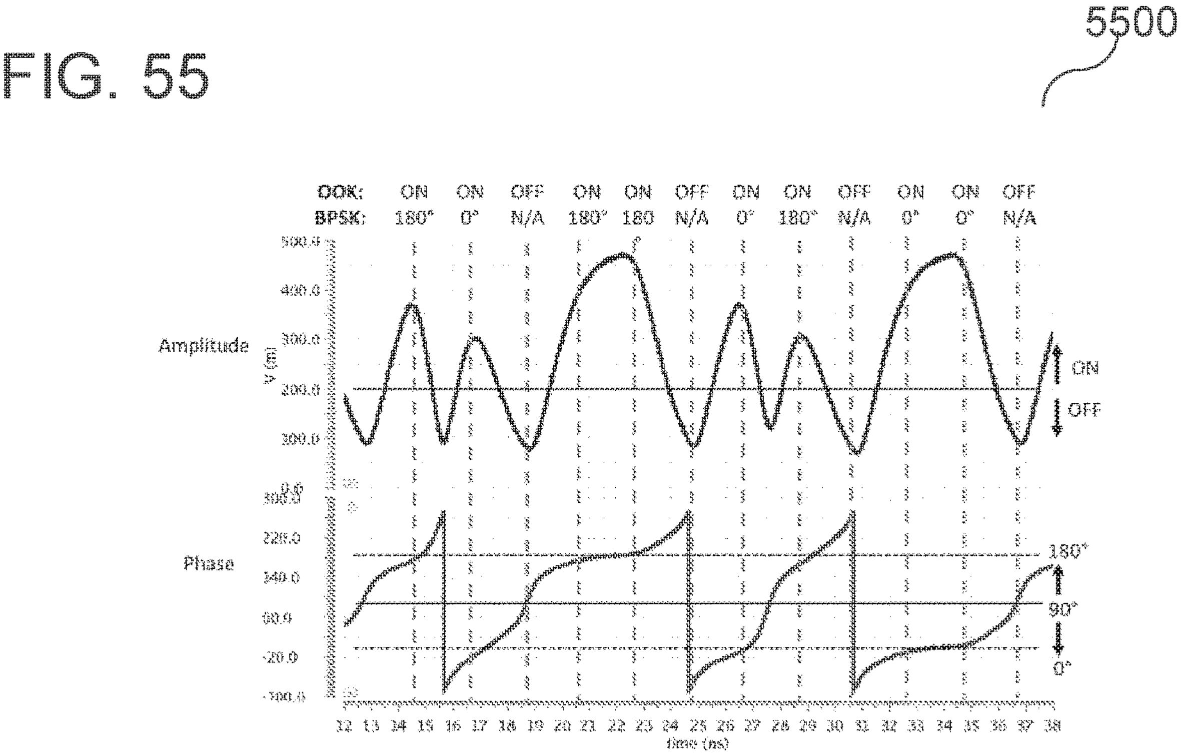
FIG. 55 exemplarily shows a received baseband signal after down-conversion according to various aspects.

FIG. 55 illustrates received baseband signal after down-conversion in a diagram 5500. FIG. 55 shows the signal on the receiver side after down-converting into baseband frequency. As shown in the FIG. 55, both OOK and BPSK information is well maintained in the amplitude and phase domain in baseband, which can lead to straightforward demodulation in digital baseband after ADC.

Figure 56A:
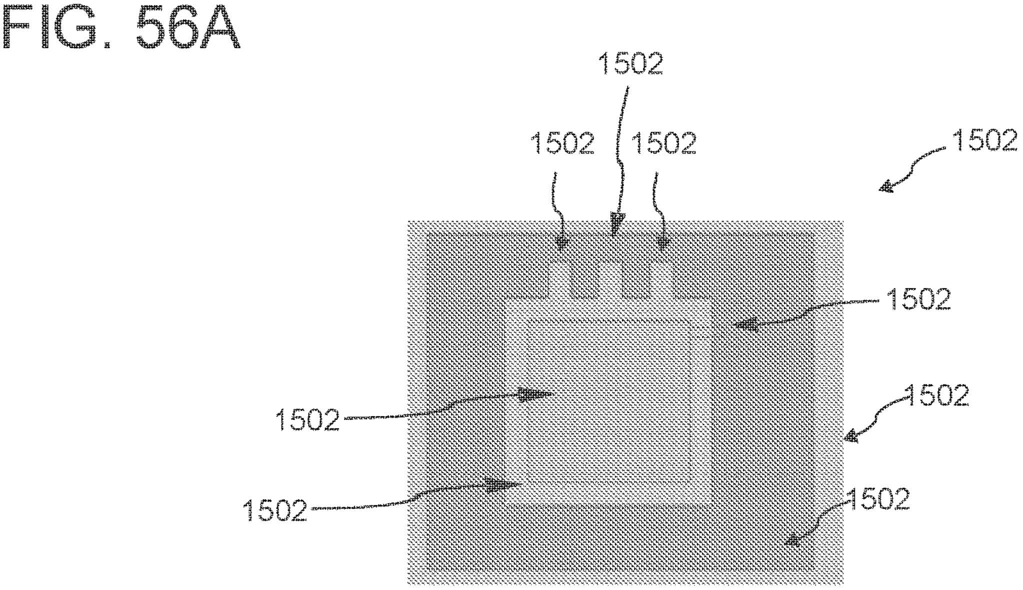
FIG. 56A exemplarily shows a top-down view of an offset-fed coupler with corrugated edge ring structure according to various aspects.
Figure 56B:
FIG. 56B exemplarily shows a side view of an offset-fed coupler with corrugated edge ring structure according to various aspects.
Figure 56C:
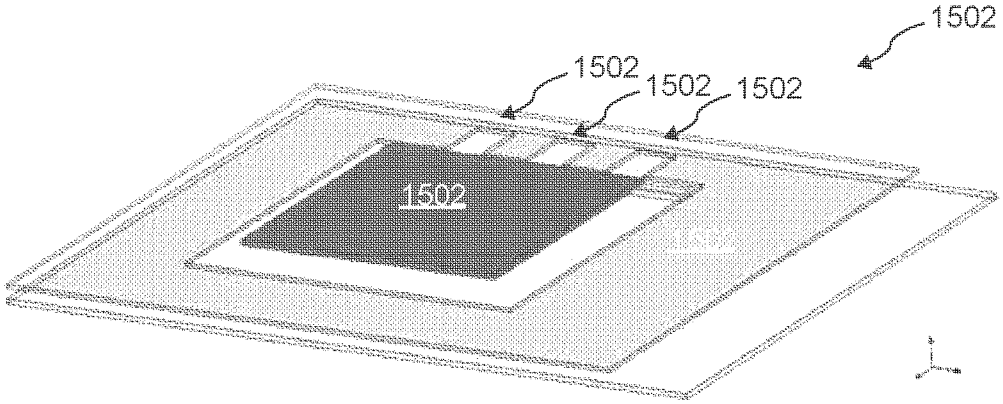
FIG. 56C exemplarily shows a 3-D view of an offset-fed coupler with corrugated edge ring structure according to various aspects.

FIG. 56A to FIG. 56C illustrates an offset-fed coupler with corrugated edge ring structure with FIG. 56A illustrating a top-down view, FIG. 56B illustrating a side view and FIG. 56C illustrating a 3-D view. The coupler is constituted by a patch on the top (highlighted in FIG. 56C), a corrugated edge ring structure on the second layer, and a finite ground plane on the third layer. It is to be noted that only single edge of the ring structure is corrugated. Feed of the coupler is realized through an offset strip. For the illustrated example, the area is 5 mm×5 mm. The TX-RX separation for the duplex is 9.5 mm.

Figure 57A:
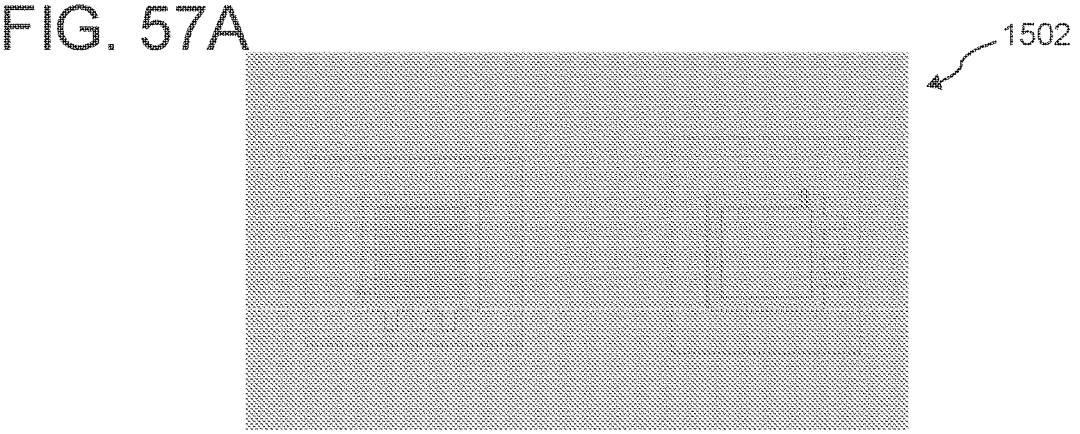
FIG. 57A exemplarily shows a top-down view of an offset-fed coupler with corrugated edge ring structure for full duplex antenna according to various aspects, FIG. 57B exemplarily shows a 3D view of an offset-fed coupler with corrugated edge ring structure for full duplex antenna according to various aspects.
Figure 57B:
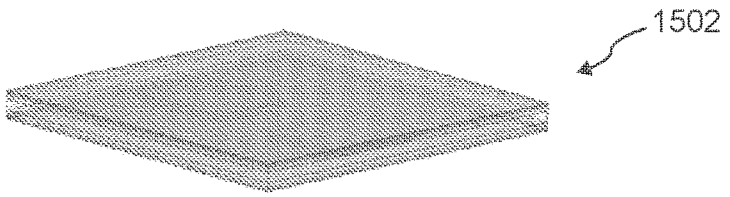
FIG. 57C exemplarily shows a 3D view of an offset-fed coupler with corrugated edge ring structure for full duplex antenna according to various aspects.
FIG. 57D exemplarily shows an S-parameter plot of an offset-fed coupler with corrugated edge ring structure for full duplex communication according to various aspects.
Figure 57C:
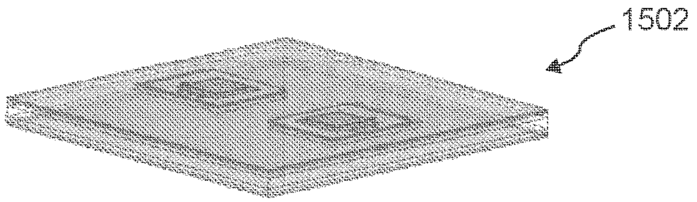
Figure 57D:
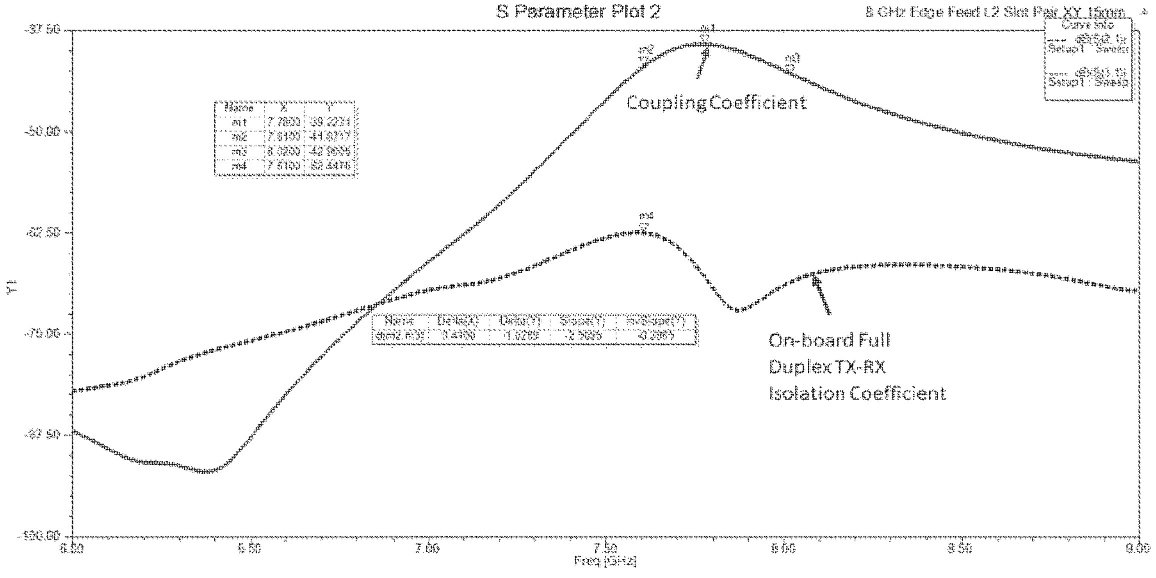

To evaluate the performance of the coupler, a model presented in FIG. 57A is created to simulate the two full duplex pair communication. As demonstrated in FIG. 57B, the coupler gives the peak coupling coefficient of −39.28 dB at 1.5 cm coupling distance (receiver sensitivity: −60 dB). The duplex isolation is below −40 dB (simulation reported −62.5 dB) and the 3-dB coupling-coefficient bandwidth is 410 MHz FIG. 57A to FIG. 57D illustrate offset-fed coupler with corrugated edge ring structure for full duplex with FIG. 57A illustrating a top-down view, FIG. 57B and FIG. 57C illustrating a 3D view and FIG. 57D illustrating a S-parameter plot.

A symmetric corrugated offset-fed coupler shown in FIG. 58 is formed and a performance in a full duplex setup is simulated. The simulated coupling coefficient and the isolation are compared to the offset-fed layout. The comparison presented in FIG. 57D indicates the offset-fed one has almost 1 dB higher coupling coefficient and about 4 dB higher isolation relative to the symmetric layout.

Figure 58A:
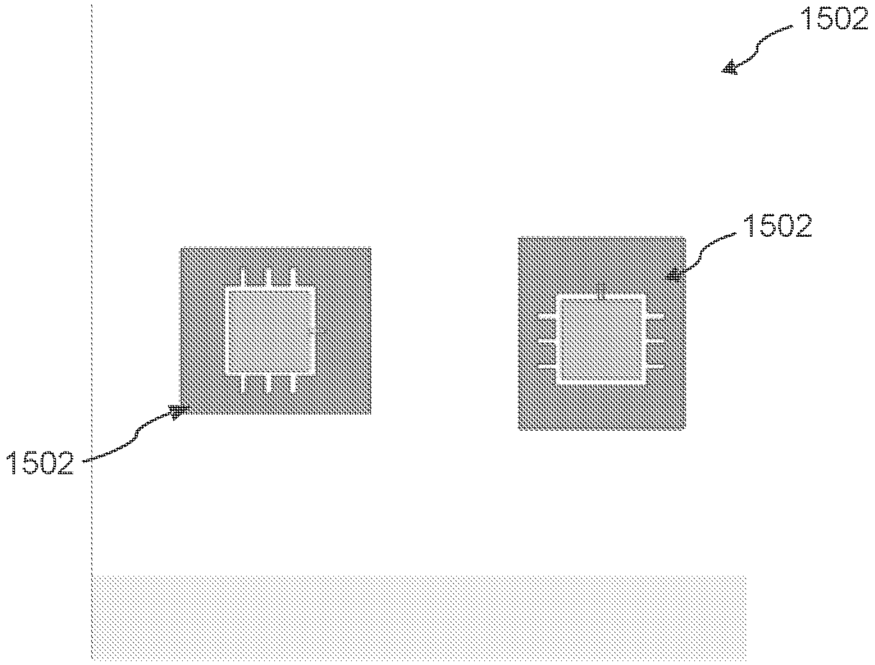
FIG. 58A exemplarily shows a top-down view of a symmetrical corrugated edge ring structure layout according to various aspects.
Figure 58B:
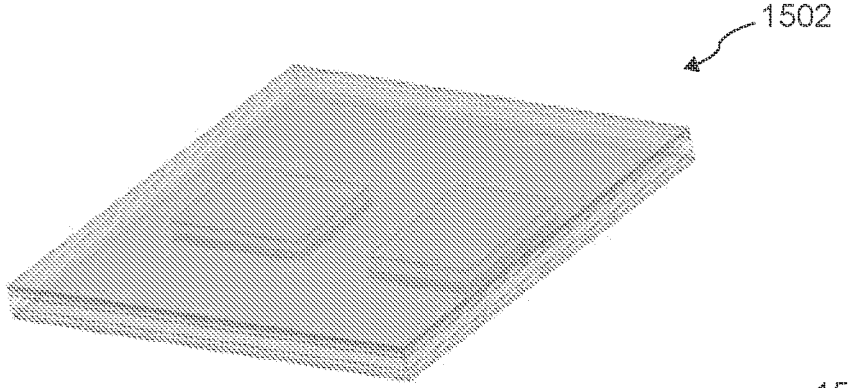
FIG. 58B and FIG. 58C exemplarily show a 3D view of the symmetrical corrugated edge ring structure layout according to various aspects.
Figure 58C:
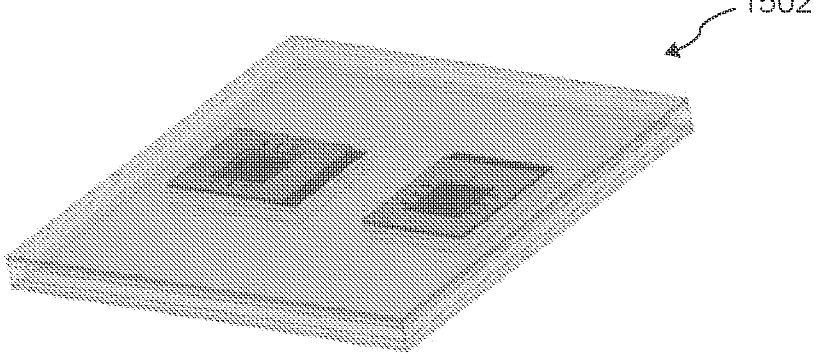

FIG. 58A to FIG. 58C illustrate a symmetrical corrugated edge ring structure layout with FIG. 58A illustrating top-down view and FIG. 58B and FIG. 58C illustrating a 3D view. FIG. 58C illustrates a coupling and isolation comparison (symmetrical layout vs offset layout).

Figure 59:
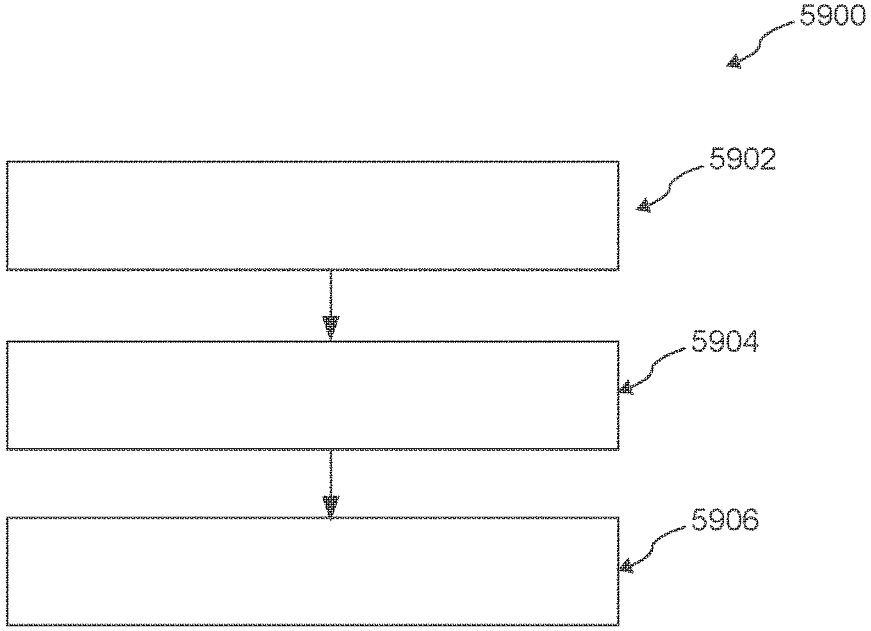
FIG. 59 exemplarily shows a flow chart of a method to operate a chip-to-chip communication system according to various aspects.

FIG. 59 illustrates flow diagram of a method 5900 to operate a chip-to-chip communication system according to various aspects. The chip-to-chip communication system may include a first chip on a first carrier and a second chip on a second carrier. Each of the first carrier and the second carrier may include a first side and a second side opposite to the first side. The first chip may be arranged on the first side of the first carrier and the second chip may be arranged on the first side of the second carrier. The first side of the second carrier may be arranged to face the second side of the first carrier. The first carrier may further include a TSV coupled to the first chip and extending through the first carrier from the first side to the second side. The chip-to-chip communication system may include a radio frequency signal interface wirelessly communicatively coupling the first chip to the second chip, the radio frequency signal interface may include the TSV of the first carrier.

The first carrier may further include a waveguide structure. The first chip may be coupled to the TSV through the waveguide structure.

The radio frequency signal interface may include or may be a near-field communication interface.

The first carrier and the second carrier may be stacked over each other.

The radio frequency signal interface may further include a planar wireless coupler.

The first carrier may include the planar wireless coupler.

The planar wireless coupler may include a feed line coupled to a conductor loop structure. The conductor loop structure laterally surrounds the TSV.

At least one of the first carrier or the second carrier may be a printed circuit board.

A third carrier may be arranged between the first and second carrier. In other words, a third carrier may be arranged in the signal path of the radio frequency signal interface.

The TSV may be exposed at the second side.

In various aspects, the chip-to-chip communication system may further include a first package and a second package. The first package may include the first chip and the second package may include the second chip.

In various aspects, a method of operating a chip-to-chip communication system may include: determine a position vector of the second chip relative to the first chip 5902, determine a predefined electrical field distribution depending on the determined vector 5904 including a voltage for a ring structure surrounding the via associated with the electrical field distribution, and apply the determined voltage to the ring structure.

As described above in the context of FIG. 21A to FIG. 22B, heterogeneous integrating technologies face many interconnect challenges that must balance cost, time-to-market (TTM), latency, data rates, complexity and thermal/mechanical impacts. As discussed above, reflection may be dominant at the sub-10-GHz frequency range while absorption may be dominant at sub-THz frequency range. TIM (thermal interface material) may be often optimized for maximum thermal coupling between chips and IHS. Its electrical properties of TIM have been overlooked for a potential wireless channel. The mold channel between the silicon and IHS acts like a waveguide and its cut-off frequency may be often in mmW band. These channels have its own characteristics and frequency dependency, one can consider combination of these channels to address various control-plane and data-plane scenarios in wireless chip-to-chip communications. Because chips often have a low-profile form factor, horizontally-polarized antennas have been considered in literature. However, when package layers have dense metal patterns, signals from the horizontally-polarized antennas cannot propagate longer range due to the cancel-out between radiating currents and image currents as illustrated in FIG. 60.

Figure 60:
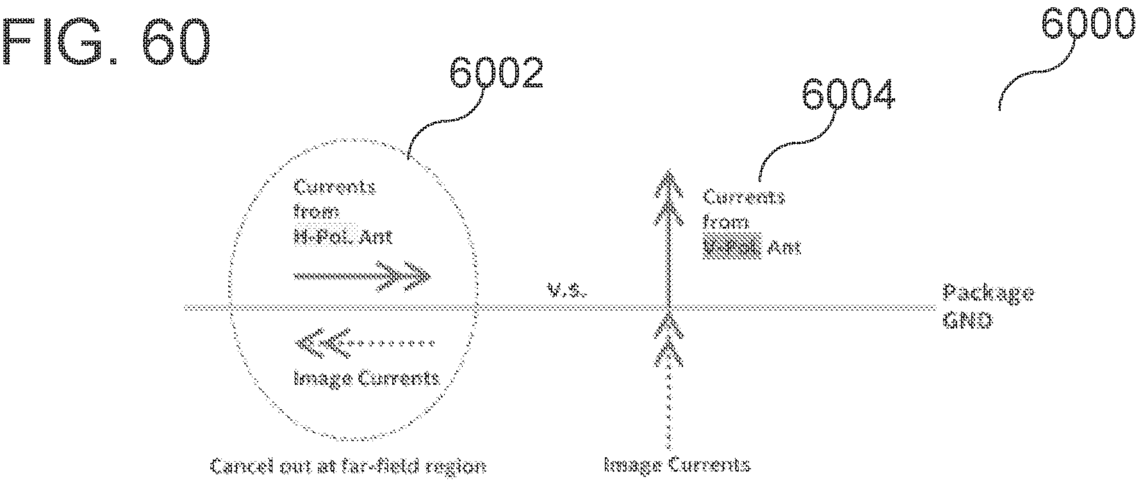
FIG. 60 exemplarily shows image currents of a horizontally polarized antenna and a vertically-polarized antenna over package ground.

FIG. 60 illustrate image currents of a horizontally polarized antenna 6002 and of a vertically-polarized antenna 6004 over package ground in a current diagram 6000. Thus, vertically polarized antennas may be preferred for point-to-multipoint control/data messaging. In various aspects, the height of the vertically-polarized antenna may be practically limited to about 1 mm to about 1.5 mm by the low-profile nature of the chiplets.

As an example of a 1.5 mm antenna height, the antenna becomes an electrically-small antenna having a frequency below 20 GHz. The antenna can suffer from low radiation resistance and high reactance in antenna input impedance. Thus, the antenna can have at least one of a narrow operational bandwidth or low radiation efficiency.

Figure 61:
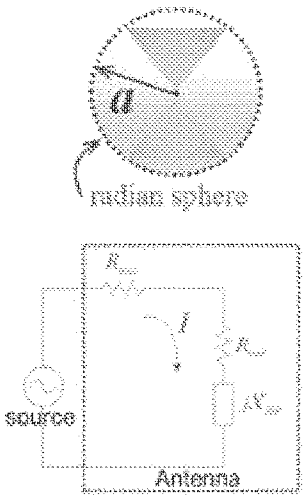
FIG. 61 exemplarily shows a definition and an illustration of electrically-small antennas.

The definition and challenges of electrically-small antennas are summarized in FIG. 61 using a well-known, simplified circuit model 6100. FIG. 61 depicts a definition and an illustration of electrically-small antennas where “a” may be radius of radian sphere just enclosing antenna, “$P_{rad}$” may be a radiating power, “I” may be the current flowing on the antenna, and “$R_{rad}$” may be the radiation resistance of the antenna, and “$X_{ant}$” may be the reactance of the antenna input impedance.

In various aspects, the radiated power ($P_{rad}$) from an antenna may be proportional to the radiation resistance ($R_{rad}$) and current (I) of the antenna, e.g. $P_{rad}$~$|I|^2R_{rad}$.

The radiation resistance can be boosted with impedance matching techniques. However, the radiation resistance can be inherently limited by the low-profile requirement of the in-package vertically-polarized antennas. On the other hand, there may be still a room to increase the current (I) by considering antenna structural topology.

Figure 62A:
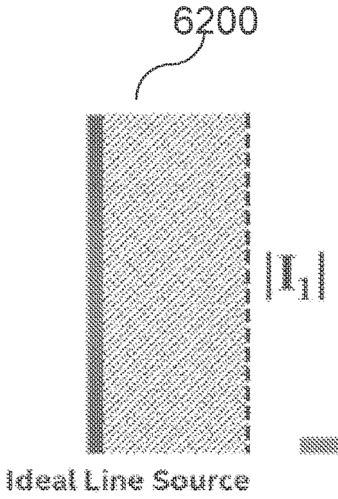
FIG. 62A to FIG. 62F exemplarily show current distributions of various vertically-polarized antennas.
Figure 62B:
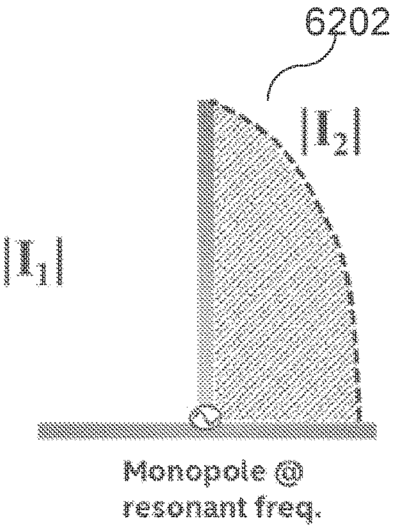
Figure 62C:
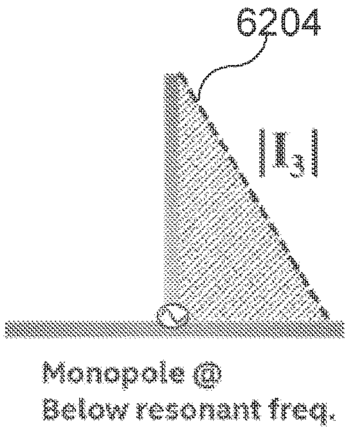
Figure 62D:
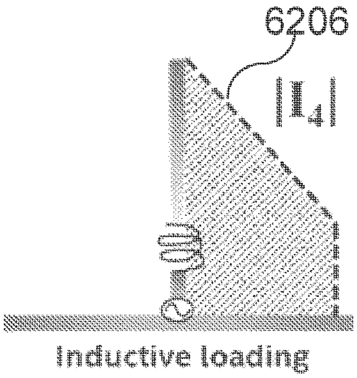
Figure 62E:
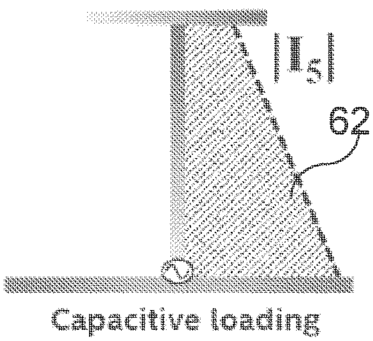
Figure 62F:
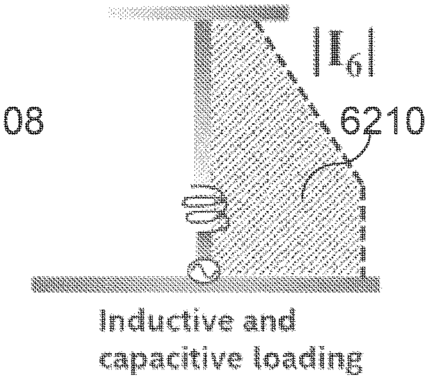

Current distributions of various vertically-polarized antennas are depicted in FIG. 62A to FIG. 62F for illustration. FIG. 62A to FIG. 62F depict current distribution profiles of various vertically-polarized antenna configurations. The line source would create rectangular current distribution ($|I_1|$) 6200 (FIG. 62A), offer the highest radiated power, and set a theoretical upper boundary. When full-size vertically-polarized antenna over a ground, such as quarter-wave monopole, is considered, the current would have a sinusoidal distribution ($|I_2|$) 6202 (FIG. 62B). When the antenna becomes an electrically-small antenna by reducing antenna height and/or driving the antenna below fundamental resonant frequency, the current profile changes to triangular shape ($|I_3|$) 6204 (FIG. 62C). In order to boost the currents, inductive loading ($|I_4|$) 6206 (FIG. 62D), capacitive loading ($|I_5|$) 6208 (FIG. 62E) with top-loading structure, and both capacitive and inductive loadings ($|I^6|$) 6210 (FIG. 62F) can be considered.

Thus, the magnitude order of the currents could be list as the following: $|I_1|>|I_2|>|I_6|>|I_4|$, $|I_5|>|I_3|$.

By way of example, current profiles $|I_5|$ and $|I_6|$ can imply that antenna radiating power performance could be enhanced if the vertically-polarized antenna is connected to the IHS (integrated heat spreader) of the package or heat sink if there is no IHS in the package.

Figure 63A:
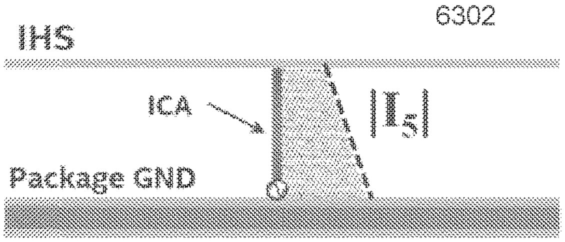
FIG. 63A to FIG. 63B exemplarily show example antenna structural topologies of IHS-connected antennas in cross-sectional view according to various aspects.
Figure 63B:
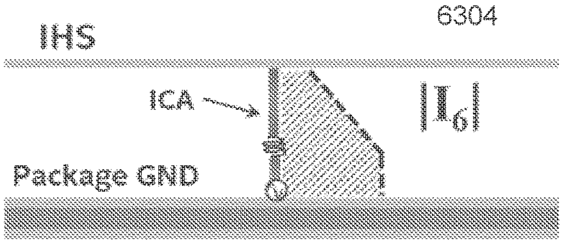

A metallic IHS or heat sink coupled to the antenna can act like a capacitive loading effect to boost the current profile for achieving higher antenna radiating power as further illustrated in FIG. 63A and FIG. 63B.

Figure 64A:
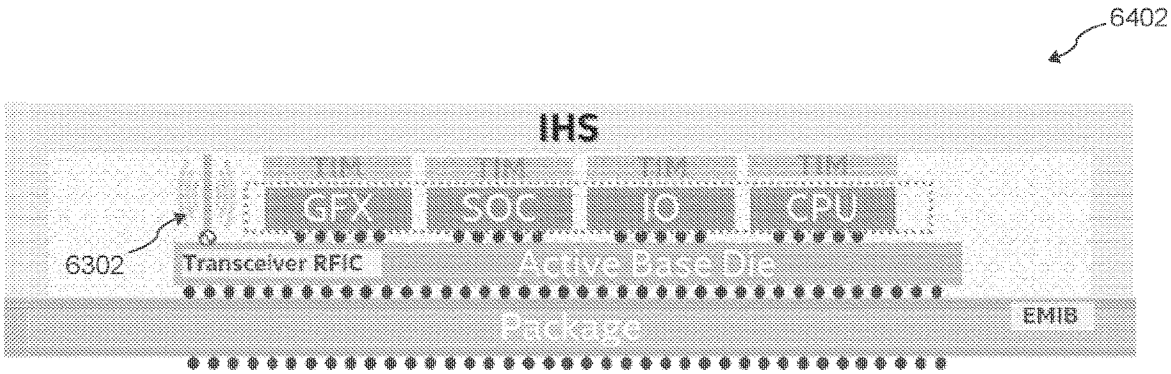
FIG. 64A, FIG. 64B and FIG. 65 exemplarily show schematic cross-sections of example antenna structural topologies of ICA according to various aspects.
Figure 64B:
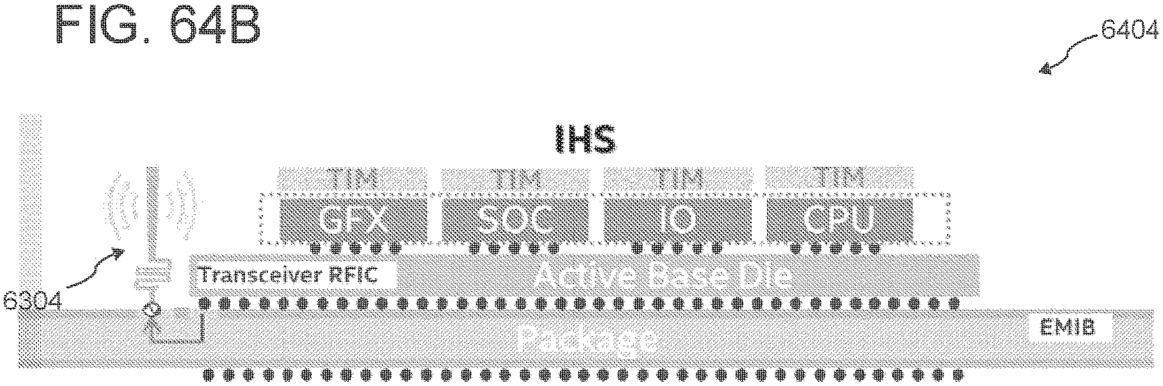
Figure 65:
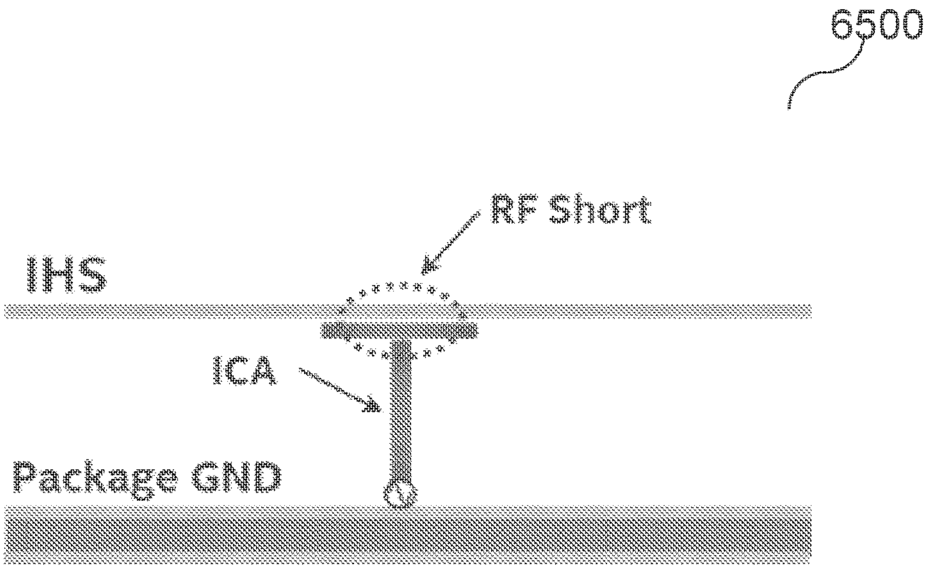

FIG. 63A, FIG. 63B, FIG. 64A and FIG. 64B depict packaged 6402, 6404 having example antenna structural topologies of IHS-connected antennas (ICAs) in cross-sectional view—FIG. 63A and FIG. 64A antenna 6302 with $|I_5|$, and FIG. 63B and FIG. 64B antenna 6304 with $|I_6|$. Thus, ICA-structures may be referred to connect the feed antenna from at least one of a base die, a package carrier, or a chiplet to IHS. The ICA-structure can create vertically-polarized, broadband antennas, and can enable long range wireless communications under in-package guided-wave environments leveraging the IHS (or heat spreader) and the package ground. In addition, the connection between the feed antenna and IHS (or heat sink) does not necessarily have to be a physical connection. Instead, the connection can also be a radio frequency short as shown in FIG. 65. FIG. 65 depicts a schematic cross-section 6500 of an example antenna structural topology of ICA with RF short circuit at the top loading according to various aspects.

Figure 66:
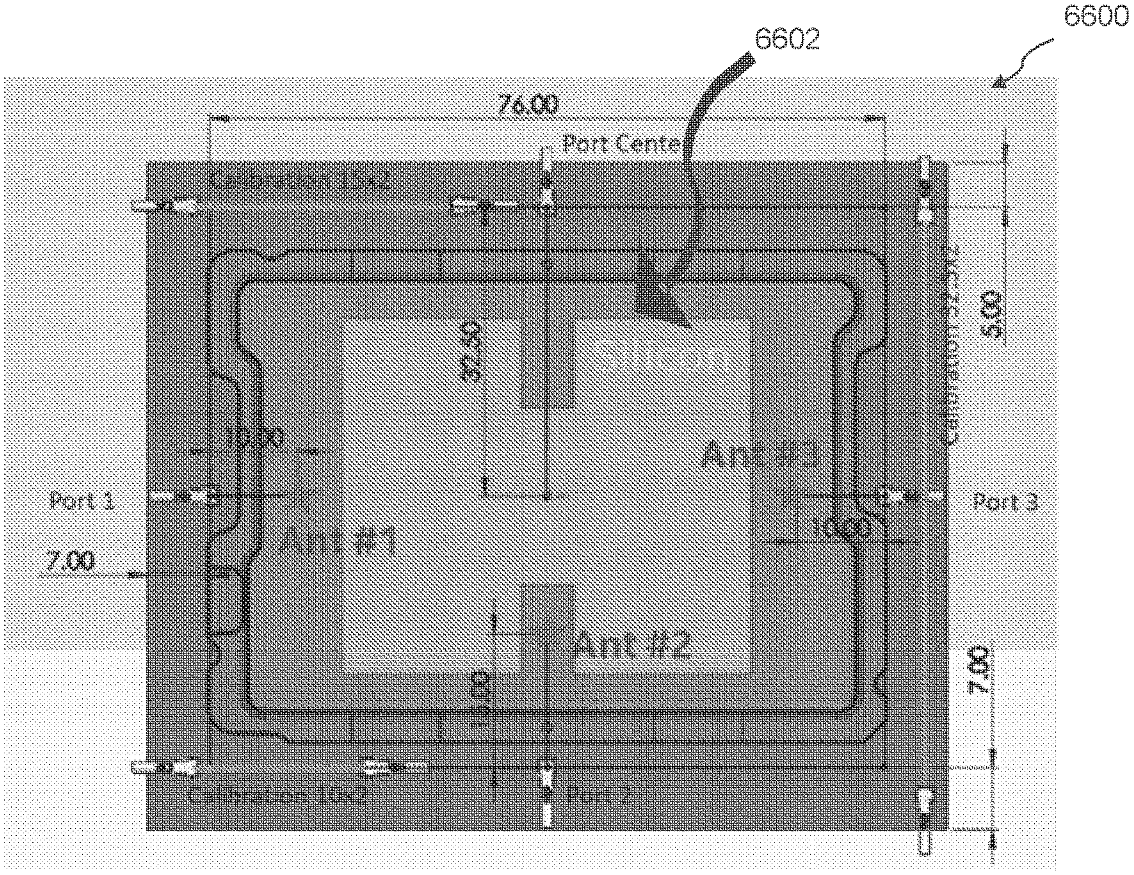
FIG. 66 exemplarily shows a simulation setup to illustrate the ICA performance and benefits compared to a monopole antenna.

FIG. 66 illustrates a simulation setup 6600 to illustrate the ICA performance and benefits compared to a monopole antenna of the related art.

In the simulation setup 6600, a H-shaped silicon 6602 with 10 S/m conductivity is located at the center of a package. The H-shaped silicon 6602 can represent a simplified array of heterogeneous chiplets on or over a common base die. In other words, the simulation setup illustrated in FIG. 66 can be seen as a simplified simulation model of the structure illustrated in FIG. 64B.

Three vertical antennas may be placed under the IHS, e.g. between the base die and the IHS. The antennas are denoted as Ant #1, Ant #2 and Ant #3 in FIG. 66.

The top layer of the package may be assumed to be covered with a copper. In a sense, these antennas Ant #1, Ant #2 and Ant #3 may be located inside a guided-wave structure of the enclosed metal cavity that may be formed from the IHS and the package ground as illustrated in FIG. 64A and FIG. 64B. Further, electrically non-conductive, thermal interface materials are arranged as TIM between the silicon and IHS and any gap between the IHS and the package ground may be filled with a mold material.

Figure 67A:
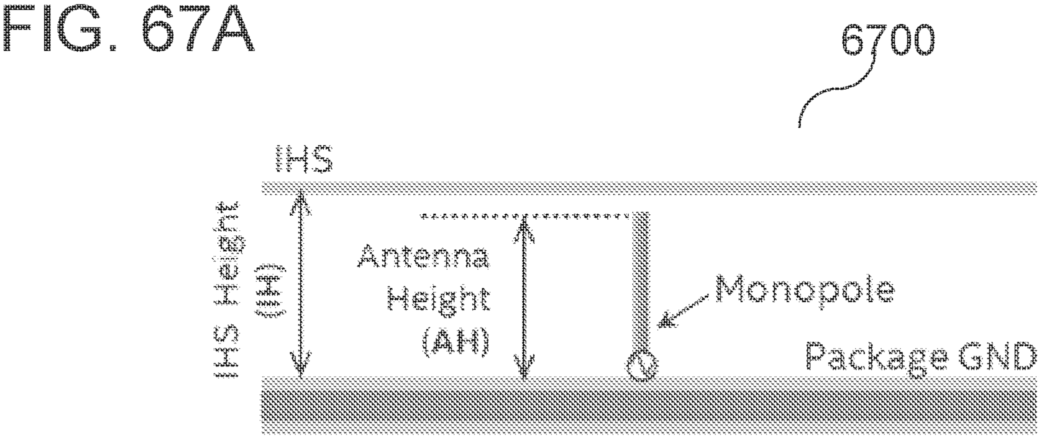
FIG. 67A exemplarily shows a monopole antenna.
Figure 67B:
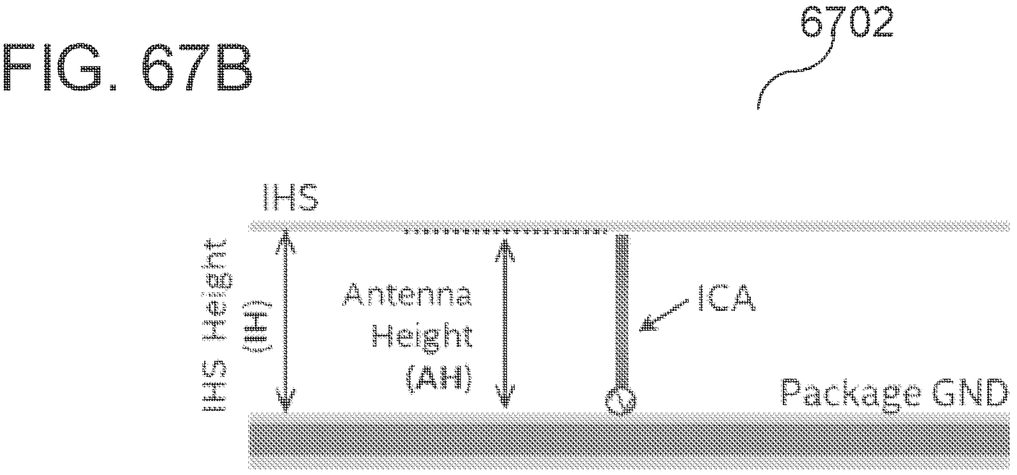
FIG. 67B exemplarily shows an ICA according to various aspects.

Potential cavity resonances in a targeted operational frequency range can be reasonably suppressed by the loading effects of silicon. FIG. 67A and FIG. 67B depicts a further illustration of the simulation setup for antenna performance comparison—with FIG. 67A showing a conventional monopole antenna 6700 and FIG. 67B showing an ICA 6702 according to various aspects.

Figure 68:
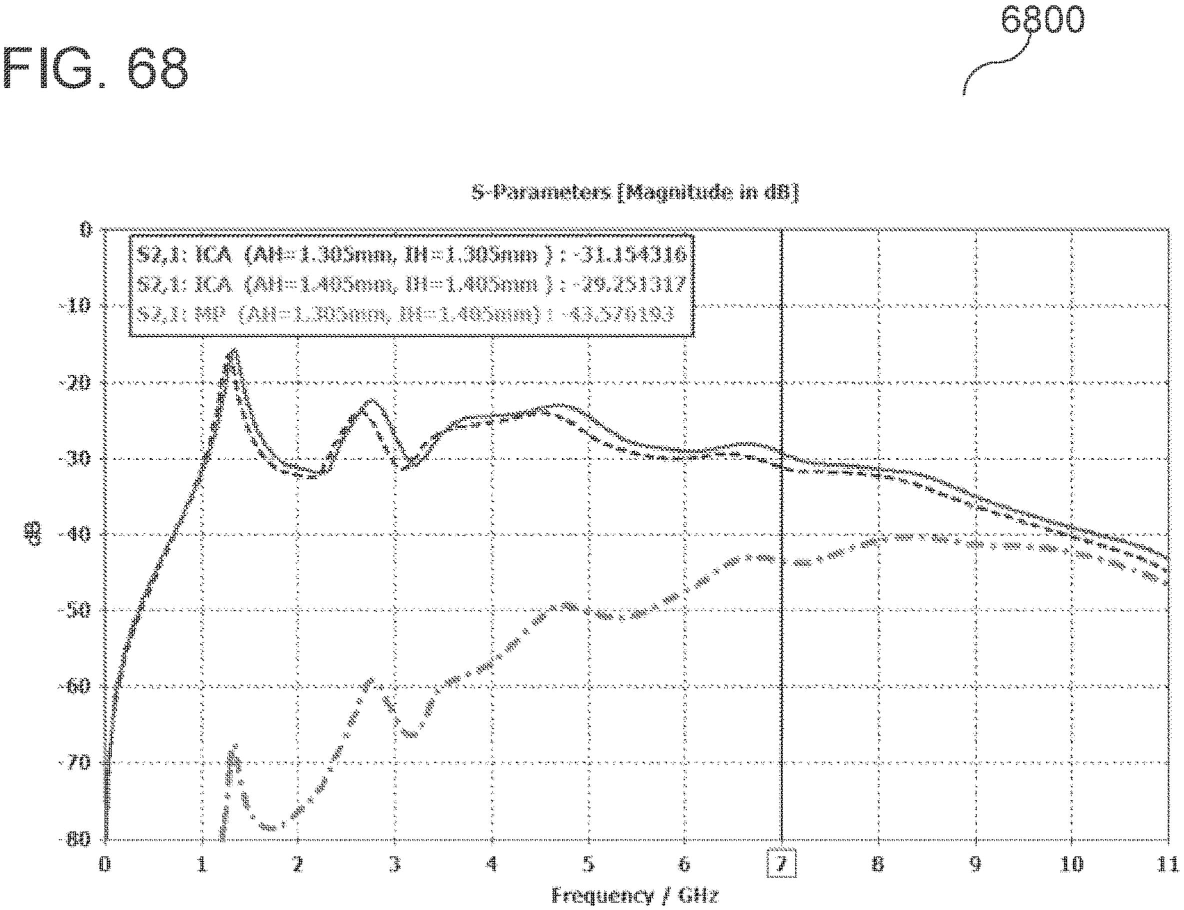
FIG. 68 exemplarily shows a link performance comparison between a monopole antenna of the related art and the ICA with various AH and IH values according to various aspects.

FIG. 68 illustrates a link performance comparison between a conventional monopole antenna and the ICA with various AH and IH values in a diagram 6800, assuming non-conductive thermal interface materials as TIM, according to various aspects. Illustratively, simulated link responses ($S_{21}$) between antenna port #1 and antenna port #2 illustrated in FIG. 68 may be compared between the conventional monopole antenna (FIG. 67A) and ICAs (FIG. 67B). Results of $S_{21}$ are illustrated in the diagram 6800 of FIG. 68. As illustrated, link response of ICAs may be outperforming that of monopole (MP) of the related art as operation frequency decreases. By way of example, ICA with AH=IH=1.305-mm case may be demonstrating that the performance difference comes from the structural topology of ICA, not from the antenna height variation when the ICA may be compared to the monopole case of the related art with AH=1.305 mm and IH=1.405 mm. As operational frequency increases or electrical antenna size increase, the performance difference decreases.

Figure 69:
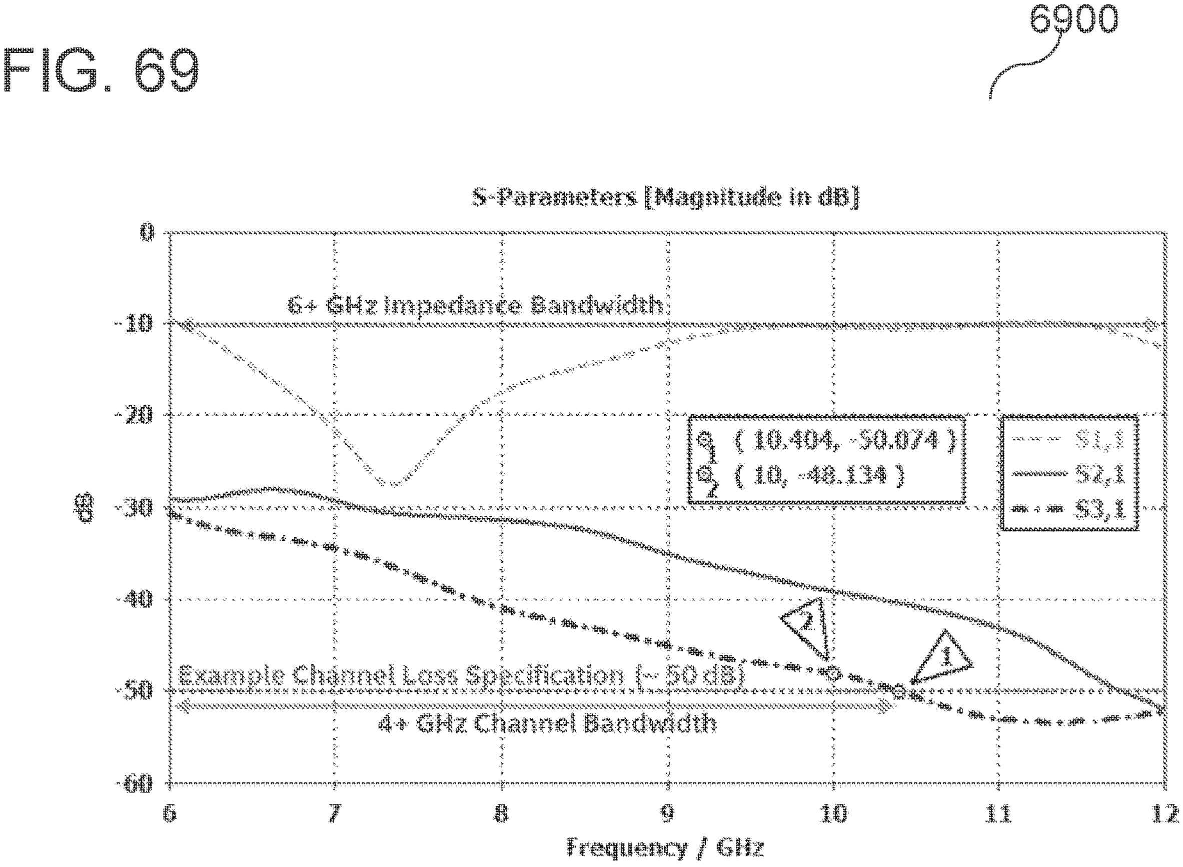
FIG. 69 exemplarily shows a wireless link performance between in-package ICAs and a reflection coefficient of driven ICA according to various aspects.

FIG. 69 shows a diagram 6900 illustrating a wireless link performance between in-package ICAs and a reflection coefficient of driven ICA (port #1 in FIG. 66) with AH=IH=1.405 mm and a non-conductive TIM. Impedance bandwidth may be larger than 6 GHz with 10-dB return loss criteria while its channel bandwidth may be larger than 4 GHz with example 50-dB channel loss criteria. Thus, ICAs are suitable in case high throughputs are required.

The boosted link response might come from "conduct RF" performance because ICAs can be directly connected through IHS, e.g. suspecting ICAs to form a transmission line. However, key difference between conducted RF (through transmission lines) and antenna radiation may be a received waveform. If a broadband Gaussian waveform is injected into one side (input) of a transmission line, a scaled version of the input pulse may be monitored on the other side (output) of the transmission line. However, if the RF pulse has been radiated, the received pulse can be a flipped scaled version of a derivative of the input Gaussian pulse due to the "−jω" factor in E-field expression of Maxwell's equations.

Pulses received in port #2 and port #3 (see FIG. 66) may be in the form of a flipped scaled version of a derivative of the input Gaussian pulse, which indicates that link performance of ICAs can be based on an antenna radiation, not conducted RF transmission.

In case of an electrically conductive TIM, a mold channel can be formed as an alternative or additional channel for RF waveguiding for in-package messaging. The mold channel between adjacent chiplets can be available for extremely short range (<1 mm) point-to-point wireless communications. However, in view of point-to-multipoint wireless communications in longer range, an evanescent propagation mode below cut-off frequency, high channel loss and low amplifier efficiency at mmW or sub-THz operation frequency are to be considered for the mold channel 2204. In various aspects of this disclosure, the cut-off frequency may exist in the mmW band.

Figure 70:
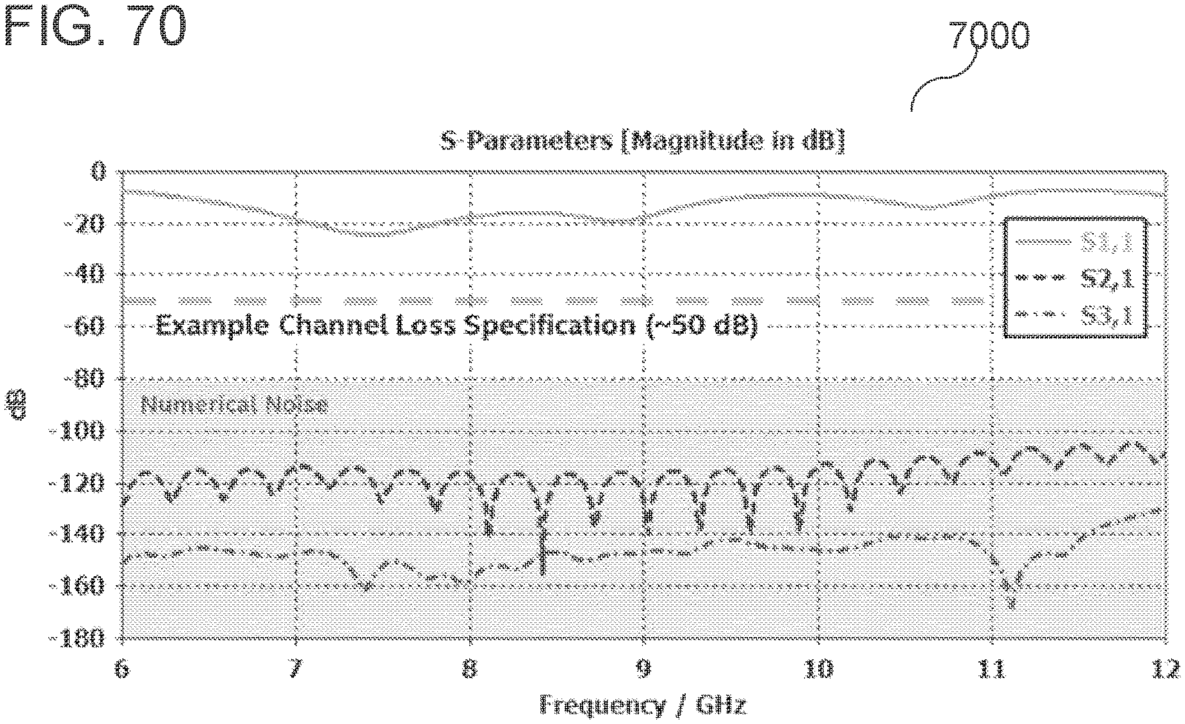
FIG. 70 exemplarily shows a wireless link performance between in-package ICAs and reflection coefficient of driven ICA according to various aspects.

FIG. 70 shows a further diagram 7000 illustrating a wireless link performance between in-package ICAs and reflection coefficient of driven ICA (port #1) with AH=IH=1.105 mm, assuming an electrically conductive TIM and enclosed IHS As demonstrated in FIG. 70, ICA with AH=IH=1.105 mm, the enclosed IHS, and conductive TIM (conductivity >>1 S/m), the link responses may be completely under numerical noise floor and the wireless communication channels may be effectively closed when the upper channel (6 GHz to 10.6 GHz) of ultra-wideband band may be considered. The narrow waveguide structure between the silicon and the IHS side can be limiting for the in-package communication.

Figure 71A:
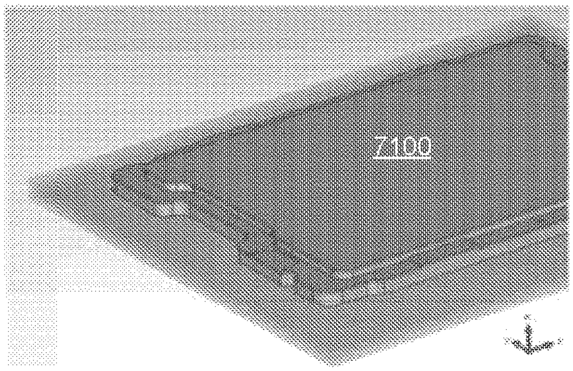
FIG. 71A exemplarily shows an unstructured IHS according to various aspects.
Figure 71B:
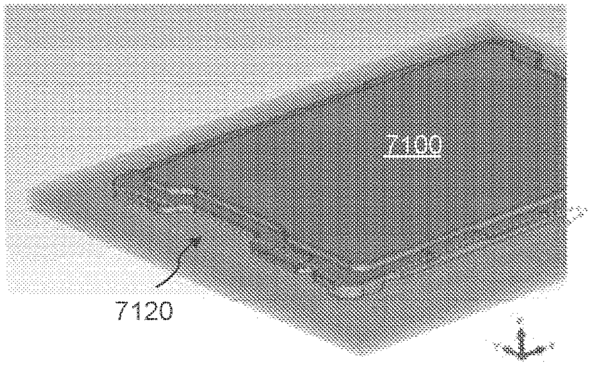
FIG. 71B exemplarily shows a structured IHS according to various aspects.

In order to resolve the cut-off frequency issue of the electrically conductive TIM case at lower operational frequencies (e.g. sub 10-GHz), the side walls 7120 of the IHS 7100 can be structured in various aspects, as illustrated in FIG. 71B. FIG. 71A and FIG. 71B depict an illustration of an IHS structure 7100 to lower a cut-off frequency of a mold channel with FIG. 71A depicting a unstructured IHS 7100 and FIG. 71B depicting a structured IHS 7100 according to various aspects having removed side walls 7120 in part to create an effective mold channel in lower frequencies. Illustratively, the original IHS walls may be configured to completely enclosure the mold material and dies. The modified side walls, e.g. 4 corners of the HIS may remain for mechanical support, may lower the cut-off frequency. Alternatively, a part of the side walls of the IHS may include at least one opening, e.g. one opening at each side wall of the IHS, configured such that mold material is exposed to air. These openings may have various shapes.

Figure 72:
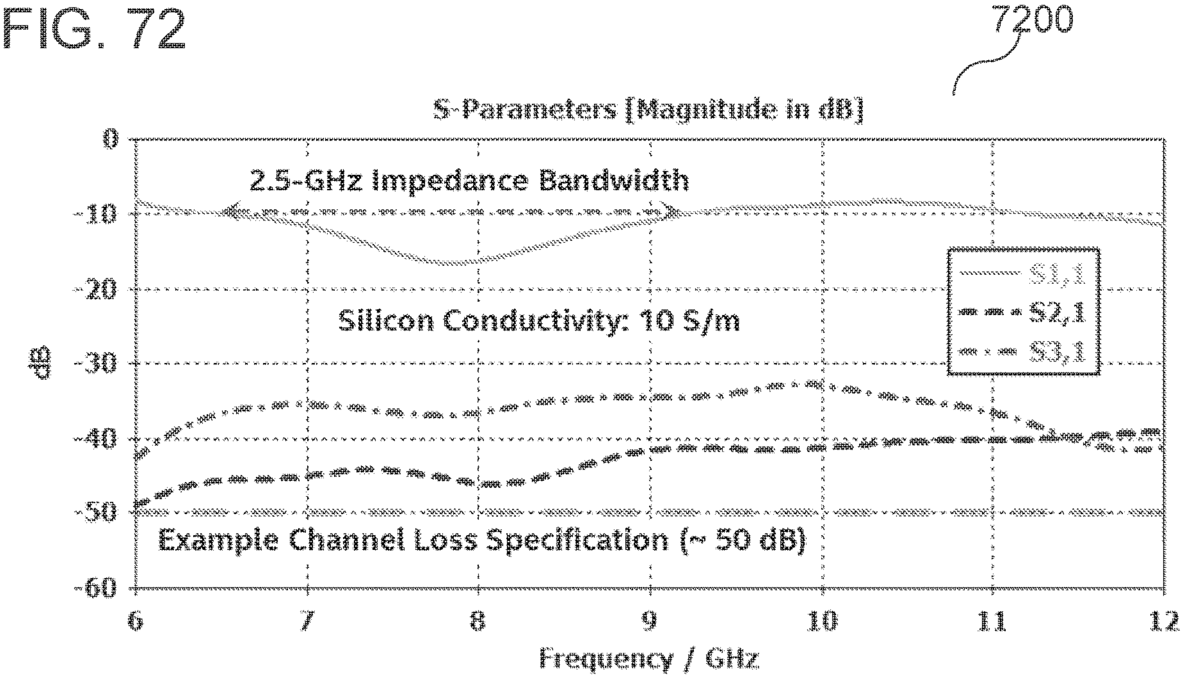
FIG. 72 exemplarily shows a wireless link performance between in-package ICAs and reflection coefficient of driven ICA according to various aspects.

FIG. 72 shows a further diagram 7200 illustrating a wireless link performance between in-package ICAs and reflection coefficient of driven ICA (port #1) with AH=IH=1.105 mm, assuming an electrically conductive TIM and a sidewall modification of the IHS as discussed in FIG. 71B.

The full-wave simulation result of ICA with the electrically conductive TIM and modified IHS in FIG. 72 shows a compatible point-to-multipoint link performance with the previous non-conductive TIM case (AH=IH=1.405 mm). The mold material could include an air or an electrically anisotropic material.

Figure 73:
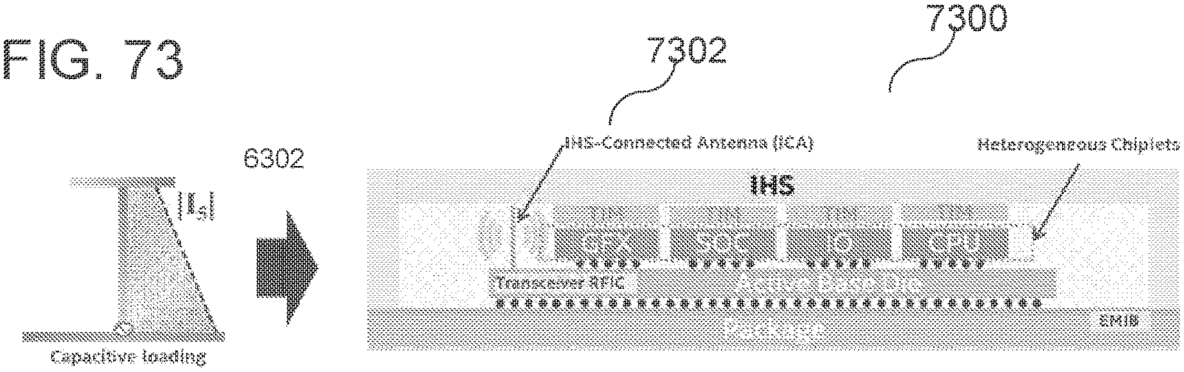
FIG. 73 to FIG. 75 exemplarily show example ICA implementations according to various aspects.

In various aspects, ICA can be implemented by using a metal rod 6302 as a machined part of the IHS, as illustrated in FIG. 73. FIG. 73 illustrates an example ICA implementation 7300 using metallic posts/rods 7302. Grown copper pillars can be an alternative to the metal rod. Further ICA structures can be configured by using Through-Mold-Vias (TMVs) as illustrated in FIG. 74.

Figure 74:
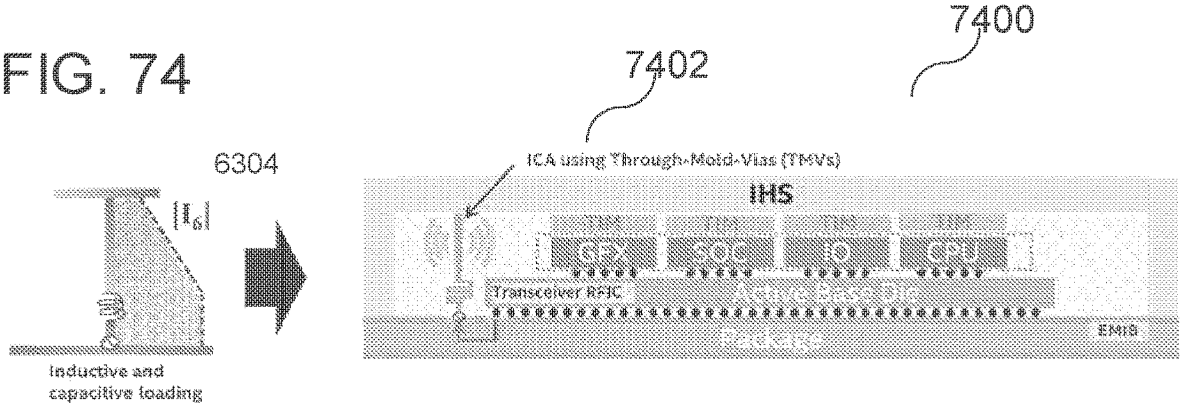

FIG. 74. illustrates an example ICA implementation 7400 using Through-Mold-Vias 7402. If desired, Through-Silicon-Vias (TSVs) can be leveraged to create ICA as depicted in FIG. 75.

Figure 75:
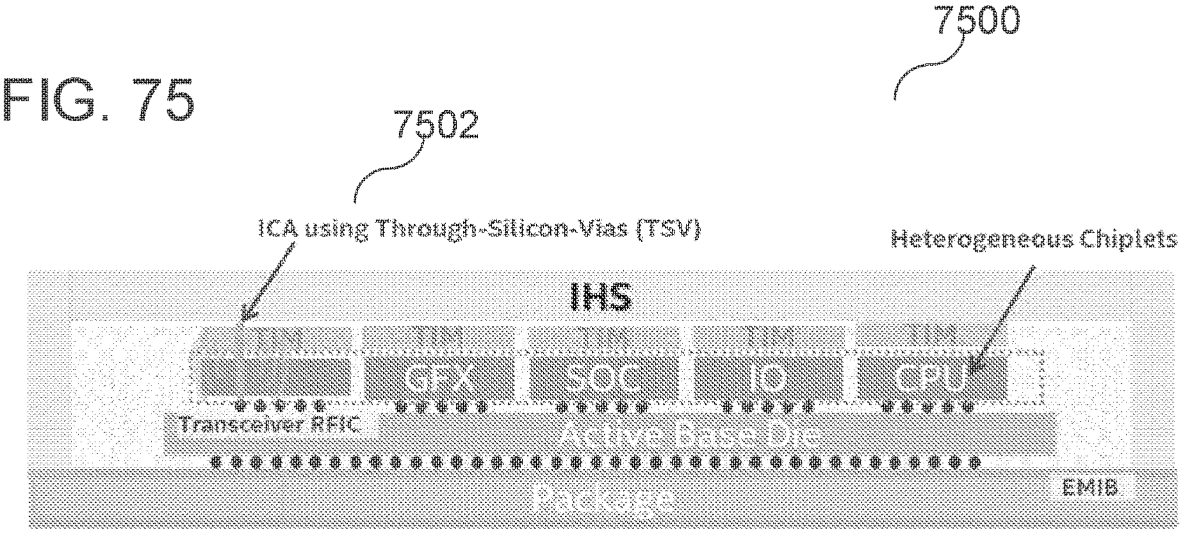

FIG. 75 illustrates an example ICA implementation 7500 using Through-Silicon-Vias 7502.

Thus, using any combination of these implementation approaches, the feed antenna(s) from base die, package carrier, or chiplets can be connected to the IHS. This way, a vertically-polarized ICA can be created, and point-to-multipoint in-package wireless communications can be enabled.

In various aspects, a "Fisheye pin" may be considered along with a non-conductive TIM. Then, at least one of the resonant frequencies, or the quality factor of the antenna can be mechanically adjusted as a post fine tuning. This aspect is illustrated in FIG. 76A and FIG. 76B.

Figure 76A:
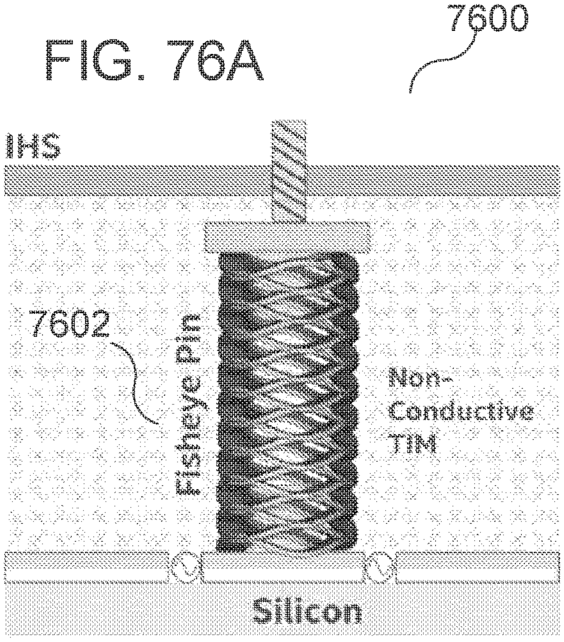
FIG. 76A and FIG. 76B exemplarily illustrate an example ICA implementation using the Fisheye pin with antenna-Q control capability.
Figure 76B:
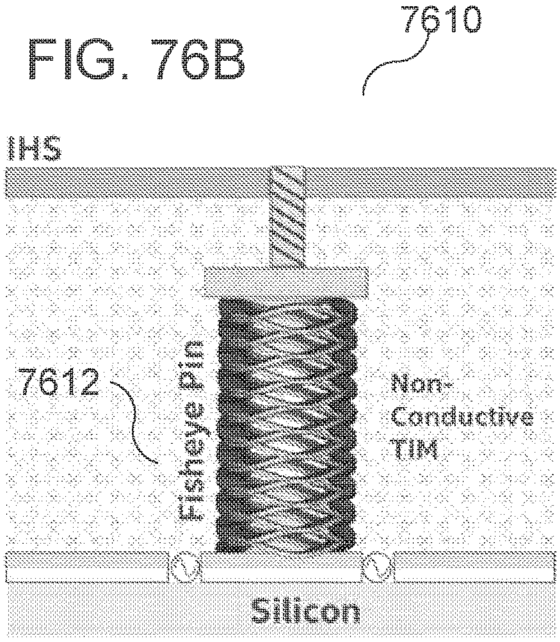

FIG. 76A and FIG. 76B illustrate an example ICA implementation using the Fisheye pin with antenna-Q control capability with FIG. 76A illustrating an original full height implementation 7600 of the Fisheye pin 7602 and FIG. 76B illustrates an implementation 7610 of a Fisheye pin 7612 with reduced height.

Figure 77:
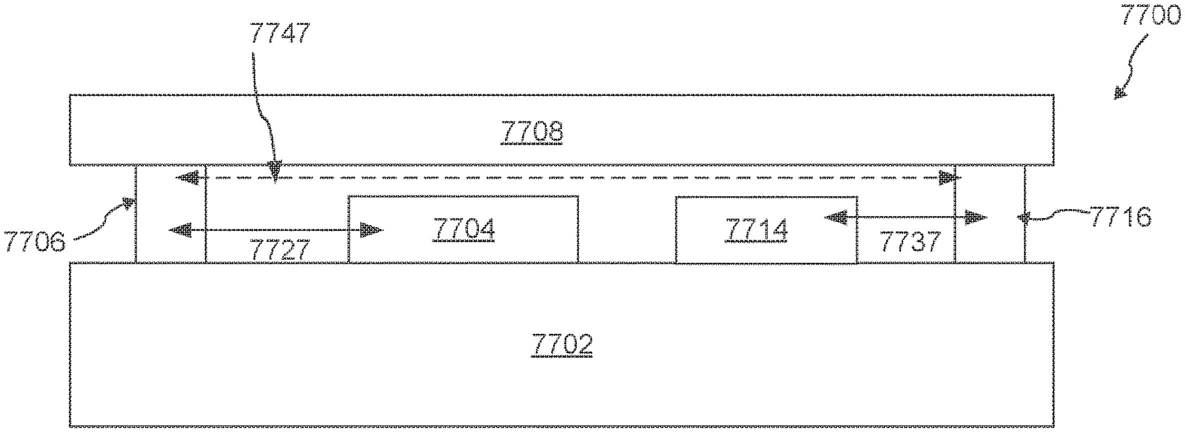
FIG. 77 exemplarily shows a schematic cross-section a package according to various aspects.

FIG. 77 illustrates in a schematic cross-section a package 7700 according to various aspects. The package 7700 includes an active base die 7702 (also denoted as package carrier), e.g. on or above a board; at least a first die 7704 and a second die 7714 both on or above the active base die 7702 and coupled to the active base die 7702; an integrated heat spreader 7708 on or above the carrier 7702 and encapsulating each of the active base die 7702, the first die 7704 and the second die 7714; and at least a first antenna 7706 and a second antenna 7716 both coupled to the active base die 7702 and the integrated heat spreader 7708, and at least one radio frequency signal interface 7747 between the first die and the second die. The radio frequency signal interface may include the first antenna 7706 and the second antenna 7716 wirelessly coupling the first die 7704 with the second die 7714 through the radio frequency signal interface 7747. Illustratively, the first die 7704 submits an RF signal to the first antenna 7706 through a first RF signal interface 7727. The antenna 7706 transmits the RF signal to the second antenna 7716 via the RF signal interface 7747. The second antenna 7716 transmits the received RF signal through a second RF signal interface 7737 to the second antenna 7714, and vice versa. In various aspects, the package 7700 includes a plurality of antennas. The plurality of antennas includes the first antenna 7706 and the second antenna 7716.

In various aspects, the first die 7704 may also be coupled to the second antenna by wire and/or the second die 7714 may be coupled to the first antenna 7706 by wire. However, the wireless communication link 7747 may have a higher data rate or band width than the wired communication link. As an example, the first die 7704 may be arranged closer to the first antenna 7706 than the second die 7714 to the first antenna 7706. The second die 7714 may be arranged closer to the second antenna 7716 than the first die 7704 to the second antenna 7716. There may be no direct connection between the first die 7704 and the second die 7714 through a wire, but only through the RF signal interface 7747 in various aspects.

The integrated heat spreader 7708 may be configured reflective for the radio frequency signals. In various aspects, ICA may be configured as a heat sink, may be thermally coupled to a heat sink, or may include a heat sink, e.g. in case no IHS is used.

The integrated heat spreader 7708 may be attached to the carrier 7702.

The integrated heat spreader 7708 may include a structure. The structure may be configured as a plurality of vertically-polarized broadband antennas.

The integrated heat spreader 7708 may be configured as a radio frequency shielding structure regarding radio frequency signals from the outside of the package such that the area enclosed by the integrated heat spreader and the cover may be substantially free of radio frequency signals from the outside of the package.

The package 7700 may include a further antenna on or above at least one of the integrated heat spreader or the carrier. The further antenna may be coupled to the active base die 7702. The further antenna may be configured for wireless communication of the package 7700 with at least one other package.

A conventional integrated heat spreader (IHS), e.g. a metal heat spreader, may be arranged over one or more dice can serve as a thermo-mechanical part. The IHS is used to assist in the thermal management as well as to provide structural stability to the package. Packages of the related art use connections on the organic package, top side contacts, balls, lands, etc. However due to increasing input/output (I/O) and power delivery demands there is limited space available on the organic carrier, e.g. a printed circuit board, to make these input/output connections without increasing the package size.

Further, an increase in package size can pose challenges in not only increased cost but also product performance and reliability. For example, after certain package size yield drop drastically, or increased package size or bottom side I/O contact numbers results in much larger forces required for package socketing. In addition, server platforms use standard rack sizes in the related art, which limits the package size increases to be able fit all the necessary components of a server system. As such, conventionally, ball grid arrays (BGA) connections or land grid array (LGA) connections are used as second level package interconnects to provide power delivery to the package as well as to provide signal input-output. Currently, these solutions require a physical electrical contact between the package and the board, e.g. the PCB. Hence, conventional techniques are not able to scale up without increasing the package size that impacts package cost, reliability as well as form factor fit in server platforms. Thus, solutions of the related art are not able scale up without decreasing SLI (second level interconnect) pitch that becomes challenging and expensive as the pitch reduces the inherent isolation between the signal lines that becomes much worse. These connections require physical contact that could be prone to damage over time, e.g. broken solder causing opens.

Thus, illustratively, in various aspects, a package interconnect is provided utilizing the IHS as antenna. This IHS level interconnect (ILI) may be used to provide package-to-device communication links in various aspects. Here, a device may be another package in a broad sense, or, in a narrow sense, another package on the same board, another board, or another rack unit.

Signals to be transmitted through the package-to-package communication connection are coupled into the IHS inside the package using IHS-connected antennas, e.g. as described above. This way, the IHS can be utilized as a medium for package interconnects. Thus, moving current signals from SLI to ILI are provided, and thus the number of SLI is reduced. This way, package size may be reduced.

Alternatively or in addition, I/O using ILI may be provided to supplement current 10 from SLI. This way, the burden on SLI may be reduced and overall product data bandwidth may be increased by using additional I/O link from IHS.

Figure 78A:
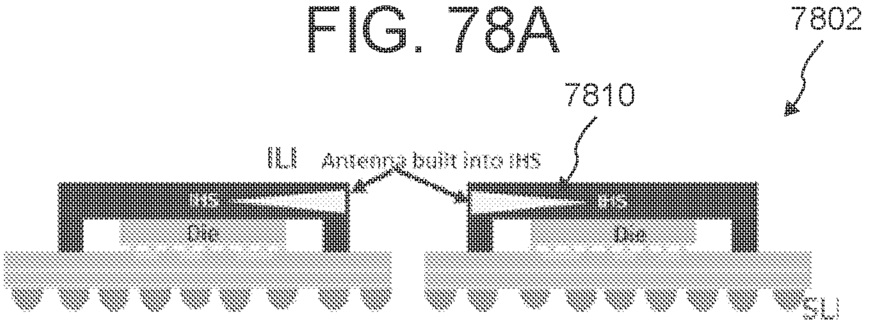
FIG. 78A to FIG. 78C exemplarily show different aspects of utilizing IHS Level Interconnect.
Figure 78B:
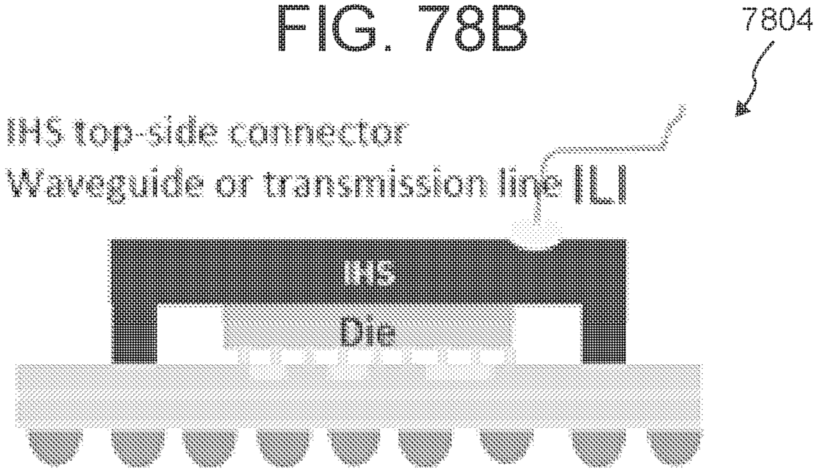
Figure 78C:
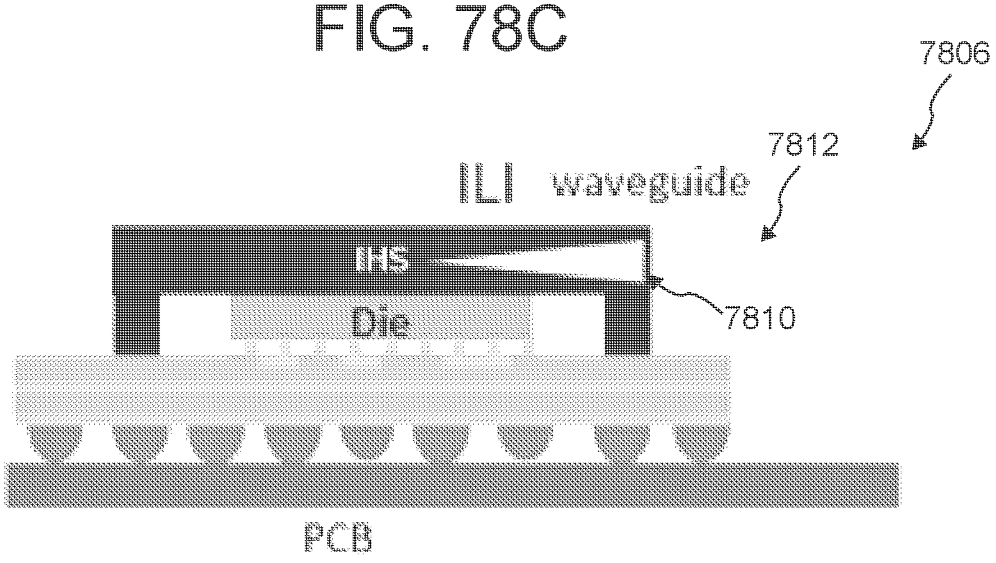

FIG. 78A-FIG. 78C illustrate different aspects of utilizing IHS Level Interconnect (ILI) with FIG. 78A showing package-to-package links using one or more antennas 7810 integrated in the IHS of a package 7802, 7810. FIG. 78B discloses a package 7804 having transmission line connector integrated in the IHS. FIG. 78C shows ILI coupled to a PCB level waveguide 7812.

Thus, FIG. 78A illustrates an aspect including at least one of a waveguide or an antenna integrated in the IHS of a first package that is communicatively coupled to at least one of an IHS antenna or waveguide structure of a second package. FIG. 78B illustrates an aspect including a high frequency compatible RF connector, similar to the ones used in 5G antenna applications, integrated in the IHS. FIG. 78C illustrates an aspect including ILI that communicates with the waveguide/antenna integrated in and/or attached to a PCB carrier 7812, e.g. a board, of the computing platform.

In various aspects, ILI may utilize the thermal heat spreading capabilities of the IHS to extend or complement its capabilities. Signals from the circuits, chips, dice to the ILI may be transmitted with the IHS coupled antenna and/or physical hard-wired connections.

For the aspects illustrated in FIG. 78A and FIG. 78B, a waveguide or antenna may be integrated in the IHS.

Figure 79:
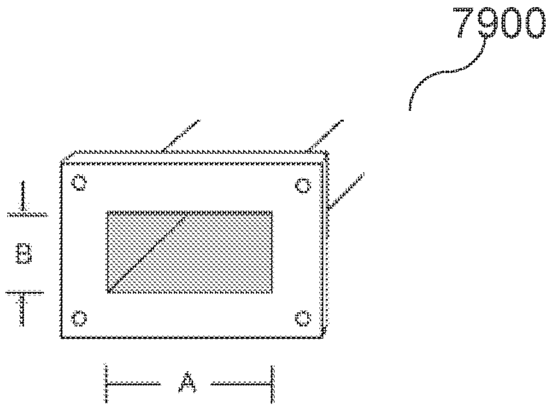
FIG. 79 exemplarily shows a cross-section of a rectangular waveguide structure.

FIG. 79 shows a cross-section of a conventional rectangular waveguide structure 7900. Here, for frequency ranges of 110 GHz to 170 GHz, A is about 1.6 mm and B is about 0.8 mm when the waveguide is air filled. A size reduction is possible by using a better dielectric material as the medium such as plastic. Furthermore, for higher frequency ranges, for example in a range from about 140 GHz to about 220 GHz, A may be 1.3 mm and B may be 0.64 mm.

Figure 80A:
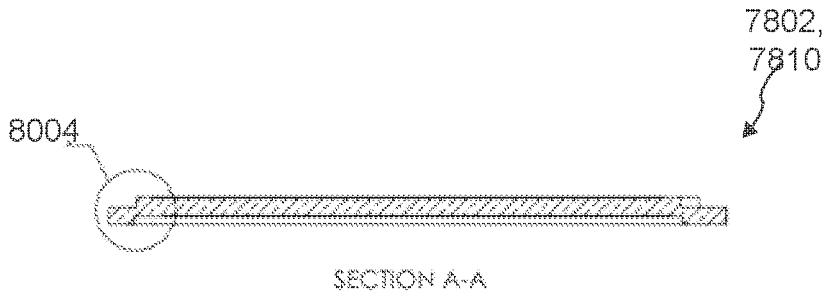
FIG. 80A and FIG. 80B exemplarily show server IHS cross-sections for a server product.
Figure 80B:
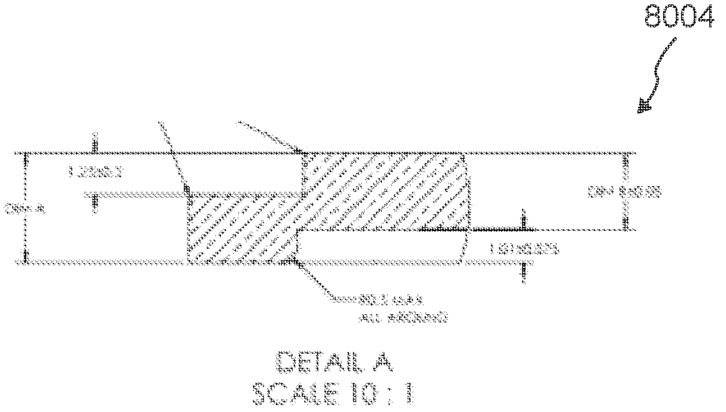

FIG. 80A and FIG. 80B depict typical server IHS 7802, 7810 cross-sections for a server product of the related art. Here, A is about 3.1 mm to 4.0 mm, and B is about 2.3 mm to 3.0 mm. Hence, sufficient space is provided in the IHS of the related art to arrange a waveguide structure illustrated in FIG. 79 in the IHS for frequencies above 110 GHz.

In addition to the waveguide structures, antennas may be integrated in or arranged on the IHS. Furthermore, these antennas may be made part of the server thermal solution (heat sink, cold plate . . . etc.) and may simultaneously also act as radiating antennas.

In various aspects, a miniature connector, e.g. developed for 5G applications, may be modified to be part of the IHS.

This connector may be configured, as an example, for 45 GHz, and may have a small footprint, allowing a plurality of connectors to be integrated in the IHS.

Figure 81:
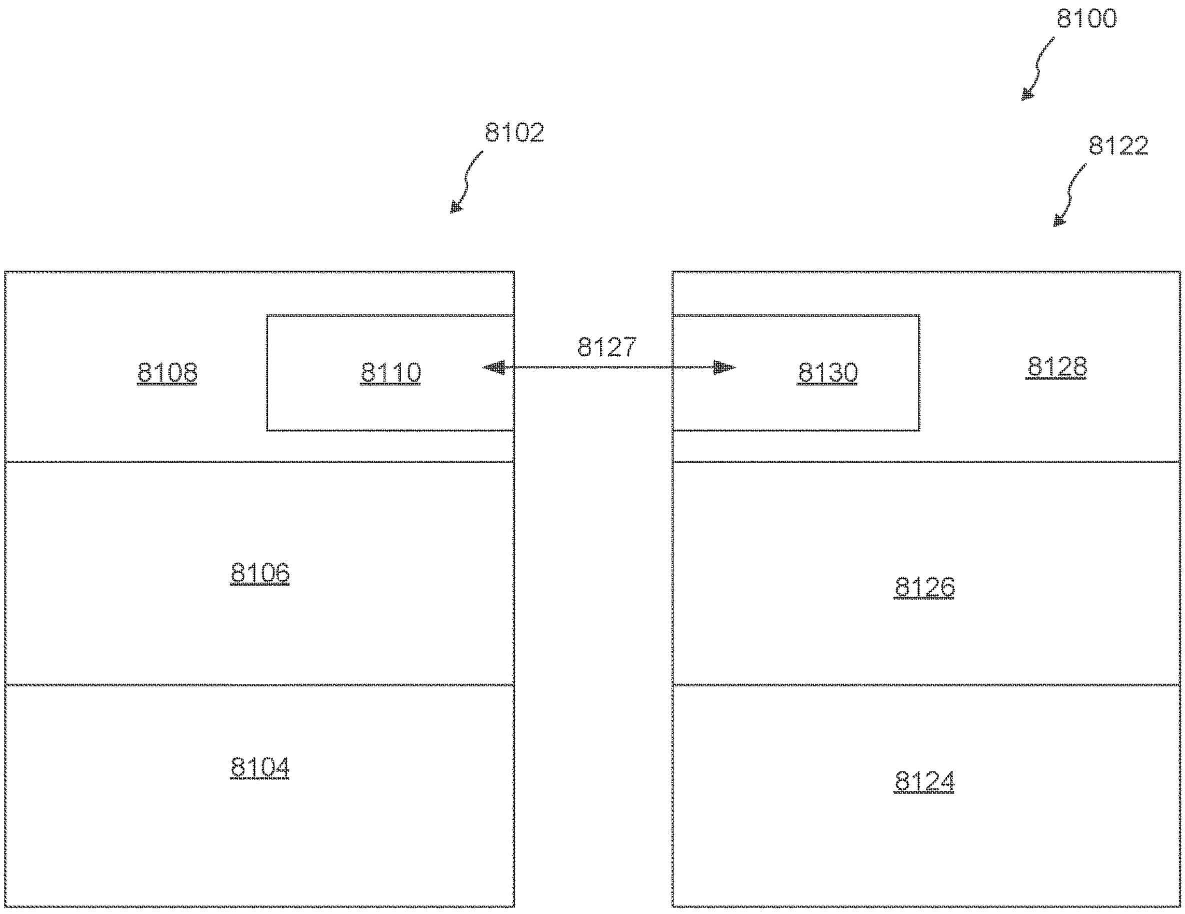
FIG. 81 exemplarily shows a schematic cross-section of a package system according to various aspects.

FIG. 81 depicts a schematic cross-section of a package system 8100 according to various aspects. The package system 8100 includes a first package 8102 and a second package 8122. Each package 8102, 8122 may include a die 8106, 8126 on a carrier 8104, 8124, an antenna 8110, 8130 on the carrier 8104, 8124 and an integrated heat spreader 8108, 8128 on or over the carrier 8104, 8124 and thermally coupled to the die 8106, 8126. At least a part of the integrated heat spreader 8108, 8128 may include the antenna 8110, 8130 or may be configured as the antenna 8110, 8130. Further, a radio frequency signal interface 8127 between the packages 8102, 8122 may include the antenna 8110 of the first package 102 and the antenna 8130 of the second package 8122 being wirelessly communicatively coupled.

In various aspects, at least one of the first package 8102 or the second package 8122 may include a printed circuit board as the carrier 8104, 8124.

In various aspects, at least one of the first package 8102 or the second packages 8122 may include a waveguide structure. The die 8106, 8126 may be coupled to the integrated heat spreader 8108, 8128 through the waveguide structure.

The integrated heat spreader 8108, 8128 may be attached to the carrier 8104, 8124. The radio frequency signal interface 8127 may be a near-field communication interface.

The integrated heat spreader 8108, 8128 of at least one of the first package 8102 or the second package 8122 may include a structure configured to form a directional antenna. The directional antenna may be the antenna 8110, 8130. The antenna 8110 of the first package faces 8102 the antenna 8130 of the second package 8122.

In various aspects, at least one of the first package 8102 or the second package 8122 may include a broadside antenna as the antenna. As an example, the integrated heat spreader 8108, 8128 may be configured as a broadside antenna. Alternatively, the integrated heat spreader 8108, 8128 may be configured as a diagonal directional antenna. Alternatively, the integrated heat spreader may be configured as an end-fire antenna.

Illustratively, each of the carrier 8104 of the first package 8102 and the carrier 8124 of the second package 8122 has a planar surface. The planar surface of the carrier of the first package and planar surface of the carrier of the second package may be faced in a same direction. The carrier of the first package and the carrier of the second package may be stacked over each other. Alternatively, the carrier of the first package and the carrier of the second package may be arranged in a common plane. Alternatively, the planar surface of carrier of the first package and planar surface of the carrier of the second package may be arranged in a diagonal manner to each other.

At least one of the first package or the second package may include that the carrier has a dielectric having a first side and a second side parallel to the first side, a chip, at least one TSV extending from the first side to the second side through the carrier, and a package-radio frequency signal interface connecting the chip with the TSV. In various aspects, the package-radio frequency signal interface may include a planar wireless coupler.

In various aspects, the radio frequency signal interface may further include a radio frequency stripline attached to the outside of the integrated heat spreader. Alternatively or in addition, the radio frequency signal interface may further include a waveguide connector attached to the outside of the integrated heat spreader.

In the following, various aspects of the present disclosure will be illustrated:

Example 1a is a device-to-device communication system, including a first device and a second device. Each of the first device and the second device includes an antenna, a radio frequency frond-end circuit, and a baseband circuit. Each of the first device and the second device are at least one of a chiplet or a package. The device-to-device communication system further includes a cover structure housing the first device and the second device. Each of the first device and the second device are at least one of a chiplet or a package. The device-to-device communication system further includes a radio frequency signal interface wirelessly communicatively coupling the first device and the second device. The radio frequency signal interface includes the first antenna and the second antenna. In other words, the radio frequency signal interface may be configured to operably couple the first device to the second device.

In Example 2a, the subject matter of Example 1a can optionally include that the device-to-device communication system further includes a carrier. The first device and the second device are arranged on the (same) carrier.

In Example 3a, the subject matter of Example 2a can optionally include that the carrier is a printed circuit board.

In Example 4a, the subject matter of Example 2a or 3a can optionally include that the carrier includes a semiconductor material.

In Example 5a, the subject matter of Example 4a can optionally include that the semiconductor material includes silicon or gallium nitride.

In Example 6a, the subject matter of any one of Examples 1a to 5a can optionally include that each of the first device and the second device is a package and the device-to-device communication system is a package-to-package communication system.

In Example 7a, the subject matter of any one of Examples 1a to 5a can optionally include that each of the first device and the second device is a chiplet and the device-to-device communication system is a chiplet-to-chiplet communication system.

In Example 8a, the subject matter of any one of Examples 1a to 7a can optionally include that the first and antenna and the second antenna are configured for radio frequency signals having a carrier frequency below 10 GHz;

In Example 9a, the subject matter of any one of Examples 1a to 8a can optionally include that each of the first device and the second device is configured for full-duplex communication.

In Example 10a, the subject matter of any one of Examples 1a to 9a can optionally include that the first device and the second device are stacked over each other.

In Example 11a, the subject matter of any one of Examples 1a to 10a can optionally include a plurality of device, the plurality of devices including the first device and the second device. The plurality of devices is arranged in at least a first stack of devices and a second stack of devices adjacent to the first stack. The first device is arranged in the first stack and the second device is arranged in the second stack.

Example 1b may be a package including a chiplet on a first carrier having a dielectric having two parallel sides and an antenna feed port formed on a first of the two parallel sides of the dielectric of the first carrier, and an antenna on or in a second carrier having two parallel sides and a radio frequency feed port formed on a first of the two parallel sides of the second carrier and the antenna formed at a second side of the two parallel sides. The first side of the first carrier may be facing the first side of the second carrier. The package further includes a radio frequency signal interface. The radio frequency signal interface includes the antenna feed port coupled to the radio frequency feed port. At least one of the antenna feed port or the radio frequency feed port may include a ball grid array or a solder-charge element.

In Example 2b, the subject matter of Example 1b can optionally include that the antenna may be coupled to the radio frequency feed port through a TSV.

In Example 3b, the subject matter of Example 2b can optionally include that the TSV may be extending from the first side of the second carrier to the second side of the second carrier.

In Example 4b, the subject matter of any one of Examples 1b to 3b can optionally include that at least one of the first carrier and the second carrier may include a printed circuit board.

In Example 5b, the subject matter of any one of Examples 1b to 4b can optionally include that the antenna may be configured as a broadside antenna.

In Example 6b, the subject matter of any one of Examples 1b to 5b can optionally include that the first carrier may include a further antenna feed port and the second carrier may include a further radio frequency feed port formed on the first side of the second carrier and a further antenna formed on a second side of the second carrier, and a further radio frequency signal interface may include the further antenna feed port coupled to the further radio frequency feed port. The further antenna has a different main radio frequency propagation direction than the antenna.

In Example 7b, the subject matter of Example 6b can optionally include that the antennas may be connected through different line feeds with the antenna feed ports.

In Example 8b, the subject matter of Example 7b can optionally include that line feeds may be embedded in the first carrier.

In Example 9b, the subject matter of any one of Examples 1b to 8b can optionally include that the further antenna may be configured as a directional antenna.

In Example 10b, the subject matter of any one of Examples 6b to 9b can optionally include that the further antenna may be configured as a diagonal directional antenna.

In Example 11b, the subject matter of any one of Examples 1b to 10b can optionally include that the first carrier may further include a radio frequency integrated circuit on the first carrier.

In Example 12b, the subject matter of any one of Examples 1b to 11b can optionally include that the chiplet may include a first side facing the first side of the first carrier and the first carrier may include a line feed coupled to the first side of the chiplet. The line feed may be coupled the antenna feed port.

In Example 13b, the subject matter of any one of Examples 1b to 12b can optionally include that the first carrier includes an integrated antenna that is formed on or integrated in an edge of the first carrier. The integrated antenna is coupled to the chiplet.

In Example 14b, the subject matter of Example 13b can optionally include that the integrated antenna is configured as an end-fire antenna.

In Example 15b, the subject matter of Example 13b or 14b can optionally include that the integrated antenna includes one more exposed vias configured as radiating components.

In Example 16b, the subject matter of any one of Examples 13b to 15b can optionally include that the integrated antenna is configured as at least one of a Yagi-antenna or Yagi-Uda antenna.

In Example 17b, the subject matter of any one of Examples 1b to 16b can optionally include that the second carrier includes at least a first sub-carrier and a second sub-carrier. Each of the first sub-carrier and the second sub-carrier includes at least one antenna.

Example 18b may be a package including a chiplet on a first carrier having a dielectric having two parallel sides and an antenna feed port formed on a first of the two parallel sides of the dielectric of the first carrier, and an antenna on or in a second carrier having two parallel sides and a radio frequency feed port formed on a first of the two parallel sides of the second carrier and the antenna formed at a second side of the two parallel sides. The first side of the first carrier may be facing the first side of the second carrier, the package may further include a radio frequency signal interface, the radio frequency signal interface may include the antenna feed port coupled to the radio frequency feed port. The first carrier may include an integrated antenna connected to the chiplet, the integrated antenna being integrated in the first carrier.

In Example 19b, the subject matter of Example 18b can optionally include that the integrated antenna may be configured as an end-fire antenna.

In Example 20b, the subject matter of Example 18b or 19b can optionally include that the integrated antenna includes one more exposed vias configured as radiating components.

In Example 21b, the subject matter of any one of Examples 18b to 20b can optionally include that the integrated antenna is configured as at least one of a Yagi-antenna or Yagi-Uda antenna.

In Example 22b, the subject matter of any one of Examples 18b to 21b can optionally include that the second carrier includes at least a first sub-carrier and a second sub-carrier. Each of the first sub-carrier and the second sub-carrier includes at least one antenna.

In Example 23b, the subject matter of any one of Examples 18b to 22b can optionally include that the antenna may be coupled to the radio frequency feed port through a TSV.

In Example 24b, the subject matter of Example 23b can optionally include that the TSV may be extending from the first side of the second carrier to the second side of the second carrier.

In Example 25b, the subject matter of any one of Examples 18b to 24b can optionally include that at least one of the first carrier and the second carrier may include a printed circuit board.

In Example 26b, the subject matter of any one of Examples 18b to 25b can optionally include that the antenna may be configured as a broadside antenna.

In Example 27b, the subject matter of any one of Examples 18b to 26b can optionally include that the first carrier may include a further antenna feed port and the second carrier may include a further radio frequency feed port formed on the first side of the second carrier and a further antenna formed on a second side of the second carrier, and a further radio frequency signal interface may include the further antenna feed port coupled to the further radio frequency feed port. The further antenna has a different main radio frequency propagation direction than the antenna.

In Example 28b, the subject matter of Example 27b can optionally include that the antennas may be connected through different line feeds with the antenna feed ports.

In Example 29b, the subject matter of Example 28b can optionally include that line feeds may be embedded in the first carrier.

In Example 30b, the subject matter of any one of Examples 18b to 29b can optionally include that the antenna may be configured as a directional antenna.

In Example 31b, the subject matter of any one of Examples 18b to 30b can optionally include that the further antenna may be configured as a diagonal directional antenna.

In Example 32b, the subject matter of any one of Examples 18b to 31b can optionally include that the first carrier may further include a radio frequency in IC on the first carrier.

In Example 33b, the subject matter of any one of Examples 18b to 32b can optionally include that the chiplet may include a first side facing the first side of the first carrier and the first carrier may include a line feed coupled to the first side of the chiplet. The line feed may be coupled the antenna feed port.

Example 34b may be a package including a chiplet on a first carrier having a dielectric having two parallel sides and an antenna feed port formed on a first of the two parallel sides of the dielectric of the first carrier, and an antenna on or in a second carrier having two parallel sides and a radio frequency feed port formed on a first of the two parallel sides of the second carrier and the antenna formed at a second side of the two parallel sides. The first side of the first carrier may be facing the first side of the second carrier, the package may further include a radio frequency signal interface, the radio frequency signal interface may include the antenna feed port coupled to the radio frequency feed port. The antenna may be configured as a directional antenna for radio frequency signals in a frequency range from about 5 GHz to about 25 GHz.

In Example 35b, the subject matter of Example 34b can optionally include that the antenna may be coupled to the radio frequency feed port through a TSV.

In Example 36b, the subject matter of Example 34b can optionally include that the TSV may be extending from the first side of the second carrier to the second side of the second carrier.

In Example 37b, the subject matter of any one of Examples 34b to 36b can optionally include that at least one of the first carrier and the second carrier may include a printed circuit board.

In Example 38b, the subject matter of any one of Examples 34b to 37b can optionally include that the antenna may be configured as a broadside antenna.

In Example 39b, the subject matter of any one of Examples 34b to 38b the first carrier may include a further antenna feed port and the second carrier may include a further radio frequency feed port formed on the first side of the second carrier and a further antenna formed on a second side of the second carrier, and a further radio frequency signal interface may include the further antenna feed port coupled to the further radio frequency feed port. The further antenna has a different main radio frequency propagation direction than the antenna.

In Example 40b, the subject matter of Example 39b can optionally include that the antennas may be connected through different line feeds with the antenna feed ports.

In Example 41b, the subject matter of Example 40b can optionally include that line feeds may be embedded in the first carrier.

In Example 42b, the subject matter of any one of Examples 39b to 41b can optionally include that the further antenna may be configured as a diagonal directional antenna.

In Example 43b, the subject matter of any one of Examples 34b to 42b can optionally include that the first carrier may further include a radio frequency integrated circuit on the first carrier.

In Example 44b, the subject matter of any one of Examples 34b to 44b can optionally include that the chiplet may include a first side facing the first side of the first carrier and the first carrier may include a line feed coupled to the first side of the chiplet. The line feed may be coupled the antenna feed port.

In Example 45b, the subject matter of any one of Examples 34b to 44b can optionally include that at least one of the antenna feed port or the radio frequency feed port may include a ball grid array or a solder-charge element.

In Example 46b, the subject matter of any one of Examples 34b to 45b can optionally include that the first carrier may include an integrated antenna connected to the chiplet, the integrated antenna being integrated in the first carrier.

In Example 47b, the subject matter of Example 46b can optionally include that the integrated antenna is configured as an end-fire antenna.

In Example 48b, the subject matter of Example 46b or 47b can optionally include that the integrated antenna includes one more exposed vias configured as radiating components.

In Example 49b, the subject matter of any one of Examples 46b to 48b can optionally include that the integrated antenna is configured as at least one of a Yagi-antenna or Yagi-Uda antenna.

In Example 50b, the subject matter of any one of Examples 34b to 49b can optionally include that the second carrier includes at least a first sub-carrier and a second sub-carrier. Each of the first sub-carrier and the second sub-carrier includes at least one antenna.

Example 51b may be a package-to-package planar system may include a first package and a second package each configured as any one of Examples 1b to 50b. The first package and the second package may be communicatively coupled by at least one antenna of each of the first package and the second package.

In Example 52b, the subject matter of Example 51b can optionally include that the first package and the second package may be arranged so that the second sides of the second carriers of the first package and the second package may be arranged in at least one of facing each other, in a common plane or diagonally displaced.

In Example 53b, the subject matter of Example 51b or 52b can optionally include that the first carrier and the second carrier of the first package and the second package may be arranged on a common carrier via the second sides of the first carrier of the first package and of the second package.

Example 1c is a package. The package includes a carrier having a plane surface, at least a first chiplet and a second chiplet arranged on the plane surface of the carrier; at least one dummy chip structure arranged on the plane surface of the carrier. The first chiplet and the second chiplet may be wirelessly coupled via a radio frequency signal interface. The radio frequency signal interface includes the dummy chiplet structure.

In Example 2c, the subject matter of Example 1c can optionally include that the first chiplet and the second chiplet are arranged on a same side of the carrier.

In Example 3c, the subject matter of Example 1c or 2c can optionally include that the dummy chip structure is configured as a radio frequency waveguide structure to guide radio frequency signals between the first chiplet and the second chiplet.

In Example 4c, the subject matter of any one of Examples 1c to 3c can optionally include that the dummy chip structure is configured as a radio frequency reflector.

In Example 5c, the subject matter of any one of Examples 1c to 4c can optionally include at least one antenna on the at least one dummy chiplet structure.

In Example 6c, the subject matter of any one of Examples 1c to 5c can optionally include that the dummy chip structure is further configured as a package-input-output interface of the package.

In Example 7c, the subject matter of any one of Examples 1c to 6c can optionally include that the radio frequency signal interface is an in-package radio frequency signal interface.

In Example 8c, the subject matter of any one of Examples 1c to 7c can optionally include that the carrier includes a semiconductor carrier.

In Example 9c, the subject matter of Example 8c can optionally include that the semiconductor carrier includes a silicon carrier.

In Example 10c, the subject matter of any one of Examples 1c to 9c can optionally include that the dummy chiplet includes silicon.

Example 11c, the subject matter of any one of Examples 1c to 9c can optionally include that the dummy chip structure has a conductivity of 1 S/m or less.

Example 1d is a package including a carrier having a planar surface and an edge surface, at least one chiplet arranged on the planar surface, and a first antenna arranged on the edge surface. The first antenna may be exposed on the edge surface. A radio frequency signal interface may be configured to couple the antenna with the chiplet.

In Example 2d, the subject matter of Example 1d can optionally include that the edge surface may be a first edge surface and the carrier may further include at least a second surface. A second antenna may be arranged on the second edge surface.

In Example 3d, the subject matter of Example 2d can optionally include that each of the first antenna and the second antenna may be configured as vertically polarized antennas.

In Example 4d, the subject matter of Example 3d can optionally include that the first antenna and the second antenna may be vertically polarized antennas configured to include at least one of different polarizations or propagation directions.

In Example 5d, the subject matter of any one of Examples 1d to 4d can optionally include that the first antenna may be arranged along the edge surface.

In Example 6d, the subject matter of any one of Examples 1d to 5d can optionally include that a third antenna may be arranged on or above the planar surface. The first antenna and the third antenna may be configured to include at least one of different polarizations or propagation directions.

In Example 7d, the subject matter of any one of Examples 1d to 6d can optionally include that the first antenna may include one or more TSVs as main radiation elements.

In Example 8d, the subject matter of any one of Examples 1d to 7d can optionally include that the carrier includes a ground plane. The first antenna may be coupled to the ground plane In Example 9d, the subject matter of any one of Examples 1d to 8d can optionally include that the first antenna may be configured as a directional antenna.

Example 1e may be a package system, including at least a first package and a second package on a carrier. The first package and the second package may be arranged on a same side of the package carrier. Each of the first package and the second package may include at least one antenna to transmit and/or receive radio frequency signals. A cover may be arranged at a distance over the first package and the second package at the same side of the package carrier as the first package and the second package. The cover may include at least one conductive element forming a predefined pattern on a side of the cover facing the first package and the second package. The package system may further include a radio frequency signal interface configured to connect the at least one antenna of the first package to the at least one antenna of the second package. The radio frequency signal interface may include the at least one conductive element.

In Example 2e, the subject matter of Example 1e can optionally include that the at least one conductive element may be configured as a surface waveguide for radio frequency signals.

In Example 3e, the subject matter of Example 1e or 2e can optionally include that the cover may include a metallic package carrier that may be covered by a dielectric layer and the conductive pattern may be arranged on the dielectric layer.

In Example 4e, the subject matter of Example 3e can optionally include that the at least one conductive element may be configured as electrically floating.

In Example 5e, the subject matter of Example 3e or 4e can optionally include that the at least one conductive element may be configured as a radio frequency filter.

In Example 6e, the subject matter of any one of Examples 3e to 5e can optionally include that the at least one conductive element may be configured as a surface acoustic wave structure.

In Example 7e, the subject matter of any one of Examples 1e to 6e can optionally include that the at least one conductive element may include a plurality of metal structures.

In Example 8e, the subject matter of Example 7e can optionally include that the plurality of metal structures may be electrically isolated from each other.

In Example 9e, the subject matter of any one of Examples 1e to 7e can optionally include that the at least one conductive element may include at least a first region and a second region. The at least one conductive element may be configured having a first surface impedance in the first region and a second surface impedance in the second region, the second surface impedance being higher than the first surface impedance.

In Example 10e, the subject matter of Example 9e can optionally include that the at least one conductive element in the first region and the conductive element in the second region may be positioned along an optical connecting line of the first package and the second package.

In Example 11e, the subject matter of Example 10e can optionally include that the at least one conductive element in the first region may be formed atop of the first package and the second package and atop of the optical connecting line.

In Example 12e, the subject matter of any one of Examples 9e to 11e can optionally include that the at least one conductive element in the second region may be arranged laterally positioned to the at least one conductive element in the first region.

In Example 13e, the subject matter of any one of Examples 9e to 12e can optionally include that the at least one conductive element may include in the second region a dielectric part may be arranged on the metal structure, the dielectric part protruding from the metal structure towards the side of the package carrier.

In Example 14e, the subject matter of any one of Examples 1e to 12e can optionally include that the cover may be attached to the package carrier.

Example 15e is a package, including at least a first chiplet and a second chiplet on a carrier. The first chiplet and the second chiplet may be arranged on a same side of the carrier. Each of the first chiplet and the second chiplet may include at least one antenna to transmit and/or receive radio frequency signals. A cover may be arranged at a distance over the first chiplet and the second chiplet at the same side of the carrier as the first chiplet and the second chiplet. The cover may include at least one conductive element forming a predefined pattern on a side of the cover facing the first chiplet and the second chiplet. The package may further include a radio frequency signal interface wirelessly connecting the antennas of the first chiplet and the second chiplet. The radio frequency signal interface may include the at least one conductive element.

In Example 16e, the subject matter of Example 15e can optionally include that the at least one conductive element may be configured as a surface waveguide for radio frequency signals.

In Example 17e, the subject matter of Example 15e or 16e can optionally include that the cover may include a metallic carrier that may be covered by a dielectric layer and the conductive pattern may be arranged on the dielectric layer.

In Example 18e, the subject matter of Example 17e can optionally include that the at least one conductive element may be configured as electrically floating.

In Example 19e, the subject matter of Example 17e or 18e can optionally include that the at least one conductive element may be configured as a radio frequency filter.

In Example 20e, the subject matter of any one of Examples 17e to 19e can optionally include that the at least one conductive element may be configured as a surface acoustic wave structure.

21e, the subject matter of any one of Examples 15e to 20e can optionally include that the at least one conductive element may include a plurality of metal structures.

In Example 22e, the subject matter of Example 21e can optionally include that the plurality of metal structures may be electrically isolated from each other.

In Example 23e, the subject matter of any one of Examples 15e to 22e can optionally include that the at least one conductive element may include at least a first region and a second region. The at least one conductive element may be configured having a first surface impedance in the first region and a second surface impedance in the second region, the second surface impedance being higher than the first surface impedance.

In Example 24e, the subject matter of Example 23e can optionally include that the at least one conductive element in the first region and the conductive element in the second region may be positioned along an optical connecting line of the first chiplet and the second chiplet.

In Example 25e, the subject matter of Example 24e can optionally include that the at least one conductive element in the first region may be formed atop of the first chiplet and the second chiplet and atop of the optical connecting line.

In Example 26e, the subject matter of any one of Examples 23e to 25e can optionally include that the at least one conductive element in the second region may be arranged laterally positioned to the at least one conductive element in the first region.

In Example 27e, the subject matter of any one of Examples 23e to 26e can optionally include that the at least one conductive element may include in the second region a dielectric part may be arranged on the metal structure, the dielectric part protruding from the metal structure towards the side of the carrier.

In Example 28e, the subject matter of any one of Examples 15e to 27e can optionally include that the cover may be attached to the carrier.

Example 1f may be a chiplet-to-chiplet communication system including a first chiplet on a first carrier and a second chiplet on a second carrier. Each of the first carrier and the second carrier includes a first side and a second side opposite to the first side. The first chiplet may be arranged on the first side of the first carrier and the second chiplet may be arranged on the first side of the second carrier. The first side of the second carrier may be arranged to face the second side of the first carrier. The first carrier further including a TSV coupled to the first chiplet and extending through the first carrier from the first side to the second side. The chiplet-to-chiplet communication system includes a radio frequency signal interface wirelessly communicatively coupling the first chiplet to the second chiplet, the radio frequency signal interface including the TSV of the first carrier.

In Example 2f, the subject matter of claim 1f can optionally include that the first carrier further includes a waveguide structure. The first chiplet may be coupled to the TSV through the waveguide structure.

In Example 3f, the subject matter of any one of Examples 1f or 2f can optionally include that the radio frequency signal interface includes or may be a near-field communication interface.

In Example 4f, the subject matter of any one of Examples 1f to 3f can optionally include that the first carrier and the second carrier may be stacked over each other.

In Example 5f, the subject matter of any one of Examples 1f to 4f can optionally include that the radio frequency signal interface further includes a planar wireless coupler.

In Example 6f, the subject matter of any one of Examples 5f can optionally include that the first carrier includes the planar wireless coupler.

In Example 7f, the subject matter of any one of Examples 5f or 6f can optionally include that the planar wireless coupler includes a feed line coupled to a conductor loop structure. The conductor loop structure laterally surrounds the TSV.

In Example 8f, the subject matter of any one of Examples 1f to 7f can optionally include that at least one of the first carrier or the second carrier may be a printed circuit board.

In Example 9f, the subject matter of any one of Examples 1f to 8f, further including a third carrier arranged between the first and second carrier.

In Example 10f, the subject matter of any one of Examples 1f to 8f, further including a third carrier arranged in the signal path of the radio frequency signal interface.

In Example 11f, the subject matter of any one of Examples 1f to 10f, further including a controller, configured to: determine a position vector of the second chiplet relative to the first chip, determine a predefined electrical field distribution depending on the determined vector including a voltage for a ring structure surrounding the via associated with the electrical field distribution, and apply the determined voltage to the ring structure.

In Example 12f, the subject matter of any one of Examples 1f to 11f can optionally include that the TSV may be exposed at the second side.

In Example 13f, the subject matter of any one of Examples 1f to 12f, further including a first package and a second package. The first package includes the first chiplet and the second package includes the second chiplet.

Example 14f is a method of operating a chiplet-to-chiplet communication system. The chiplet-to-chiplet communication system includes a first chiplet on a first carrier and a second chiplet on a second carrier. Each of the first carrier and the second carrier includes a first side and a second side opposite to the first side, the first chiplet may be arranged on the first side of the first carrier and the second chiplet may be arranged on the first side of the second carrier. The first side of the second carrier may be arranged to face the second side of the first carrier. The first carrier further including a TSV coupled to the first chiplet and extending through the first carrier from the first side to the second side. A TSV may be coupled to the chiplet and extending through the carrier from a first side of the carrier to a second side of the carrier. The chiplet-to-chiplet communication system may include a radio frequency signal interface communicatively coupling the first chiplet to the second chiplet, the radio frequency signal interface including the TSV of the first carrier. The method may include determining a position vector of the second chiplet relative to the first chip, determining a predefined electrical field distribution depending on the determined vector including a voltage for a ring structure surrounding the via associated with the electrical field distribution, and applying the determined voltage to the ring structure In Example 15f, the subject matter of Example 14f can optionally include that the first carrier further includes a waveguide structure. The first chiplet may be coupled to the TSV through the waveguide structure.

In Example 16f, the subject matter of any one of Examples 14f or 15f can optionally include that the radio frequency signal interface includes or may be a near-field communication interface.

In Example 17f, the subject matter of any one of Examples 14f to 16f can optionally include that the first carrier and the second carrier may be stacked over each other.

In Example 18f, the subject matter of any one of Examples 14f to 17f can optionally include that the radio frequency signal interface further includes a planar wireless coupler.

In Example 19f, the subject matter of any one of Examples 18f can optionally include that the first carrier includes the planar wireless coupler.

In Example 20f, the subject matter of any one of Examples 18f or 19f can optionally include that the planar wireless coupler includes a feed line coupled to a conductor loop structure. The conductor loop structure laterally surrounds the TSV.

In Example 21f, the subject matter of any one of Examples 14f to 20f can optionally include that at least one of the first carrier or the second carrier may be a printed circuit board.

In Example 22f, the subject matter of any one of Examples 14f to 21f can optionally include that a third carrier arranged between the first and second carrier.

In Example 23f, the subject matter of any one of Examples 14f to 22f can optionally include that a third carrier arranged in the signal path of the radio frequency signal interface.

In Example 24f, the subject matter of any one of Examples 14f to 23f can optionally include that the TSV may be exposed at the second side.

In Example 25f, the subject matter of any one of Examples 14f to 24f can optionally include that a first package and a second package. The first package includes the first chiplet and the second package includes the second chiplet.

Example 1 g may be a package including an carrier on or above a carrier; at least a first chiplet and a second chiplet both on or above the carrier and coupled to the carrier; an integrated heat spreader on or above the carrier and encapsulating each of the carrier, the first chiplet and the second chiplet; and at least a first antenna and a second antenna both coupled to the carrier and the integrated heat spreader, and at least one radio frequency signal interface between the first chiplet and the second chiplet. The radio frequency signal interface includes the first antenna and the second antenna wirelessly coupling the first chiplet with the second chiplet through the radio frequency signal interface.

In Example 2g, the subject matter of Example 1g can optionally include that the integrated heat spreader may be configured reflective for the radio frequency signals.

In Example 3g, the subject matter of Example 1g or 2g can optionally include that the integrated heat spreader may be attached to the carrier.

In Example 4g, the subject matter of any one of Examples 1 g to 3g can optionally include that the integrated heat spreader includes a structure. The structure may be configured as a plurality of vertically-polarized broadband antennas.

In Example 5g, the subject matter of any one of Examples 1 g to 4g can optionally include that the first chiplet may be arranged closer to the first antenna than the second chiplet to the first antenna. The second chiplet may be arranged closer to the second antenna than the first chiplet to the second antenna.

In Example 6g, the subject matter of any one of Examples 1 g to 5g can optionally include that the integrated heat spreader may be configured as a radio frequency shielding structure regarding radio frequency signals from the outside of the package such that the area enclosed by the integrated heat spreader and the cover may be substantially free of radio frequency signals from the outside of the package.

In Example 7g, the subject matter of any one of Examples 1 g to 6g can optionally further include a further antenna on or above the integrated heat spreader and/or carrier. The further antenna may be coupled to the carrier. The further antenna may be configured for wireless communication of the package with at least one other package.

Example 1 h may be a package system including a first package and a second package. Each package may include a chiplet on a carrier, an antenna on the carrier, and an integrated heat spreader on or over the carrier and thermally coupled to the chiplet. At least a part of the integrated heat spreader may include the antenna or may be configured as the antenna. the subject matter of may further include a radio frequency signal interface that may include the antenna of the first package and the antenna of the second package being wirelessly communicatively coupled.

In Example 2h, the subject matter of Example 1 h can optionally include that at least one of the first package or the second packages may include a waveguide structure. The chiplet may be coupled to the integrated heat spreader through the waveguide structure.

In Example 3h, the subject matter of Example 1 h or 2h can optionally include that the integrated heat spreader of at least one of the first package or the second package may include a structure configured to form a directional antenna. The directional antenna may be the antenna.

In Example 4h, the subject matter of any one of Examples 1h to 3h can optionally include that the integrated heat spreader may be attached to the carrier.

In Example 5h, the subject matter of any one of Examples 1h to 4h can optionally include that the radio frequency signal interface may be a near-field communication interface.

In Example 6h, the subject matter of any one of Examples 1h to 5h can optionally include that each of the carrier of the first package and the carrier of the second package has a planar surface. The planar surface of the carrier of the first package and planar surface of the carrier of the second package may be faced in a same direction.

In Example 7h, the subject matter of any one of Examples 1h to 6 can optionally include that the carrier of the first package and the carrier of the second package may be stacked over each other.

In Example 8h, the subject matter of any one of Examples 1h to 6h can optionally include that the carrier of the first package and the carrier of the second package may be arranged in a common plane.

In Example 9h, the subject matter of Example 6h can optionally include that the planar surface of carrier of the first package and planar surface of the carrier of the second package may be arranged in a diagonal manner to each other.

In Example 10h, the subject matter of any one of Examples 1h to 9h can optionally include that at least one of the first package or the second package may include that the carrier has a dielectric having a first side and a second side parallel to the first side; and a chiplet and at least one TSV extending from the first side to the second side through the carrier, and a package-radio frequency signal interface connecting the chiplet with the TSV.

In Example 11h, the subject matter of Example 10h can optionally include that the package-radio frequency signal interface may include a planar wireless coupler.

In Example 12h, the subject matter of any one of Examples 1h to 11h can optionally include that at least one of the first package or the second package may include a printed circuit board as the carrier.

In Example 13h, the subject matter of any one of Examples 1h to 12h can optionally include that at least one of the first package or the second package may include a broadside antenna as the antenna.

In Example 14h, the subject matter of any one of Examples 1h to 13h can optionally include that the antenna of the first package faces the antenna of the second package.

In Example 15h, the subject matter of any one of Examples 1h to 14h can optionally include that the integrated heat spreader may be configured as a broadside antenna.

In Example 16h, the subject matter of any one of Examples 1h to 15h can optionally include that the integrated heat spreader may be configured as a diagonal directional antenna.

In Example 17h, the subject matter of any one of Examples 1h to 16h can optionally include that the integrated heat spreader may be configured as an end-fire antenna.

In Example 18h, the subject matter of any one of Examples 1h to 17h can optionally include that the radio frequency signal interface may further include a radio frequency stripline attached to the outside of the integrated heat spreader.

In Example 19h, the subject matter of any one of Examples 1h to 18h can optionally include that the radio frequency signal interface may further include a waveguide connector attached to the outside of the integrated heat spreader.

In Example 1i, the subject matter of any one of Examples 1a to 19h can optionally include that the radio frequency signal interface may include or be part of a control plane circuitry.

In Example 2i, the subject matter of any one of Examples 1a to 1i can optionally include that the radio frequency signal interface may be configured to operate or use sub-10 GHz RF carrier technology. Operation at sub-10 GHz can allow for process portability and easy adoption of the radio frequency (RF) transceiver and may use near-field couplers/antennas. The flexibility of an RF link can allow convenient placement and use within a product chassis, from rack-unit-to-rack-unit, and for 3D heterogeneously integrated semiconductor products.

In Example 3i, the subject matter of any one of Examples 1a to 2i can optionally include that the radio frequency signal interface may be configured to support bit rates in the range of 0.5-2 Gbps over distances up to 20 cm, e.g. supporting both symmetric and asymmetric topologies.

In Example 4i, the subject matter of any one of Examples 1a to 3i can optionally include that the radio frequency signal interface may enable point-multipoint, broadcastable, full-duplex wireless control/manageability links, e.g. board-to-board type communications, package-to-package type communications, and chiplet-to-chiplet type communications within a package. A broadcastable, full-duplex wireless messaging capability can enable a control plane communication from package-to-package and inside 3D heterogeneously integrated packages. This way, more nodes, over longer distances and higher speeds can be supported. Alternatively or in addition, a more flexible product floorplan is enabled.

In Example 5i, the subject matter of any one of Examples 1a to 4i can optionally include that the signals transmitted through the radio frequency signal interface may be in the form of packets reflecting any suitable type of control plane protocol. As an example, control signals exchanged between a first die and a second die of one package may be associated to data of the control plane of the Open Systems Interconnection (OSI)-model required to establish, maintain or end an interconnection between the first die and the second die of the package of the data plane of the OSI-model.

In Example 6i, the subject matter of any one of Examples 1a to 5i can optionally include that in a package-to-package communication, at least a first package and a second package may be wirelessly communicatively coupled to each other. Signals, e.g. control signals, transmitted through the radio frequency signal interface between the first package and the second package may be associated to data of the control plane of the Open Systems Interconnection (OSI)-model required to establish, maintain or end an interconnection between the first package and the second package of the data plane of the OSI-model.

The word "exemplary" is used herein to mean "serving as an example, instance, or illustration". Any aspect or design described herein as "exemplary" is not necessarily to be construed as preferred or advantageous over other aspects or designs.

Throughout the drawings, it should be noted that like reference numbers are used to depict the same or similar elements, features, and structures, unless otherwise noted.

The phrase "at least one" and "one or more" may be understood to include a numerical quantity greater than or equal to one (e.g., one, two, three, four, [ . . . ], etc.). The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of individual listed elements.

The words "plural" and "multiple" in the description and in the claims expressly refer to a quantity greater than one. Accordingly, any phrases explicitly invoking the aforementioned words (e.g., "plural [elements]", "multiple [elements] ") referring structure to a quantity of elements expressly refers to more than one of the said elements. For instance, the phrase "a plurality" may be understood to include a numerical quantity greater than or equal to two (e.g., two, three, four, five, [ . . . ], etc.).

The phrases "group (of)", "set (of)", "collection (of)", "series (of)", "sequence (of)", "grouping (of)", etc., in the description and in the claims, if any, refer to a quantity equal to or greater than one, i.e., one or more. The terms "proper subset", "reduced subset", and "lesser subset" refer to a subset of a set that is not equal to the set, illustratively, referring structure to a subset of a set that contains less elements than the set.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

The term "semiconductor carrier" is defined to mean any construction including semiconductor material, for example, a silicon carrier with or without an epitaxial layer, a silicon-on-insulator carrier containing a buried insulator layer, or a carrier with a silicon germanium layer. The term "integrated circuits" as used herein refers to electronic circuits having multiple individual circuit elements, such as transistors, diodes, resistors, capacitors, inductors, and other active and passive semiconductor devices.

The term "data" as used herein may be understood to include information in any suitable analog or digital form, e.g., provided as a file, a portion of a file, a set of files, a signal or stream, a portion of a signal or stream, a set of signals or streams, and the like. Further, the term "data" may also be used to mean a reference to information, e.g., in form of a pointer. The term "data", however, is not limited to the aforementioned examples and may take various forms and represent any information as understood in the art.

As used herein, a signal that is "indicative of" a value or other information may be a digital or analog signal that encodes or otherwise communicates the value or other information in a manner that can be decoded by and/or cause a responsive action in a component receiving the signal. The signal may be stored or buffered in computer readable storage medium prior to its receipt by the receiving component and the receiving component may retrieve the signal from the storage medium. Further, a "value" that is "indicative of" some quantity, state, or parameter may be physically embodied as a digital signal, an analog signal, or stored bits that encode or otherwise communicate the value.

As used herein, a signal may be transmitted or conducted through a signal chain in which the signal is processed to change characteristics such as phase, amplitude, frequency, and so on. The signal may be referred to as the same signal even as such characteristics are adapted. In general, so long as a signal continues to encode the same information, the signal may be considered as the same signal. For example, a transmit signal may be considered as referring structure to the transmit signal in baseband, intermediate, and radio frequencies.

The terms "processor" or "controller" as, for example, used herein may be understood as any kind of technological entity that allows handling of data. The data may be handled according to one or more specific functions executed by the processor or controller. Further, a processor or controller as used herein may be understood as any kind of circuit, e.g., any kind of analog or digital circuit. A processor or a controller may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions, which will be described below in further detail, may also be understood as a processor, controller, or logic circuit. It is understood that any two (or more) of the processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

As utilized herein, terms "module", "component," "system," "circuit," "element," "slice," "circuitry," and the like are intended to refer to a set of one or more electronic components, a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuits can reside within the same circuitry, and circuitry can be localized on one computer and/or distributed between two or more computers. A set of elements or a set of other circuits can be described herein, in which the term "set" can be interpreted as "one or more."

As used herein, "memory" is understood as a computer-readable medium (e.g., a non-transitory computer-readable medium) in which data or information can be stored for retrieval. References to "memory" included herein may thus be understood as referring structure to volatile or non-volatile memory, including random access memory (RAM), read-only memory (ROM), flash memory, solid-state storage, magnetic tape, hard disk drive, optical drive, 3D XPoint™, among others, or any combination thereof. Registers, shift registers, processor registers, data buffers, among others, are also embraced herein by the term memory. The term "software" refers to any type of executable instruction, including firmware.

The term "antenna" or "antenna structure", as used herein, may include any suitable configuration, structure and/or arrangement of one or more antenna elements, components, units, assemblies and/or arrays. In some aspects, the antenna may implement transmit and receive functionalities using separate transmit and receive antenna elements. In some aspects, the antenna may implement transmit and receive functionalities using common and/or integrated transmit/receive elements. The antenna may include, for example, a phased array antenna, a single element antenna, a set of switched beam antennas, and/or the like.

In this description, the term "predefined pattern" refers to a structure of at least one conductive element of the cover. In other words, the at least one conductive element may be structured such that the predefined pattern is formed. The conductive element having the predefined pattern may be formed on a side of the cover facing the first package or die and the second package or die. The predefined pattern may be configured as a frequency selective surface, e.g. selective for the radio frequency signals to be transmitted between the first package or die and the second package or die. As an example, the predefined pattern of the conductive element of the cover may be configured as a reflector array. As an example, the predefined pattern of the conductive element may be configured as a planar structure, a 2.5D structure(s), or 3D structure(s). The conductive element may be configured such that the predefined pattern includes a plurality of unit cells. The plurality of unit cells may be part of the reflector array. Illustratively, the predefined pattern may include a plurality of repetitive structures in the conductive element.

It will be understood that when an element is referred to as being "connected" or "coupled" to another element, it can be physically connected or coupled to the other element such that current and/or electromagnetic radiation (e.g., a signal) can flow along a conductive path formed by the elements. Intervening conductive, inductive, or capacitive elements may be present between the element and the other element when the elements are described as being coupled or connected to one another. Further, when coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

Unless explicitly specified, the term "transmit" encompasses both direct (point-to-point) and indirect transmission (via one or more intermediary points). Similarly, the term "receive" encompasses both direct and indirect reception. Furthermore, the terms "transmit," "receive," "communicate," and other similar terms encompass both physical transmission (e.g., the transmission of radio signals) and logical transmission (e.g., the transmission of digital data over a logical software-level connection). For example, a processor or controller may transmit or receive data over a software-level connection with another processor or controller in the form of radio signals, where the physical transmission and reception is handled by radio-layer components such as RF transceivers and antennas, and the logical transmission and reception over the software-level connection is performed by the processors or controllers. The term "communicate" encompasses one or both of transmitting and receiving, i.e., unidirectional or bidirectional communication in one or both of the incoming and outgoing directions. The term "calculate" encompasses both 'direct' calculations via a mathematical expression/formula/relationship and 'indirect' calculations via lookup or hash tables and other array indexing or searching operations.

The term "calibration" as used herein may describe a process in which a device or a component of a device (e.g., a radiohead circuit, a transceiver chain, a component of a transceiver chain, and the like) is calibrated. Illustratively, the term calibration may describe a process in which one or more deviations of a behavior of a device or of one of its components from an expected or desired behavior are corrected. Further illustratively, the term calibration may describe a process in which the operation of a device or of one of its components is aligned with a predefined or desired operation of the device or of the component. By way of example, a calibration may describe a process in which nonlinearities are eliminated and/or in which mismatches are eliminated.

One or more antennas are configured to operate within a plurality of radiofrequency bands; one or more antennas that are each configured to operate within a single radiofrequency band; or a combination thereof. According to one aspect of the disclosure, the antenna or antennas of the radiofrequency device disclosed herein may be configured to operate within radiofrequency bands between 2.4 GHz and 100 GHz. This may include, for example, 2.4 GHz, 5 to 6 GHz, 6 to 7 GHz, or any combination thereof.

Each of the multiple RF FE circuitries may be configured to communicate via the respective multi-feed antenna terminal, e.g., by transmitting and/or receiving an analog signal within a respective component carrier frequency range (also referred to as frequency block or as communication channel) via the multi-feed antenna terminal. In RF communication, the available frequency spectrum may be divided into multiple bands, wherein each band may be subdivided into multiple frequency blocks (also referred to as sub-band), which may not overlap each other. For example, the 802.11 standard may provide several distinct radio frequency bands for use in Wi-Fi communications, for example, a so called 900 MHz band, a 2.4 GHz band, a 3.6 GHz band, a 4.9 GHz band, a 5 GHz band, a 5.9 GHz band and the like (denoted according to the lower frequency limit).

A communication channel may have a certain capacity for transmitting information, often measured by its bandwidth (also referred to as channel bandwidth) in hertz (Hz) or its data rate in bits per second. The bandwidth (BW) is the continuous band of frequencies occupied by a modulated carrier signal and denotes the difference between the upper frequency limit and lower frequency limit of the communication channel. The maximum possible data rate per user is increased the more communication channels are assigned to the wireless mobile device, e.g., a respective communication conducted by the wireless mobile device (e.g., on software-level).

Some examples may be used in various wireless communication devices, for example, a User Equipment (UE), a Mobile Device (MD), a wireless station (STA), a Personal Computer (PC), a desktop computer, a mobile computer, a laptop computer, a notebook computer, a tablet computer, a server computer, a handheld computer, a sensor device, an Internet of Things (IoT) device, a wearable device, a handheld device, a Personal Digital Assistant (PDA) device, a hybrid device, a health-related device, a vehicular device, a non-vehicular device, a wireless communication station, a wireless Access Point (AP), a wireless router, a wireless modem, a video device, an audio device, an audio-video (A/V) device.

Some examples may be used for "peer to peer (PTP) communication", which may relate to device-to-device communication over a wireless link ("peer-to-peer link") between devices. The PTP communication may include, for example, a Wi-Fi Direct (WFD) communication, e.g., a WFD Peer to Peer (P2P) communication, wireless communication over a direct link within a Quality of Service (QoS) basic service set (BSS), a tunneled direct-link setup (TDLS) link, a STA-to-STA communication in an independent basic service set (IBSS), a Wi-Fi Aware communication, a Vehicle-to-Anything (V2X) communication, an IoT communication, or the like. Other aspects may be implemented for any other additional or alternative communication scheme and/or technology.

Some examples may be used in devices operating in accordance with existing IEEE 802.11 standards (including IEEE 802.11-2016 (IEEE 802.11-2016, IEEE Standard for Information technology—Telecommunications and information exchange between systems local and metropolitan area networks—Specific requirements Part 11: Wireless LAN Medium Access Control (MAC) and Physical Layer (PHY) Specifications, Dec. 7, 2016)), and/or future versions and/or derivatives thereof (e.g., wireless local area network stations (WLAN STAs) or WiFi stations (WiFi STAs)), including any device that contains an IEEE 802.11-conformant media access control (MAC) and physical layer (PHY) interface to the wireless medium (WM).

Some examples may be used in conjunction with a WLAN, e.g., a WiFi network. Other aspects may be used in conjunction with any other suitable wireless communication network, for example, a wireless area network, a "piconet", a WPAN, a WVAN and the like.

Some examples may be used in conjunction with a wireless communication network communicating over a frequency band of 2.4 GHz, 5 GHz, and/or 6-7 GHz. However, other aspects may be implemented utilizing any other suitable wireless communication frequency bands, for example, an Extremely High Frequency (EHF) band (the millimeter wave (mmWave) frequency band), e.g., a frequency band within the frequency band of between 20 GHz and 300 GHz, a WLAN frequency band, a WPAN frequency band, and the like.

Some examples may be used in devices operating in accordance with existing cellular specifications and/or protocols, e.g., 3rd Generation Partnership Project (3GPP) Long Term Evolution (LTE), 3GPP 5G, and/or future versions and/or derivatives thereof, units and/or devices which are part of the above networks, and the like.

Some examples may be used for one way and/or two-way radio communication systems, cellular radio-telephone communication systems, a cellular telephone, a WLAN telephone, a Personal Communication Systems (PCS) device, a device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device, e.g., a Smartphone, a Wireless Application Protocol (WAP) device, or the like.

Some examples may be used in conjunction with one or more types of wireless communication signals and/or systems, for example, Radio Frequency (RF), Infra-Red (IR), Frequency-Division Multiplexing (FDM), Orthogonal FDM (OFDM), Orthogonal Frequency-Division Multiple Access (OFDMA), Spatial Divisional Multiple Access (SDMA), Time-Division Multiplexing (TDM), Time-Division Multiple Access (TDMA), Multi-User MIMO (MU-MIMO), General Packet Radio Service (GPRS), extended GPRS (EGPRS), Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth□, Global Positioning System (GPS), Wi-Fi, Wi-Max, ZigBee™, Ultra-Wideband (UWB), Global System for Mobile communication (GSM), 2G, 2.5G, 3G, 3.5G, 4G, 5G, 6G, 3GPP, Long Term Evolution (LTE), LTE advanced, Enhanced Data rates for GSM Evolution (EDGE), O-RAN or the like. Other aspects may be used in various other devices, systems and/or networks.

In this description, a chip can include one or more chiplets on a common carrier. A chiplet can be a functional block in the form of an integrated circuit that can be specifically designed to work with other chiplets to form larger more complex chips. That is, chiplets can refer to the independent constituents which make up a large chip built out of multiple smaller chiplets or dice. Chiplet(s) may be provided with or without encapsulating material packaging the chiplet(s).

In this description, the term "package" refers to hardware components (e.g., CPU, memory, and I/O devices) that may be interconnected and packed to form a system that may be integrated into a single unit with metallic finishing for physical mounting on a circuit board. That is, a package may be a full hardware module and that may be plugged into a server-chassis. A package can include one or more chips.

In various aspects, a package may include a CPU and non-CPU components, such as memory (DRAM modules), I/O devices, and accelerators.

In various aspects, components in a package may be interconnected with silicon vias, metallic wires or wireless by a RF signal interface.

In various aspects, a package may include only a single CPU chip (plus other non-CPU components). In various aspects, a CPU chip may include only one single CPU chip. In various aspects, a CPU chip may include a single CPU die, which in turn may include a plurality of CPU cores. In various aspects, a CPU chip may include a plurality of CPU dice that may be interconnected with an embedded multi-die interconnect bridge.

What is claimed is:

1. A device, comprising:
- a first package, comprising:
  - a first chiplet on a first carrier having a dielectric having two parallel sides and a first antenna feed port formed on a first of the two parallel sides of the dielectric of the first carrier; and
  - a first antenna on a second carrier having two parallel sides and a first radio frequency feed port formed on a first of the two parallel sides of the second carrier and the first antenna formed on a second side of the two parallel sides, the first sides facing each other and the first antenna feed port coupled to the first radio frequency feed port forming a radio frequency signal interface;

a second package, comprising:

a second chiplet on a third carrier having a dielectric having two parallel sides and a second antenna feed port formed on a first of the two parallel sides of the dielectric of the third carrier; and a second antenna on a fourth carrier having two parallel sides and a second radio frequency feed port formed on a first of the two parallel sides of the fourth carrier and the second antenna formed on a second side of the two parallel sides, the first sides facing each other and the second antenna feed port coupled to the second radio frequency feed port forming a radio frequency signal interface; and a common carrier, wherein the first package and the second package are disposed in a common plane on the common carrier, and wherein the first package and the second package are wirelessly communicatively coupled to each other via the first antenna and the second antenna.

2. The device of claim 1, wherein the first carrier comprises an integrated antenna that is formed on or integrated in an edge of the first carrier, wherein the integrated antenna is coupled to the chiplet.

3. The device of claim 2, wherein the integrated antenna is configured as an end-fire antenna.

4. The device of claim 2, wherein the integrated antenna comprises one or more exposed vias configured as radiating components.

5. The device of claim 2, wherein the integrated antenna is configured as at least one of a Yagi-antenna or Yagi-Uda antenna.

6. The device of claim 1, wherein the second carrier comprises at least a first sub-carrier and a second sub-carrier, each of the first sub-carrier and the second sub-carrier comprising at least one antenna.

7. The device of claim 1, wherein the first carrier comprises a further antenna feed port and the second carrier comprises a further radio frequency feed port formed on the first side of the second carrier and a further antenna formed on a second side of the second carrier; wherein a further radio frequency signal interface comprises the further antenna feed port coupled to the further radio frequency feed port; and wherein the further antenna has a different main radio frequency propagation direction than the antenna.

8. The device of claim 7, wherein the antennas are connected through different line feeds with the antenna feed ports, and the different line feeds are embedded in the first carrier.

* * * * *